(12) United States Patent
Malakhovsky et al.

(10) Patent No.: US 12,449,726 B2
(45) Date of Patent: Oct. 21, 2025

(54) APPARATUS FOR ASSEMBLY OF A RETICLE ASSEMBLY

(71) Applicant: ASML NETHERLANDS B.V., Veldhoven (NL)

(72) Inventors: Ilya Malakhovsky, Eindhoven (NL); Derk Servatius Gertruda Brouns, Herentals (BE); Joffrey Rene Sylvian Craquelin, Eindhoven (NL); Edward Hage, Budel (NL); Pieter Renaat Maria Hennus, Peer (BE); Jan Willem Adriaan Oosterling, Nederweert (NL); Ludolf Postma, Nijmegen (NL); Marcel Duco Snel, Eindhoven (NL); Johannes Charles Adrianus Van Den Berg, Prinsenbeek (NL); Wouter Van Der Chijs, Eindhoven (NL); Bartel Joris Van Der Veek, Eindhoven (NL); Mike Johannes Antonius Van Kuijk, Vlijmen (NL); Marina Antoinetta Leonarda Van Uum-Van Herk, Stramproy (NL); Henricus Marinus Theodorus Wiersma, Neerpelt (NL)

(73) Assignee: ASML NETHERLANDS B.V., Veldhoven (NL)

( * ) Notice: Subject to any disclaimer, the term of this patent is extended or adjusted under 35 U.S.C. 154(b) by 647 days.

(21) Appl. No.: 17/433,038

(22) PCT Filed: Feb. 25, 2020

(86) PCT No.: PCT/EP2020/054807
§ 371 (c)(1),
(2) Date: Aug. 23, 2021

(87) PCT Pub. No.: WO2020/173892
PCT Pub. Date: Sep. 3, 2020

(65) Prior Publication Data
US 2022/0155675 A1    May 19, 2022

(30) Foreign Application Priority Data

Feb. 28, 2019  (EP) ..................................... 19159943
Mar. 19, 2019  (EP) ..................................... 19163828
Aug. 12, 2019  (EP) ..................................... 19191214

(51) Int. Cl.
*G03F 1/64*     (2012.01)
*G03F 1/24*     (2012.01)
*G03F 7/00*     (2006.01)

(52) U.S. Cl.
CPC .................. *G03F 1/64* (2013.01); *G03F 1/24* (2013.01); *G03F 7/70983* (2013.01)

(58) Field of Classification Search
CPC ........... G03F 1/62; G03F 1/64; G03F 7/70983
See application file for complete search history.

(56) References Cited

U.S. PATENT DOCUMENTS 2,333,414 A     11/1943   De Tar
4,903,610 A  *  2/1990    Matsumoto ......... H01L 21/6773
                                                      104/118

(Continued)

FOREIGN PATENT DOCUMENTS

CN    101194354    6/2008
CN    101464626    6/2009

(Continued)

OTHER PUBLICATIONS

Machine translation of JP H09-138498 (Year: 1997).*

(Continued)

*Primary Examiner* — Steven H Whitesell
(74) *Attorney, Agent, or Firm* — Pillsbury Winthrop Shaw Pittman, LLP

(57) ABSTRACT

An object handling apparatus for handling a generally planar object, the object handling apparatus including: two support arms, at least one of the two support arms movable relative (Continued)

to another support arm generally in a plane such that the two support arms are operable to grip and hold an object disposed in the plane, wherein each of the support arms includes at least one support pad and at least one aligner, the support pads configured to locally contact a surface of the object and apply a force thereto generally perpendicular to the plane so as to support the object and the at least one aligner configured to locally contact a surface of the object and apply a force thereto generally in the plane so as to grip the object.

20 Claims, 30 Drawing Sheets

(56) References Cited

U.S. PATENT DOCUMENTS

| | | | | |
|---|---|---|---|---|
| 5,311,250 | A | * | 5/1994 | Suzuki ............... G03F 1/64 355/76 |
| 5,772,842 | A | | 6/1998 | Tanaka et al. |
| 5,888,327 | A | | 3/1999 | Akagawa et al. |
| 5,990,650 | A | | 11/1999 | Brock |
| 6,137,298 | A | | 10/2000 | Binns |
| 8,356,849 | B2 | | 1/2013 | Shirasaki |
| 10,539,886 | B2 | | 1/2020 | Van der Meulen et al. |
| 10,585,363 | B2 | | 3/2020 | Mathijssen et al. |
| 2002/0117380 | A1 | | 8/2002 | Downs et al. |
| 2008/0198380 | A1 | | 8/2008 | Straaijer et al. |
| 2009/0053029 | A1 | | 2/2009 | Yoshino et al. |
| 2009/0239156 | A1 | | 9/2009 | Andritzke et al. |
| 2015/0293460 | A1 | * | 10/2015 | Takehisa ............... G03F 1/84 355/67 |
| 2018/0307133 | A1 | | 10/2018 | Alvarez et al. |
| 2018/0314150 | A1 | | 11/2018 | Brouns et al. |
| 2018/0329314 | A1 | | 11/2018 | Kruizinga et al. |
| 2019/0004433 | A1 | | 1/2019 | Wang et al. |

FOREIGN PATENT DOCUMENTS

| | | | | |
|---|---|---|---|---|
| CN | 108236559 | | 7/2018 | |
| CN | 109212909 | | 1/2019 | |
| EP | 2267528 | | 12/2010 | |
| JP | S6489325 | | 4/1989 | |
| JP | H02167409 | | 6/1990 | |
| JP | H03231249 | A * | 10/1991 | |
| JP | H0470657 | | 3/1992 | |
| JP | H05323583 | | 12/1993 | |
| JP | H06-83042 | A * | 3/1994 | |
| JP | 09138498 | A * | 5/1997 | |
| JP | H09190967 | | 7/1997 | |
| JP | H11163113 | | 6/1999 | |
| JP | 2000267261 | | 9/2000 | |
| JP | 2001083691 | | 3/2001 | |
| JP | 2001249442 | | 9/2001 | |
| JP | 2005502479 | | 1/2005 | |
| JP | 2008244448 | | 10/2008 | |
| JP | 2010258480 | | 11/2010 | |
| JP | 2011099946 | A * | 5/2011 | |
| JP | 2017534077 | | 11/2017 | |
| JP | 2017534078 | | 11/2017 | |
| JP | 2018517933 | | 7/2018 | |
| JP | 2019011860 | | 1/2019 | |
| KR | 10-2011-0101069 | | 9/2011 | |
| TW | 201619692 | | 6/2016 | |
| WO | WO-2016079052 | A2 * | 5/2016 | ............... G03F 1/62 |
| WO | 2018015179 | | 1/2018 | |
| WO | 2018177668 | | 10/2018 | |
| WO | 2019008602 | | 1/2019 | |

OTHER PUBLICATIONS

Machine translation of JP-H0683042-A (Year: 1994).*
Machine translation of JP-2011099946-A (Year: 2011).*
Machine translation of JP-H03231249-A (Year: 1991).*
Office Action issued in corresponding Japanese Patent Application No. 2021-547760, dated Jan. 30, 2024.
Office Action issued in corresponding Chinese Patent Application No. 202080017405.X, dated Mar. 27, 2024.
Office Action issued in corresponding Korean Patent Application No. 10-2021-7027505, dated Oct. 15, 2024.
Office Action issued in corresponding Japanese Patent Application No. 2024-114406, dated Mar. 28, 2025.
Search Report issued in corresponding Chinese Patent Application No. 202080017405X, dated Mar. 26, 2025.
International Search Report and Written Opinion issued in corresponding PCT/EP2020/054807, dated Sep. 16, 2020.

* cited by examiner

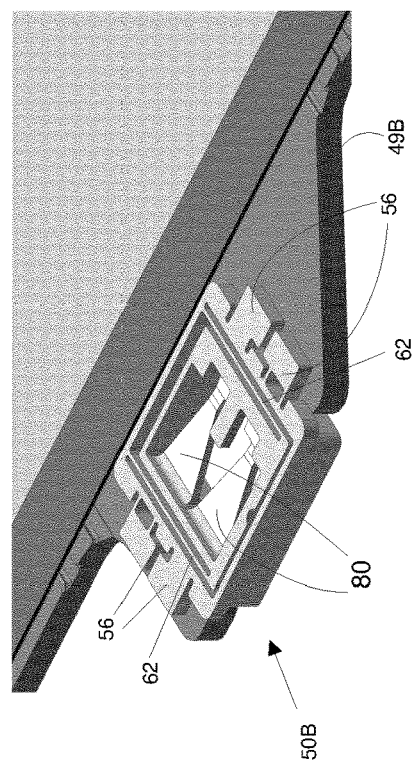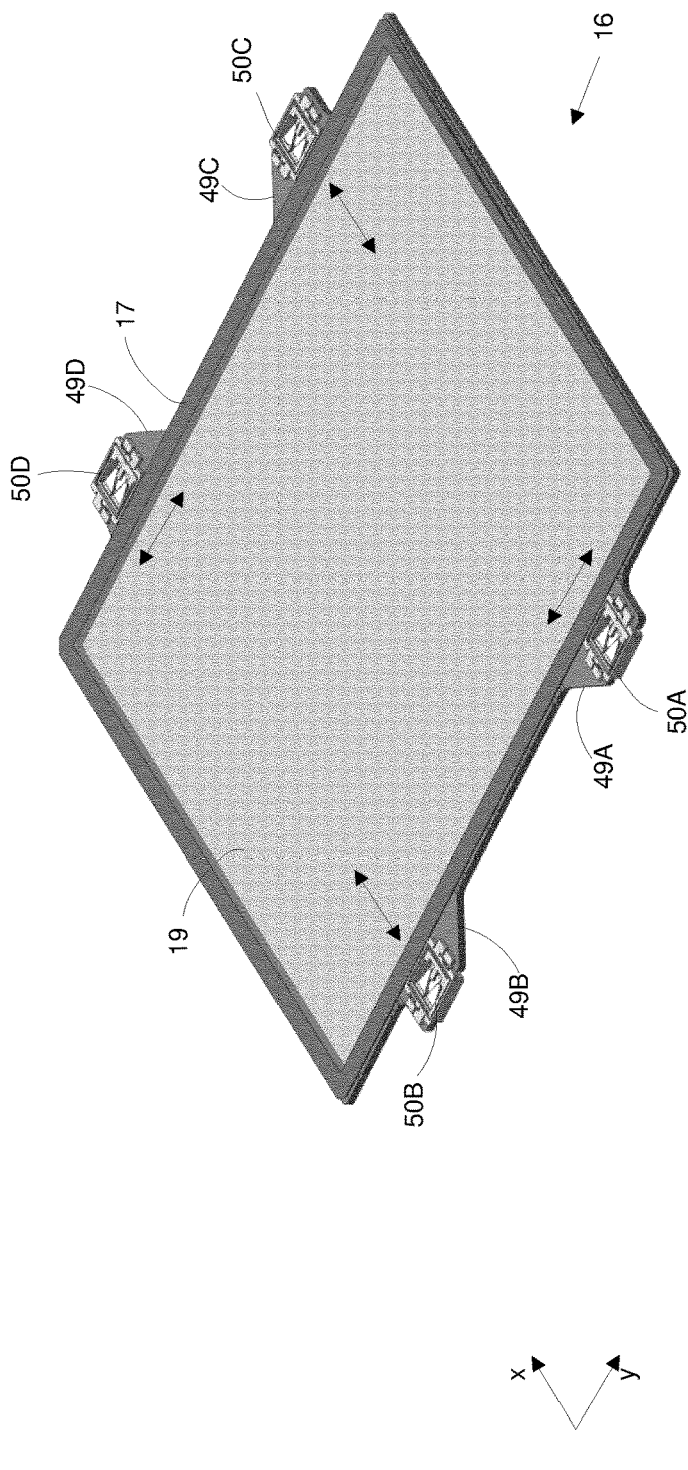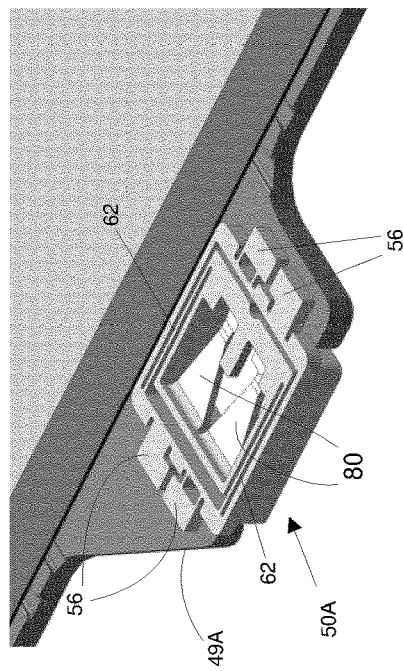
Fig. 3

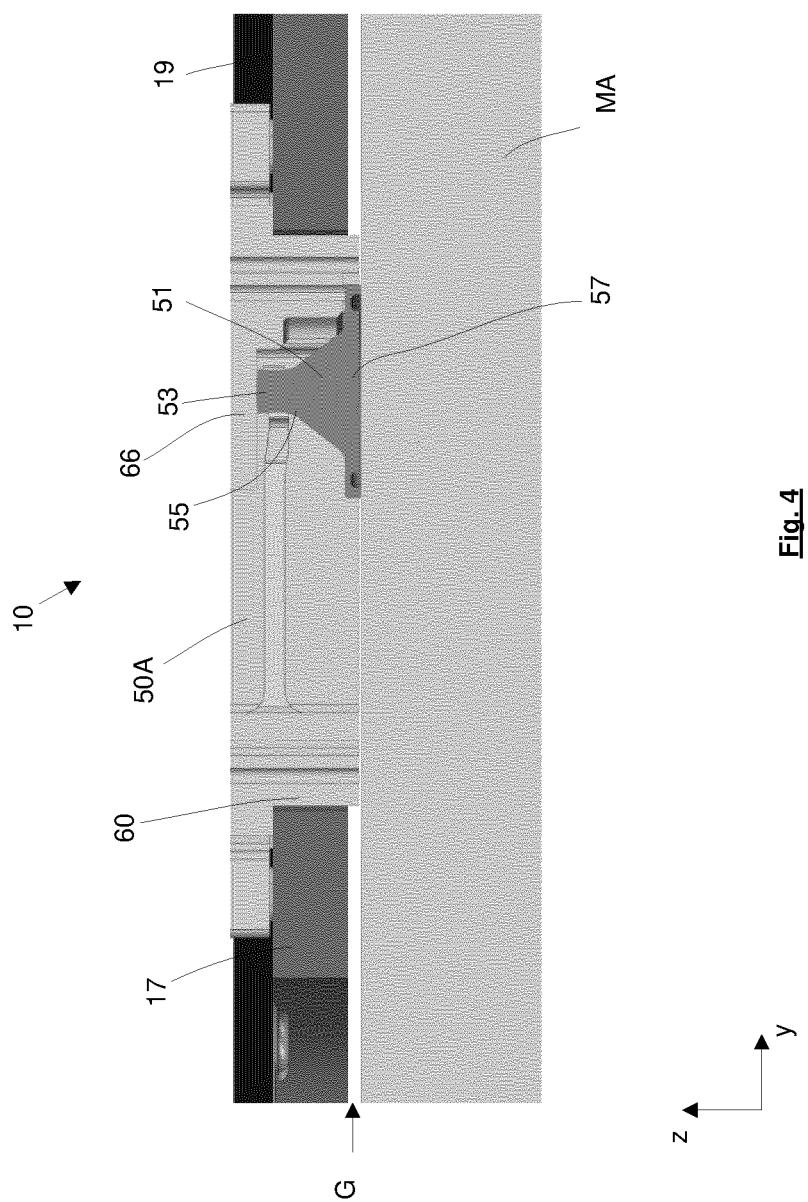

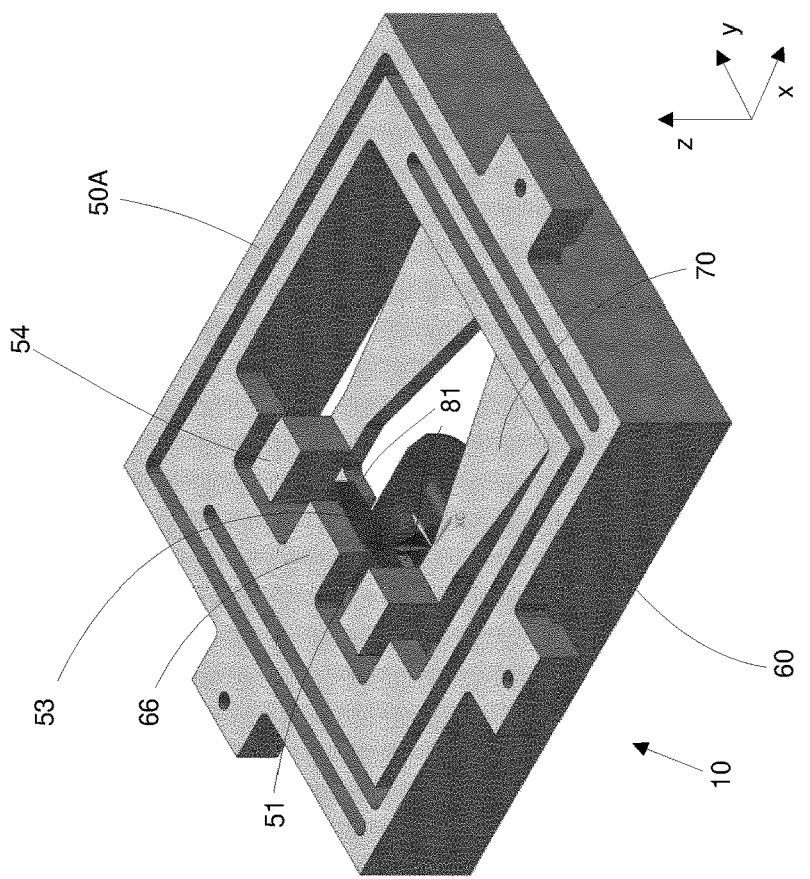
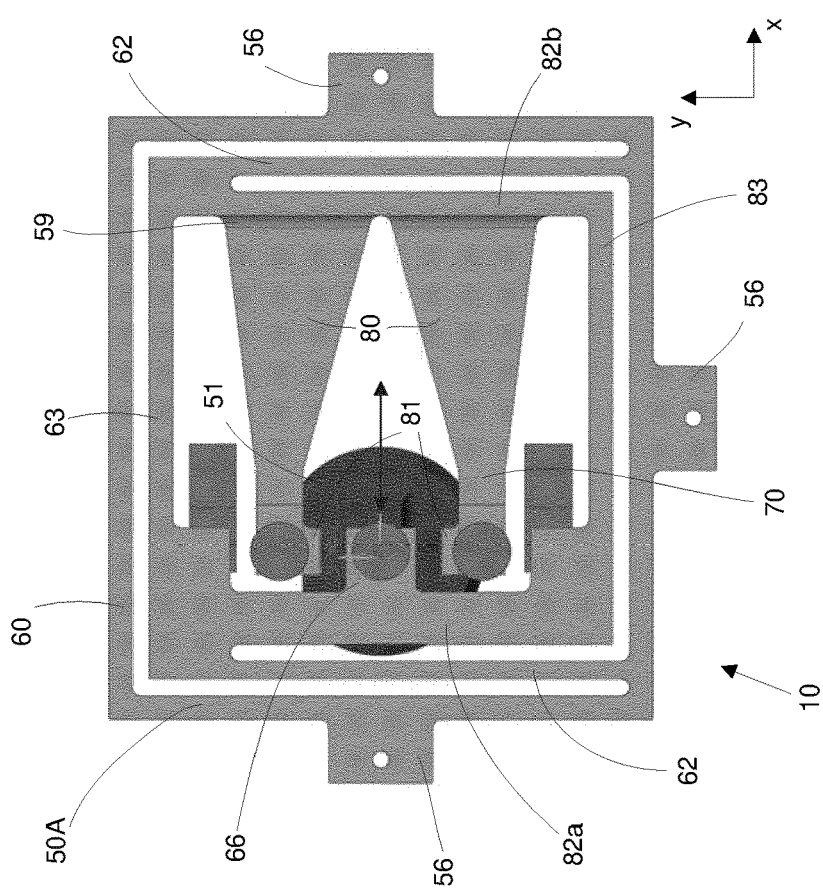
Fig. 5B
Fig. 5A

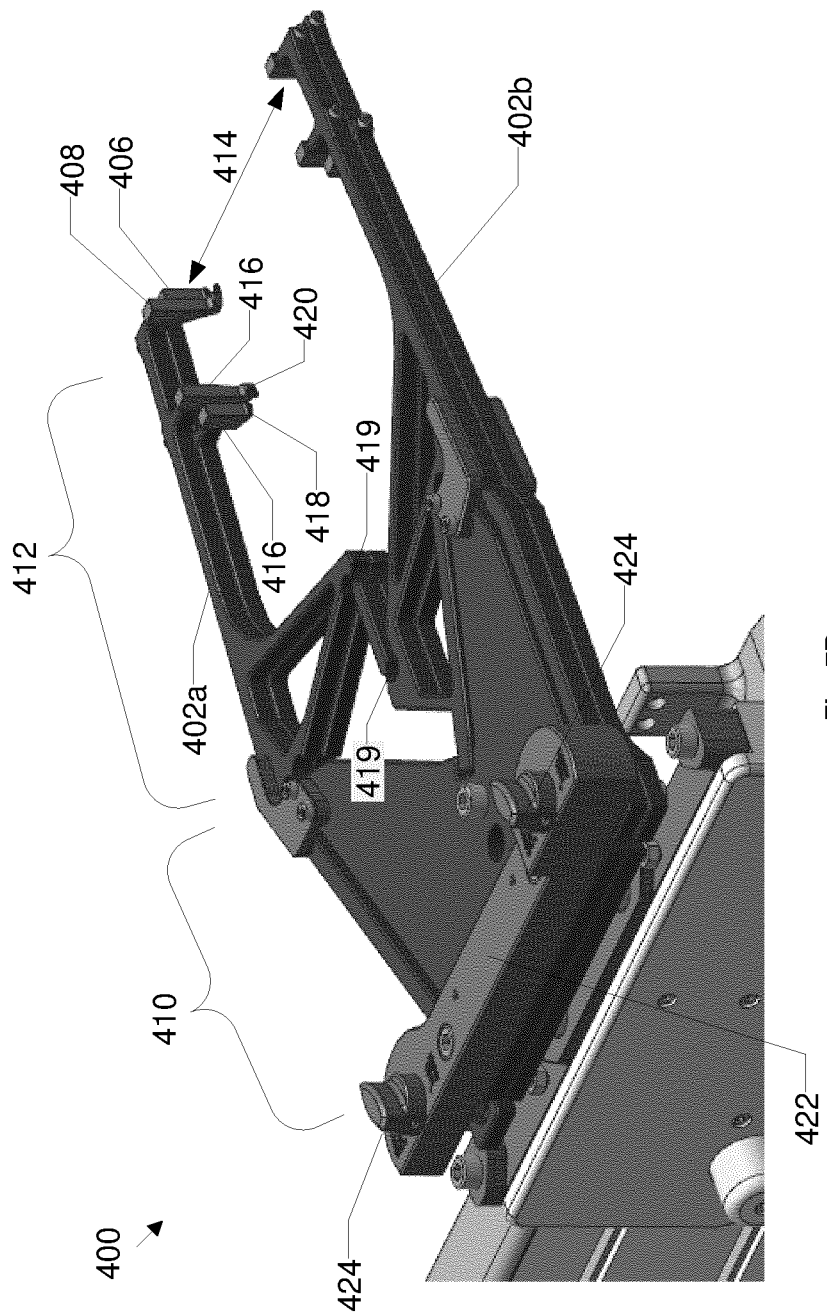

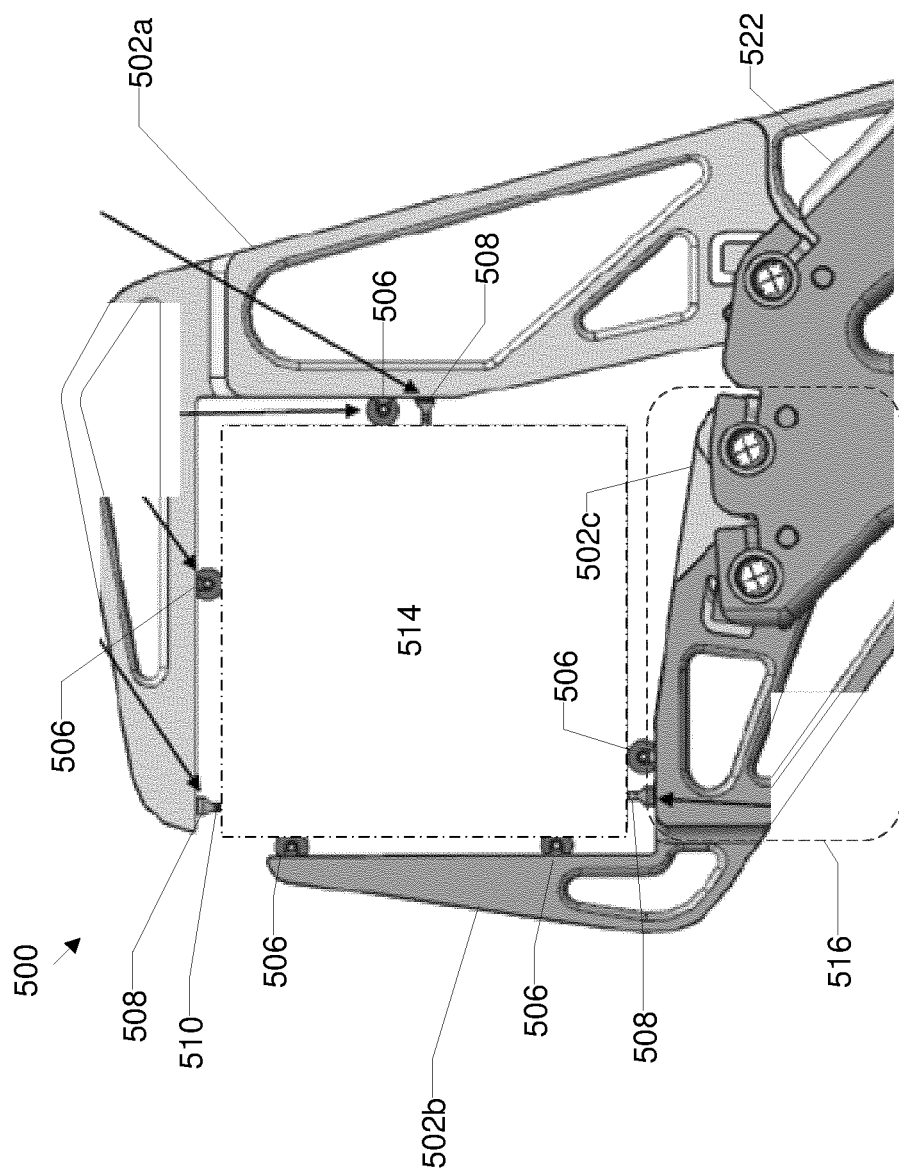

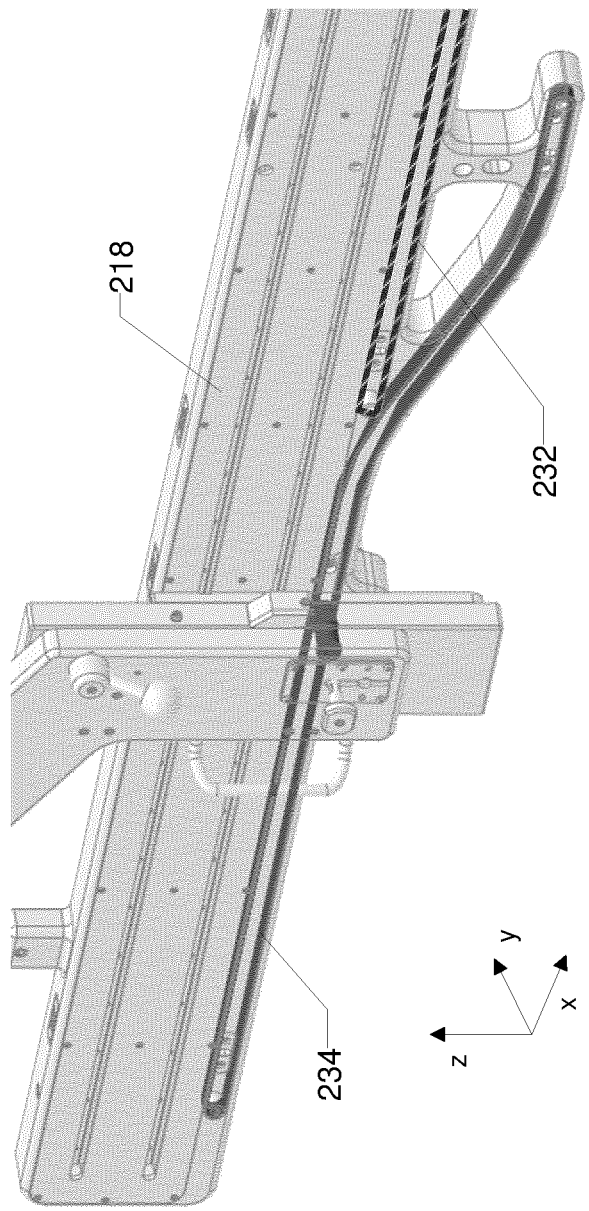

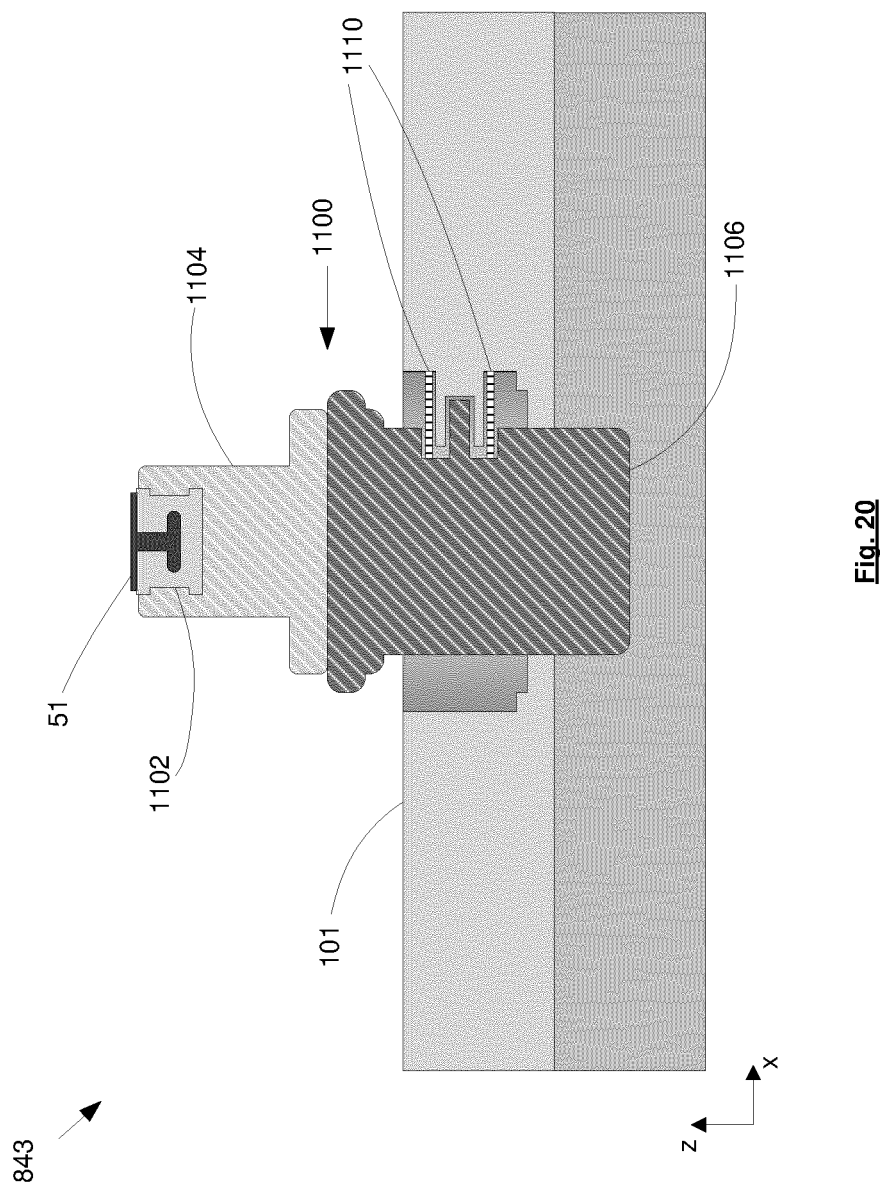

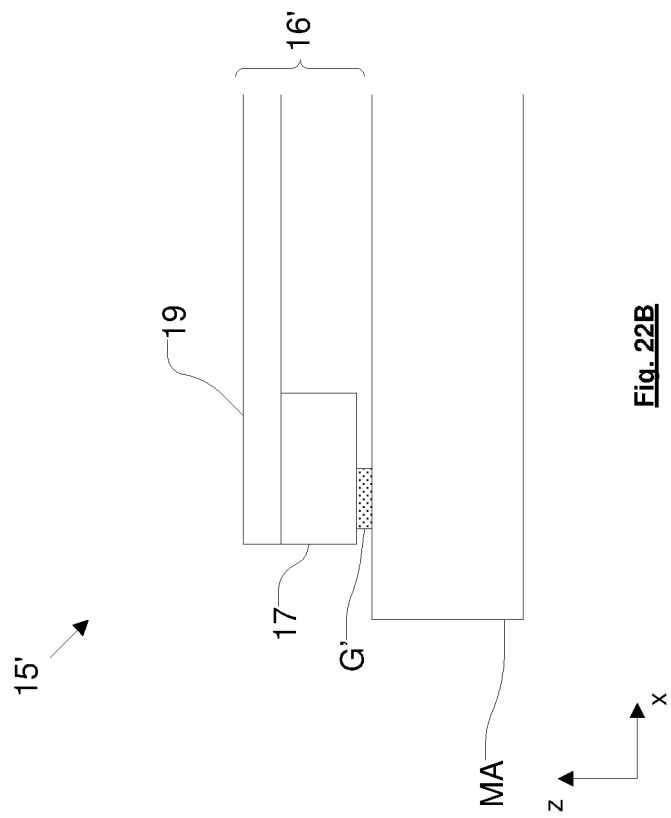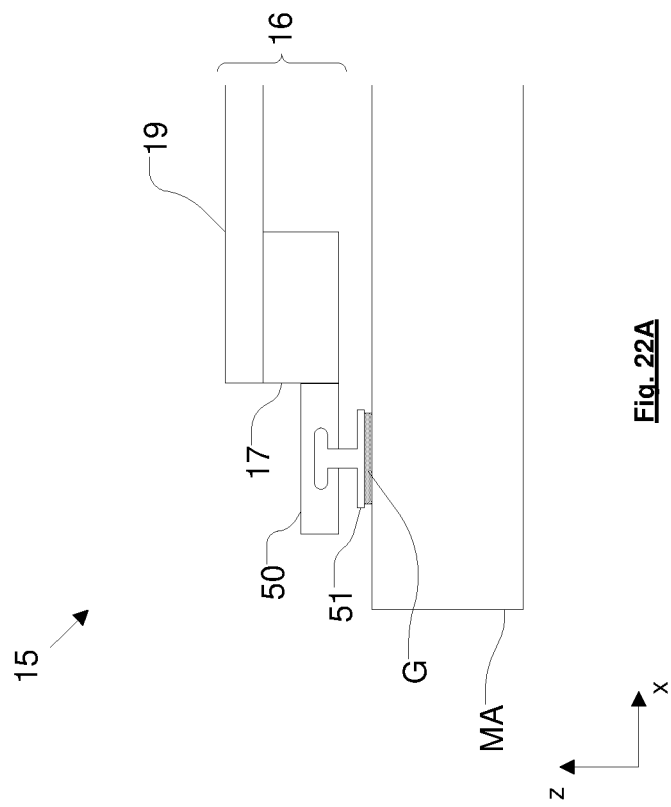

APPARATUS FOR ASSEMBLY OF A RETICLE ASSEMBLY

CROSS-REFERENCE TO RELATED APPLICATIONS

This application is the U.S. national phase entry of PCT Patent Application No. PCT/EP2020/054807, which was filed on Feb. 25, 2020, which claims the benefit of priority of European Patent Application No. 19159943.0 which was filed on Feb. 28, 2019, of European Patent Application No. 19163828.7 which was filed on Mar. 19, 2019, and of European Patent Application No. 19191214.6 which was filed on Aug. 12, 2019, which are incorporated herein in their entireties by reference.

FIELD

The present invention relates to an apparatus and associated methods for the assembly of a reticle assembly for a lithographic apparatus, the reticle assembly comprising a pellicle assembly connected to a reticle.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g., a mask) onto a layer of radiation-sensitive material (resist) provided on a substrate.

The wavelength of radiation used by a lithographic apparatus to project a pattern onto a substrate determines the minimum size of features that can be formed on that substrate. A lithographic apparatus that uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

A patterning device (e.g., a mask) that is used to impart a pattern to a radiation beam in a lithographic apparatus may form part of a mask assembly. A mask assembly may include a pellicle that protects the patterning device from particle contamination. The pellicle may be supported by a pellicle frame.

It may be desirable to provide an apparatus that obviates or mitigates one or more problems associated with the prior art.

SUMMARY

According to a first aspect of the invention there is provided an object handling apparatus for handling a generally planar object, the object handling apparatus comprising: two support arms, at least one of the two support arms movable relative to other support arm generally in a plane such that the two support arms are operable to grip and hold an object disposed in said plane; wherein each of the support arms includes at least one support pad and at least one aligner, the support pads being configured to locally contact a surface of the object and apply a force thereto generally perpendicular to the plane so as to support the object and the aligners being configured to locally contact a surface of the object and apply a force thereto generally in the plane so as to align the object.

The object handing apparatus is advantageous since it reduces the amount of friction between the arms and the object. In turn, this can reduce the amount of particulate debris that may be produced by such friction. The object may be a pellicle assembly or a patterning device. The object handing apparatus is particularly advantageous for use when handing a pellicle assembly or a patterning device since it is particularly important that these objects remain clean and free of contaminants.

It will be appreciated that since each of the support pads and the aligners only locally contacts the object, they contact with only a relatively small portion of the object. Advantageously, this may reduce the risk of particulate contaminants being produced (compared with support mechanisms which make contact with an entire outer perimeter of the pellicle assembly or the patterning device).

The aligners are arranged so as to ensure that when the object is gripped by the support arms, the object is in a known, fixed position relative to the object handling apparatus.

According to a second aspect of the invention there is provided an object handling apparatus for handling a generally planar object, the object handling apparatus comprising: two support arms, at least one of the two support arms movable relative to other support arm generally in a plane such that the two support arms are operable to grip and hold an object disposed in said plane; a support structure; and a damper assembly; wherein the two support arms are connected to the support structure via the damper assembly, the damper assembly being configured to dampen movement of an object in a direction perpendicular to a plane of the object when it is gripped by the support arms.

The object may be either a pellicle assembly or a patterning device. The damper assembly may be configured so as to damp movement in a direction in which an object (for example a pellicle assembly or a patterning device) is generally provided to the object handling apparatus.

The support structure may be a rail. Advantageously, such an arrangement may enable a position of a pellicle assembly or patterning device to be moved along the tracks of the rail, whilst preventing damage to the pellicle assembly or patterning device (caused by, for example, dropping the pellicle assembly or patterning device).

According to a third aspect of the invention there is provided a pellicle frame attachment apparatus comprising: a pellicle assembly handling apparatus configured to handle a pellicle assembly; a patterning device handling apparatus configured to handle a patterning device; and a rail, wherein the pellicle assembly handling apparatus comprises support arms configured to grip and hold the pellicle assembly and the patterning device handling apparatus comprises support arms configured to grip and hold the patterning device, and wherein the pellicle assembly handling apparatus is supported by and is movable relative to one of the rail, and wherein the patterning device handling apparatus is supported by and is movable relative to one of the rail.

In a lithographic apparatus, a mask assembly may be used. The mask assembly may comprise a patterning device (which in use imparts a desired pattern onto a beam of radiation) and a pellicle assembly (which prevents contaminant particles from reaching the patterning device). The pellicle assembly may comprise engagement mechanisms affixed to a frame of the pellicle assembly. The pellicle assembly may be attached to the patterning device, via the engagement mechanisms, using studs. A pellicle frame attachment apparatus may be used to attach the pellicle assembly to the patterning device.

When fixing the pellicle assembly to the patterning device (thus forming the mask assembly) it is important for the engagement mechanisms of the pellicle assembly and the studs of the patterning device to be handled delicately and to be well aligned. The pellicle frame attachment apparatus may comprise a handling apparatus for the pellicle assembly and a handling apparatus for the patterning device to accurately and delicately grip, move, and place the pellicle assembly and the patterning device.

The pellicle assembly handling apparatus may comprise a portion which may be described as a pellicle assembly gripper. The patterning device handling apparatus may comprise a portion which may be described as a patterning device gripper. The grippers may be movably attached to a rail. The grippers may be operable to be manually moved along tracks disposed within the rail. Advantageously, movably attaching the pellicle assembly gripper and the patterning device gripper to a common rail may allow for accurate and safe handling of the pellicle assembly and the patterning device.

The pellicle assembly handling apparatus may comprise an object handling apparatus according to the first aspect of the invention.

The patterning device handling apparatus may comprise an object handling apparatus according to the first aspect of the invention.

The pellicle assembly handling apparatus may comprise an object handling apparatus according to the second aspect of the invention.

The patterning device assembly handling apparatus may comprise an object handling apparatus according to the second aspect of the invention.

According to a fourth aspect of the invention there is provided a measurement system for measuring an object comprising: a radiation source for producing an unpolarised radiation beam; a beam splitter; a quarter-wave plate; and an imaging sensor; wherein the radiation source is arranged such that a portion of the unpolarised radiation propagates through the beam splitter and the quarter-wave plate; and wherein the imaging sensor is arranged such that a reflected part of said portion of the unpolarised radiation through the quarter-wave plate and the beam splitter before being incident on the imaging sensor.

The optical measurement system may be operable to measure a position of a pellicle frame. The optical measurement system may comprise a radiation source, a beam splitter, a quarter-wave plate, and an imaging sensor.

The radiation source may emit unpolarised light. The unpolarised light may be split by the beam splitter. This may create linearly polarised light. At least part of the linearly polarised light may then propagate through the quarter-wave plate, becoming circularly polarised. A pellicle assembly (comprising a pellicle and a pellicle frame) and a patterning device (such as a reticle) may be arranged such that the circularly polarised light is reflected form the patterning device after propagating through the pellicle and/or the pellicle frame. The reflected circularly polarised light may then propagate back through the quarter-wave plate and the beam splitter and be incident on the imaging sensor.

Measurements made by the imaging sensor may enable a location of the pellicle frame (and hence the pellicle assembly) to be determined.

At least a portion of the circularly polarised beam generated by the quarter-wave plate may be incident on and reflected by the patterning device. An edge of the pellicle frame may obstruct light which is reflected from the patterning device. At least part of the radiation reflected by the patterning device is incident on the imaging sensor and may have a measured spatial intensity (such as a measured image) at the imaging sensor that varies depending on a position of an edge of the pellicle frame. In particular, a difference in level of transmission of light through the pellicle and the pellicle frame may give spatial contrast in intensity measurements. This spatial contrast may be particularly useful for measuring a position of, and subsequently aligning, the pellicle assembly.

The quarter-wave plate effects a phase shift (between the two orthogonal components of the electric field strength) in the light reflected from the patterning device as the light propagates through the quarter-wave plate. This phase shift is such that light reflected from the patterning device is maximally transmitted through the beam splitter. Maximal transmission of light through the beam splitter can result in a high signal in intensity measurements performed by the imaging sensor. For example, it may be that the measurement made by the imaging sensor is subject to background light, which may reduce the contrast in the image that represents the edge of the pellicle and pellicle frame. However, such background radiation may be unpolarised and therefore only a fraction (for example half) of such background radiation may reach the imaging sensor. In contrast, the signal radiation (i.e. the portion of radiation which is reflected from the patterning device) is maximally transmitted through the beam splitter. Advantageously, maximal transmission of this signal light through the beam splitter can result in high spatial contrast in measurements performed by the imaging sensor. This can result in high accuracy of measurements of position of the pellicle assembly.

According to a fifth aspect of the invention there is provided a measurement system for measuring a position of an object relative to a reference object, the object being provided with an object marker and the reference object being provided with a window with a reference marker, the measurement system comprising: a radiation source for producing a radiation beam; and an imaging sensor; the radiation source arranged such that the radiation beam is incident on the reference marker and the object marker at such an angle that a reflected diffraction order of the radiation is normally incident on the imaging sensor.

The optical measurement system may be operable to measure a position of an object relative to a reference object. The object may be a patterning device (such as a reticle). The object may be provided with an object marker. The object marker may comprise a diffraction grating. The object marker may comprise alignment marks. The reference object may be a window. The reference object may be provided with a reference marker. The reference marker may comprise a diffraction grating. The reference marker may comprise alignment marks. The optical measurement system may comprise a radiation source and an imaging sensor.

The radiation source may emit a light beam. The beam may propagate towards the object and the reference object. A portion of the beam may be backscattered (e.g., reflected) from the reference marker. Another portion of the beam may be transmitted through the reference object. This portion of the beam may subsequently be backscattered (e.g., reflected) from the object marker. Each of the object marker and the reference marker may be arranged so as to form reflective diffraction gratings. Portions of a beam which are backscattered from each of the object marker and the reference marker may form a plurality of diffracted orders. First-order reflected beams may be incident on the imaging sensor. The imaging sensor may hence be operable to measure a signal which corresponds to a position of the object relative to the reference object. It may be that zero-order reflected beams (corresponding to standard reflection) are not incident on the imaging sensor. The optical measurement system may be operable to measure the position of the object marker (which is fixed with respect to the object) and the reference marker (which is fixed with respect to the reference object). The optical measurement system may hence be operable to measure the position of the object relative to the reference object. This may be used to align the object with the reference object. For example, the optical measurement system may be used to align a patterning device with another apparatus.

Advantageously, measuring the position of the object marker and the reference marker by: measuring diffracted orders of light (as described above); and using the same measurement apparatus (the optical measurement system), may result in accurate measurements of position of the object relative to the reference object. This may result in measurements of position of the object that are more accurate than if the position of the object (such as a patterning device) were based on measuring the position of an edge of the object (such as an edge of a patterning device).

A pellicle frame attachment apparatus comprising the measurement system of the fourth aspect of the invention or the measurement system of the fifth aspect of the invention.

According to a sixth aspect of the invention there is provided a pellicle frame attachment apparatus comprising: a support structure configured to support a pellicle assembly; and a linearly moveable manipulator pin configured to move relative to the support structure so as to contact a distal end of an engagement arm of an engagement mechanism affixed to a frame of the pellicle assembly when supported by the support structure, so as to resiliently bend the engagement arm; wherein the manipulator pin extends in, and is movable in, a direction generally perpendicular to the engagement arm; and wherein a surface of the manipulator pin is a convex curved surface such that a contact surface area between said surface and the engagement arm is minimised.

It will be appreciated that as a manipulator pin moves and contacts a generally perpendicular engagement arm (for example a resilient, cantilevered engagement arm), it can move the distal end of the engagement arm thus rotating the engagement arm. As the manipulator pin moves in the linear direction, a contact point between the manipulator pin and the engagement arm will move along a surface of the engagement arm. By providing the manipulator pin with a convex curved surface a contact surface area between the manipulator pin and the engagement arm is minimised Such an arrangement may ensure minimal slipping between the manipulator pin and the engagement arm. Advantageously, this can reduce the risk of particulate contaminants being produced (compared with an interface between manipulator pins and engagement mechanisms in which components slide against each other).

The apparatus may further comprise: an actuator operable to move the position of the support structure; and a plurality of hooked pins disposed on and protruding from the support table, wherein the plurality of hooked pins is configured to releasably clamp the engagement mechanism to the support structure in place during engagement or disengagement of the pellicle assembly and the patterning device, and wherein either or both of the actuator or a plurality of detachable inserts on which hooked pins are provided are capable of detaching from the support table if movement of the support table is obstructed.

The hooked pins may be useful for keeping a pellicle assembly fixed to the support structure during engagement or disengagement of the pellicle assembly and the patterning device. This allows movement of the support structure to cause a corresponding movement of the pellicle assembly. However, it may be that the hooked pins fail to disengage from pellicle frame. The above-described detachment mechanism provides a safety mechanism so as to detach the hooked pins from actuation mechanism if movement is obstructed so as to prevent damaging the pellicle assembly. In some embodiments, the detachment mechanism may be such that the support table detaches from actuator. In some embodiments, the detachment mechanism may be such achieved by providing the hooked pins on detachable insert (with is detachably connected to the support structure).

According to a seventh aspect of the invention there is provided a stud attachment apparatus comprising: a support structure configured to hold a patterning device; and a stud manipulator configured to bring a stud into contact with the patterning device, wherein the stud manipulator is affixed to an outer frame using a plurality of leaf springs.

Studs may be attached to a patterning device so that a pellicle assembly can be attached to the patterning device. Studs may be attached to a patterning device using a stud attachment apparatus. The stud attachment apparatus may comprise a stud manipulator which handles the stud. The stud manipulator may be attached to an outer frame. This attachment may comprise a plurality of leaf springs. The plurality of leaf springs allows some relative movement between the stud manipulator and the outer frame (for example when the base of the stud contacts the patterning device).

Each leaf spring is dimensioned such that movement of the stud manipulator (relative to the outer frame) in a direction in which the stud may be applied to the patterning device (e.g., the z-direction) is permissible, whilst movement in other directions is negligible. Further, by using a plurality of leaf springs rather than a single leaf spring, rotation of the stud manipulator (and consequently the stud) in the xz or the yz plane is negligible. Advantageously, this can result in a more controlled stud position and a more accurate placement of the stud on the patterning device.

The stud manipulator may comprise a stud holder which is arranged to hold the stud under a force of gravity or using a vacuum mechanism.

The stud manipulator may comprise a glue dispenser. The glue dispenser may be configured to dispense a poly(methyl methacrylate) based glue. As used herein, a poly(methy methacrylate) based glue may be referred to as a PMMA glue. The glue dispenser may be configured to provide PMMA glue as one or more components. The glue dispenser may be configured to provide at least one component of the PMMA glue to a surface of the stud. The glue dispenser may be configured to provide at least one component of the PMMA glue to a surface of the patterning device. The glue dispenser may be configured to provide at least one component of the PMMA glue to the surface of the stud and at least one component of the PMMA glue to the surface of the patterning device. The stud may be affixed to the patterning device by the PMMA glue when the stud is brought into contact with the patterning device by the stud manipulator.

PMMA glue comprises a thermoplastic resin formed by polymerization of methyl methacrylate (MMA) monomers. A PMMA glue is in general a resin formulation comprising MMA monomers and one or more other components such as an initiator, an accelerator, a crosslinker and other additives. It will be appreciated that providing a surface with PMMA glue, as used herein, may refer to providing said surface with one or more components of a PMMA glue (e.g., a resin component containing an accelerator or an initiator of a PMMA glue). It will be further appreciated that bringing a surface into contact with another surface, as used herein, may refer to bringing the two surfaces into indirect contact with each other (e.g., via a glue which adheres to both surfaces).

For example, processing of the PMMA glue comprises providing a first glue component comprising a mixture of MMA monomers with an accelerator and a second glue component comprising a mixture of MMA monomers and an initiator. Preferably the initiator is provided in an amount suitable for the total amount of the first and second glue components, when they are combined. Application of the glue components is done for example by applying the first glue component on a first substrate and the second glue component on a second substrate. For example, a first glue component comprising MMA monomers is applied on a pellicle frame surface and a second glue component comprising an initiator is applied on a patterning device surface to be bonded to the pellicle frame coated with the first glue component. Alternatively, the two glue components may be applied the other way around. When the two substrates are joined curing takes place.

The PMMA glue may be used to adhere a surface of a first lithographic component to a surface of a second lithographic component. At least one of the first and the second lithographic components may be a component of an EUV lithographic apparatus. For example, the first lithographic component is a pellicle and the second lithographic component is a pellicle frame In another example the first lithographic component is a pellicle frame and the second lithographic component is a patterning device. In yet another example the first lithographic component is a first pellicle frame component, such as first component of a pellicle frame engagement mechanism and the second lithographic component is a second component of a pellicle frame engagement mechanism.

In an alternative method the first and second components may be applied side by side on a single substrate and then a second substrate may be applied thereon such that the PMMA glue components are sandwiched between the two substrates. In the alternative method when the first and second components come in adequate contact with each other due to being enclosed between the two surfaces, then curing takes place. Other alternative processing method may also be applied.

The PMMA glue components may be applied as a single continuous shape as a layer, or it may be applied as discrete beads. An advantage of the adhesive being applied as beads is that it provides less tension in the surfaces that are glued, for example between the pellicle and the frame or between the frame and the reticle surfaces. In such case the beads act as elastic springs between the two surfaces.

Preferably the thickness of the layer or the beads is less than 0.6 mm, more preferably less than 0.5 mm. This is to enable optimal polymerization, since the polymerization starts on one side and progresses to the other side of the layer or beads.

Beads herein refer to discrete portions of a glue component rather than a continuous layer and may have any shape, such as spherical, hemispherical or quasi-rectangular, depending on the wetting properties and viscosity of the PMMA resin.

The PMMA resin viscosity preferably is at least 8000 mPas, more preferably at least 10.000 mPas. Hardening of the PMMA glue can be accelerated chemically or by applying heat.

The glue or adhesive used for attaching a pellicle film to a pellicle frame or the pellicle frame to a reticle preferably has a lap shear strength >5 MPa, more preferably >10 MPa as tested according to standard ISO 4587 (OI3). The Young modulus of the glue or adhesive used for attaching a pellicle film to a pellicle frame or the pellicle frame to a reticle preferably is in a range from 0.5 to 10 GPa, more preferably from 1 to 5 GPa when measured according to ISO 527.

Preferably the outgassing of the glue or adhesive used for attaching a pellicle film to a pellicle frame or the pellicle frame to a reticle is <6E-06 [mbar.l/s.cm2], more preferably <8E-09 [mbar.l/s.cm2] and even more preferably <8E-10 [mbar.l/s.cm2].

According to an eighth aspect of the invention there is provided a pellicle attachment apparatus, comprising: a pellicle manipulator; and a glue dispenser. The pellicle attachment apparatus may be for making at least part of a pellicle assembly from a first item and a second item. The pellicle manipulator may be configured to bring the first item into contact with the second item. The glue dispenser may be configured to provide PMMA glue as one or more components. The glue dispenser may be configured to provide at least one component of a PMMA glue to a surface of the first item. The glue dispenser may be configured to provide at least one component of a PMMA glue to a surface of the second item. The glue dispenser may be configured to provide at least one component of a PMMA glue to a surface of the first item and at least one component of a PMMA glue to a surface of the second item. The first item may be affixed to the second item by the PMMA glue when the first item is brought into contact with the second item.

The first item may be a frame. The frame may be a pellicle frame. The second item may be a pellicle (i.e., a thin film or a membrane). The pellicle frame may be a frame constructed such as to provide a hermetically sealed space when the pellicle assembly is bonded to a patterning device.

The second item may be an engagement mechanism.

The pellicle manipulator may comprise means for tensioning the pellicle. For example, the pellicle manipulator may tension the pellicle prior to bringing the pellicle into contact with the frame.

According to a ninth aspect of the invention there is provided a pellicle assembly. The pellicle assembly may comprise a pellicle. The pellicle assembly may comprise a frame. A PMMA glue may be disposed between, and may be in contact with, the pellicle and the frame so as to affix the pellicle to the frame.

According to a tenth aspect of the invention there is provided a patterning device. The patterning device may comprise a plurality of studs. A PMMA glue may be disposed between, and may be in contact with the patterning device and each stud of the plurality of studs so as to affix the patterning device to each stud of the plurality of studs.

According to an eleventh aspect of the invention there is provided a mask assembly, comprising: a pellicle assembly according to the ninth aspect of the invention; and a patterning device according to the tenth aspect of the invention.

Use of PMMA glue offers several advantages.

Curing of PMMA glue takes several minutes to complete, which is substantially shorter curing process than the curing process of a known epoxy glue (which generally takes several hours). Therefore, advantageously, affixing a pellicle frame to a pellicle using the PMMA glue according to some aspects of the present invention results in a significantly shorter time required to create a pellicle assembly (compared with using the known epoxy glue). Further, advantageously, affixing a stud to a patterning device using the PMMA glue requires significantly less time (compared with using the known epoxy glue). This results in associated advantages for high volume manufacturing.

PMMA glue is generally more elastic than epoxy glue. PMMA glue may be removed more easily from a surface (e.g., from a surface of a patterning device) than epoxy glue. Therefore, advantageously, affixing studs to a patterning device using PMMA glue (compared with using the known epoxy glue) results in an easier stud removal procedure and patterning device cleaning procedure once the studs have been removed.

A heater and/or an oven may be required to heat the known epoxy glue in order to promote curing of the known epoxy glue. Advantageously, heating is not required to promote curing of PMMA glue. This results in a simpler manufacturing procedure which may also reduce defects and risk of damage to manufactured products (such as a pellicle assembly or a patterning device provided with studs).

According to a twelfth aspect of the invention there is provided a mask assembly. The mask assembly may comprise a pellicle assembly and a patterning device. The pellicle assembly may comprise a pellicle and a frame. An adhesive may be provided between, and may be in contact with, the frame and the patterning device so as to affix the frame to the patterning device.

The adhesive may be provided in a single continuous shape. The shape may generally match a shape of the frame.

A hermetically sealed space may be formed between the pellicle assembly and the patterning device. In such an embodiment the pellicle assembly is referred to as a "closed frame" system.

The adhesive may be a PMMA glue.

The mask assembly according to the twelfth aspect of the invention is advantageous for several reasons.

The mask assembly according to the twelfth aspect of the invention may provide a hermetically sealed space between the pellicle assembly and the patterning device. Advantageously, this may prevent contaminant particles from entering said space and causing errors in a pattern applied to a substrate by a lithographic apparatus.

The mask assembly according to the twelfth aspect of the invention is particularly advantageous over known arrangements which typically use intermediate fixing members (known as studs) which are affixed to the patterning device and which engage with the pellicle assembly, as now discussed.

The mask assembly according to the twelfth aspect of the invention comprises fewer components than a mask assembly which uses intermediary fixing members such as studs (affixed to a patterning device) and engagement mechanisms (provided on the pellicle assembly) to engage with the intermediary fixing members (studs). Therefore, advantageously, the mask assembly according to the twelfth aspect of the invention may be relatively simple to manufacture. The lower number of components and the simpler manufacturing procedure may result in a lower cost of manufacture.

With known arrangements which use studs adhered to the patterning device, the total contact area between the studs and the patterning device is relatively small. Therefore, typically, an area of the surface of the patterning device which contacts each stud is etched so as to form stud landing pads. In contrast, an area of the surface of the patterning device which is affixed to the pellicle frame in the mask assembly according to the twelfth aspect of the invention is generally significantly larger than a total area of a patterning device which would be affixed to studs in the alternative design of mask assembly which uses studs. Therefore, advantageously, selective etching of a surface of the patterning device (which may be necessary in such an alternative design of mask assembly to increase adhesion between the patterning device and one or more studs provided thereon) is not necessary in the mask assembly according to the twelfth aspect of the invention. Advantageously, this may reduce manufacture time and manufacture cost of the mask assembly according to the twelfth aspect of the invention.

Material characteristics of the PMMA glue, in particular the elasticity of the PMMA glue and the dimensions in which the PMMA glue may be applied, result in a relatively low deformation of the patterning device due to curing of the PMMA glue (as compared to other glues). In contrast, if the pellicle frame were directly affixed to the patterning device using the known epoxy glue, deformation of the patterning device due to curing of the epoxy glue would be significantly larger, resulting in errors in a patterns projected onto a substrate by a lithographic apparatus. Therefore, use of the PMMA glue enables the production of an improved mask assembly according to the twelfth aspect of the invention by overcoming issues associated with use of the known epoxy glue.

PMMA glue is more easily removable, and relatively more elastic, than the known epoxy glue. Advantageously, this may enable a pellicle assembly, forming part of the mask assembly according to the twelfth aspect of the invention, to be replaced more easily.

It will be appreciated that one or more aspects or features described above or referred to in the following description may be combined with one or more other aspects or features.

BRIEF DESCRIPTION OF THE DRAWINGS

Embodiments of the invention will now be described, by way of example only, with reference to the accompanying schematic drawings, in which:

FIG. 3 is a perspective view of a mask assembly according to an embodiment of the invention;

FIG. 4 is a cross sectional view of part of the mask assembly of FIG. 3;

FIG. 5 depicts an engagement mechanism which forms part of the mask assembly of FIG. 3;

FIG. 20 depicts in cross-section a variant of the stud attachment apparatus shown in FIG. 19;

FIG. 22 depicts two designs of a mask assembly according to embodiments of the present invention.

DETAILED DESCRIPTION

Figure 1:
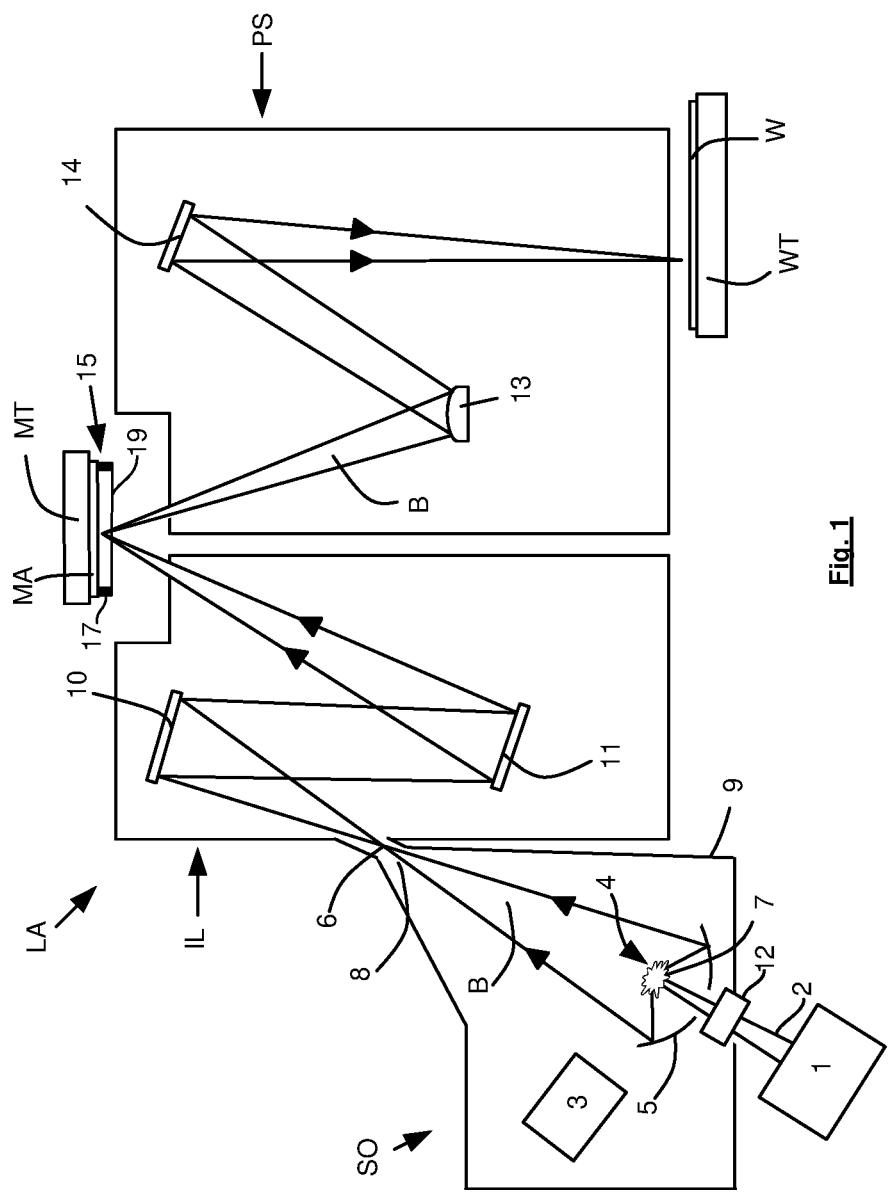
FIG. 1 is a schematic illustration of a lithographic system comprising a lithographic apparatus and a radiation source.

FIG. 1 shows a lithographic system. The lithographic system comprises a radiation source SO and a lithographic apparatus LA. The radiation source SO is configured to generate an extreme ultraviolet (EUV) radiation beam B. The lithographic apparatus LA comprises an illumination system IL, a support structure MT configured to support a mask assembly 15 including a patterning device MA (e.g., a mask), a projection system PS and a substrate table WT configured to support a substrate W. The illumination system IL is configured to condition the radiation beam B before it is incident upon the patterning device MA. The projection system is configured to project the radiation beam B (now patterned by the patterning device MA) onto the substrate W. The substrate W may include previously formed patterns. Where this is the case, the lithographic apparatus aligns the patterned radiation beam B with a pattern previously formed on the substrate W.

The radiation source SO, illumination system IL, and projection system PS may all be constructed and arranged such that they can be isolated from the external environment. A gas at a pressure below atmospheric pressure (e.g., hydrogen) may be provided in the radiation source SO. A vacuum may be provided in the illumination system IL and/or the projection system PS. A small amount of gas (e.g., hydrogen) at a pressure well below atmospheric pressure may be provided in the illumination system IL and/or the projection system PS.

The radiation source SO shown in FIG. 1 is of a type that may be referred to as a laser produced plasma (LPP) source. A laser 1, which may for example be a CO2 laser, is arranged to deposit energy via a laser beam 2 into a fuel, such as tin (Sn) that is provided from a fuel emitter 3. Although tin is referred to in the following description, any suitable fuel may be used. The fuel may for example be in liquid form, and may for example be a metal or alloy. The fuel emitter 3 may comprise a nozzle configured to direct tin, e.g., in the form of droplets, along a trajectory towards a plasma formation region 4. The laser beam 2 is incident upon the tin at the plasma formation region 4. The deposition of laser energy into the tin creates a plasma 7 at the plasma formation region 4. Radiation, including EUV radiation, is emitted from the plasma 7 during de-excitation and recombination of ions of the plasma.

The EUV radiation is collected and focused by a near normal incidence radiation collector 5 (sometimes referred to more generally as a normal incidence radiation collector). The collector 5 may have a multilayer structure that is arranged to reflect EUV radiation (e.g., EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

In other embodiments of a laser produced plasma (LPP) source the collector 5 may be a so-called grazing incidence collector that is configured to receive EUV radiation at grazing incidence angles and focus the EUV radiation at an intermediate focus. A grazing incidence collector may, for example, be a nested collector, comprising a plurality of grazing incidence reflectors. The grazing incidence reflectors may be disposed axially symmetrically around an optical axis.

The radiation source SO may include one or more contamination traps (not shown). For example, a contamination trap may be located between the plasma formation region 4 and the radiation collector 5. The contamination trap may for example be a rotating foil trap, or may be any other suitable form of contamination trap.

The laser 1 may be separated from the radiation source SO. Where this is the case, the laser beam 2 may be passed from the laser 1 to the radiation source SO with the aid of a beam delivery system (not shown) comprising, for example, suitable directing mirrors and/or a beam expander, and/or other optics. The laser 1 and the radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The radiation source SO is arranged such that the intermediate focus 6 is located at or near to an opening 8 in an enclosing structure 9 of the radiation source SO.

The radiation beam B passes from the radiation source SO into the illumination system IL, which is configured to condition the radiation beam. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the mask assembly 15 held by the support structure MT. The mask assembly 15 includes a patterning device MA and a pellicle 19, which is held in place by a pellicle frame 17. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors that are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors in FIG. 1, the projection system may include any number of mirrors (e.g., six mirrors).

The lithographic apparatus may, for example, be used in a scan mode, wherein the support structure (e.g., mask table) MT and the substrate table WT are scanned synchronously while a pattern imparted to the radiation beam is projected onto a substrate W (i.e., a dynamic exposure). The velocity and direction of the substrate table WT relative to the support structure (e.g., mask table) MT may be determined by the demagnification and image reversal characteristics of the projection system PS. The patterned radiation beam that is incident upon the substrate W may comprise a band of radiation. The band of radiation may be referred to as an exposure slit. During a scanning exposure, the movement of the substrate table WT and the support structure MT may be such that the exposure slit travels over an exposure field of the substrate W.

The radiation source SO and/or the lithographic apparatus that is shown in FIG. 1 may include components that are not illustrated. For example, a spectral filter may be provided in the radiation source SO. The spectral filter may be substantially transmissive for EUV radiation but substantially blocking for other wavelengths of radiation such as infrared radiation.

In other embodiments of a lithographic system the radiation source SO may take other forms. For example, in alternative embodiments the radiation source SO may comprise one or more free electron lasers. The one or more free electron lasers may be configured to emit EUV radiation that may be provided to one or more lithographic apparatus.

As was described briefly above, the mask assembly 15 includes a pellicle 19 that is provided adjacent to the patterning device MA. The pellicle 19 is provided in the path of the radiation beam B such that radiation beam B passes through the pellicle 19 both as it approaches the patterning device MA from the illumination system IL and as it is reflected by the patterning device MA towards the projection system PS. The pellicle 19 comprises a thin film that is substantially transparent to EUV radiation (although it will absorb a small amount of EUV radiation). By EUV transparent pellicle or a film substantially transparent for EUV radiation herein is meant that the pellicle 19 is transmissive for at least 65% of the EUV radiation, preferably at least 80% and more preferably at least 90% of the EUV radiation. The pellicle 19 acts to protect the patterning device MA from particle contamination.

Whilst efforts may be made to maintain a clean environment inside the lithographic apparatus LA, particles may still be present inside the lithographic apparatus LA. In the absence of a pellicle 19, particles may be deposited onto the patterning device MA. Particles on the patterning device MA may disadvantageously affect the pattern that is imparted to the radiation beam B and the pattern that is transferred to the substrate W. The pellicle 19 advantageously provides a barrier between the patterning device MA and the environment in the lithographic apparatus LA in order to prevent particles from being deposited on the patterning device MA.

The pellicle 19 is positioned at a distance from the patterning device MA that is sufficient that any particles that are incident upon the surface of the pellicle 19 are not in a field plane of the lithographic apparatus LA. This separation between the pellicle 19 and the patterning device MA acts to reduce the extent to which any particles on the surface of the pellicle 19 impart a pattern to the radiation beam B that is imaged onto the substrate W. It will be appreciated that where a particle is present in the beam of radiation B, but at a position that is not in a field plane of the beam of radiation B (i.e., not at the surface of the patterning device MA), then any image of the particle will not be in focus at the surface of the substrate W. In the absence of other considerations it may be desirable to position the pellicle 19 a considerable distance away from the patterning device MA. However, in practice the space which is available in the lithographic apparatus LA to accommodate the pellicle is limited due to the presence of other components. In some embodiments, the separation between the pellicle 19 and the patterning device MA may, for example, be approximately between 1 mm and 10 mm, for example between 1 mm and 5 mm, more preferably between 2 mm and 2.5 mm.

A mask assembly may be prepared for use in a lithographic apparatus by attaching a pellicle to a pellicle frame and by attaching the pellicle frame to a patterning device. A mask assembly comprising a patterning device MA and a pellicle supported adjacent to the patterning device by a pellicle frame may be prepared remotely from a lithographic apparatus LA and the mask assembly may be transported to the lithographic apparatus LA for use in the lithographic apparatus LA. For example, a pellicle frame supporting a pellicle may be attached to a patterning device, so as to form a mask assembly, at a site at which a pattern is imparted onto the patterning device. The mask assembly may then be transported to a separate site at which a lithographic apparatus LA is situated and the mask assembly may be provided to the lithographic apparatus LA for use in the lithographic apparatus LA.

A mask assembly in which a pellicle is held in place by a pellicle frame may be delicate and transport of the mask assembly may risk damage to the pellicle. Assembling a mask assembly in a separate environment to a lithographic apparatus LA may additionally result in the mask assembly being exposed to a variety of pressure conditions. For example, a mask assembly may be transported to a lithographic apparatus under ambient pressure conditions. The mask assembly may then be loaded into the lithographic apparatus LA via a load lock which is pumped to vacuum pressure conditions. Changes in the pressure conditions to which a mask assembly is exposed may cause a pressure difference to exist across a pellicle which may cause the pellicle to bend and may risk damage to the pellicle. In an embodiment, a lithographic system may comprise a lithographic apparatus LA connected to a pellicle frame attachment apparatus. Where this is the case a mask assembly comprising a mask and pellicle may be transferred directly from the pellicle frame attachment apparatus to the lithographic apparatus whilst remaining in a controlled environment (e.g. a vacuum environment).

Figure 2:
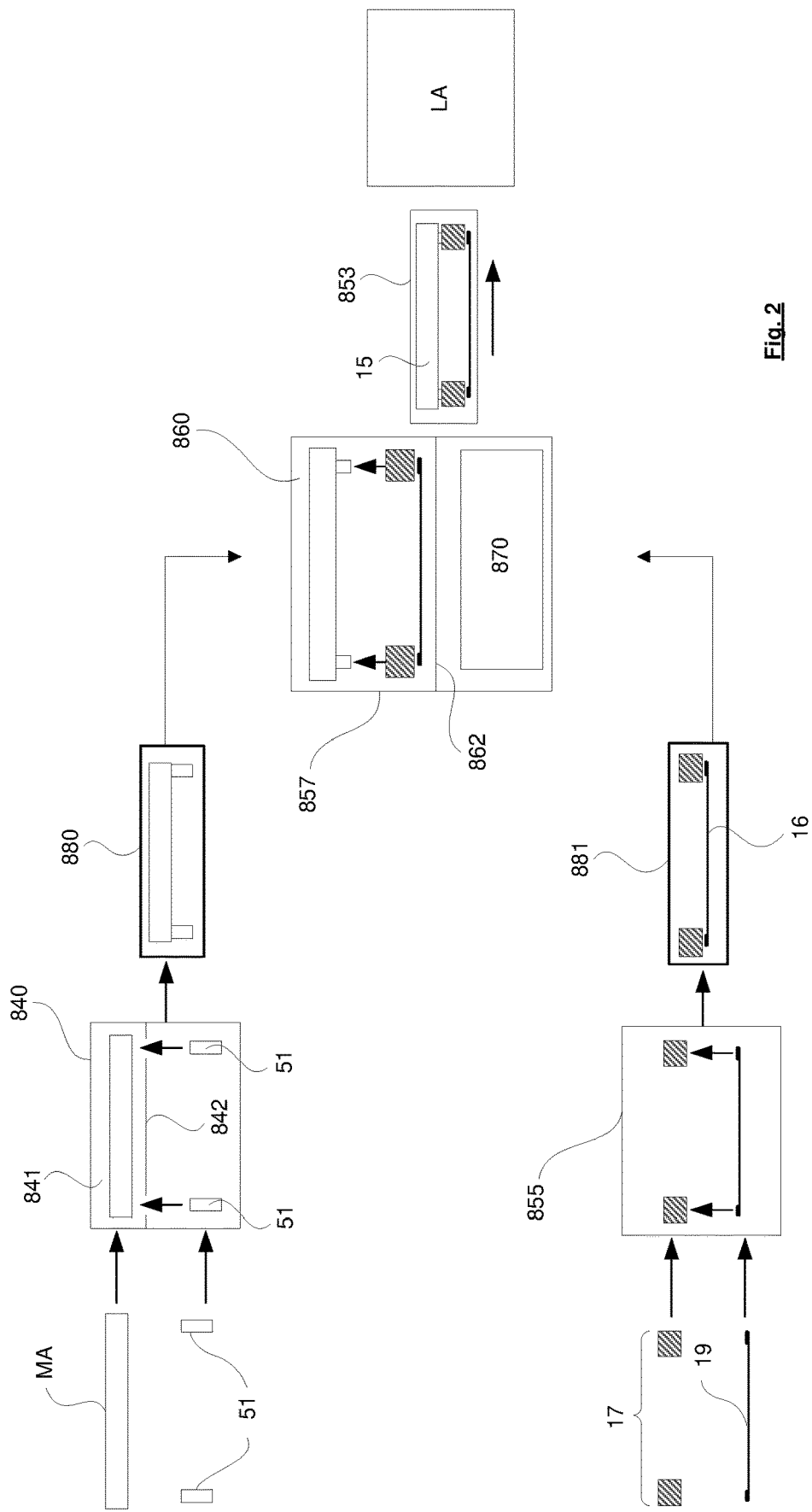
FIG. 2 is a schematic illustration of various apparatuses and a lithographic apparatus according to embodiments of the invention.

FIG. 2 is a schematic illustration of apparatus suitable for assembling a mask assembly 15 and transferring the mask assembly to a lithographic apparatus LA. FIG. 2 depicts a pellicle attachment apparatus 855 which may be used to attach a pellicle 19 to a pellicle frame 17, and a pellicle assembly transport device 881 which may be used to transport the pellicle assembly. In addition a stud attachment apparatus 840 is depicted, which may be used to attach studs 51 to a patterning device MA. The studs 51 allow releasable attachment of the pellicle frame 17 (and pellicle 19) to the patterning device MA. A mask transport device 880 which may be used to transport the mask with attached studs is also depicted. A pellicle frame attachment apparatus 857 which may be used to attach a pellicle frame 17 (and pellicle 19)

to a patterning device MA, thereby forming a mask assembly 15, is also depicted. A mask assembly transport device 853 which may be used to transport the mask assembly 15 from the pellicle frame attachment apparatus 857 to the lithographic apparatus LA is also shown.

The pellicle attachment apparatus 855 may be situated at a different site from the site at which the lithographic apparatus is situated. The stud attachment apparatus 840 may be situated at a different site from the site at which the lithographic apparatus LA is situated. Alternatively, either or both of the pellicle attachment apparatus 855 and the stud attachment apparatus 840 may be located at the same site as the site at which the lithographic apparatus LA is situated (e.g. in a lithographic fab).

The pellicle attachment apparatus 855 receives a pellicle 19, a pellicle frame 17 and engagement mechanisms (not illustrated). The pellicle 19 and pellicle frame 17 may be manually placed in the pellicle attachment apparatus 855. Glue is dispensed at engagement mechanism receiving openings in the pellicle frame 17 (e.g. locations described further below). Glue dispensing may be manual, or may be automated (or partially automated).

The engagement mechanisms and the pellicle frame 17 are aligned relative to each other (e.g. using an optical alignment apparatus), and the engagement mechanisms are then inserted into the openings in the pellicle frame 17.

Glue is also dispensed onto the pellicle frame 17 (e.g. at spaced apart locations around the pellicle frame 17). Glue dispensing may be manual, or may be automated (or partially automated). An optical alignment system is used to align the pellicle 19 relative to the pellicle frame 17, and the pellicle is then pressed against the pellicle frame.

The pellicle 19 may be manipulated by a pellicle manipulator which forms part of the pellicle attachment apparatus 855. The pellicle manipulator may comprise means for tensioning the pellicle 19. The pellicle manipulator may tension the pellicle 19 and hold the pellicle 19 against the pellicle frame 17 at room temperature for a period of time sufficient to allow the glue to cure, thereby securing the pellicle 19 to the pellicle frame 17. The pressure on the pellicle 19 is then removed. Additional curing of the glue at an elevated temperature is then performed using a curing oven (which may form part of the pellicle attachment apparatus 855). This will also cure glue which attaches the engagement mechanisms to the pellicle frame 17. In an alternative approach, some heating may be applied to cure the glue when the pellicle 19 is being held against the pellicle frame (instead of allowing curing to proceed at room temperature).

Glue may be provided by a glue dispenser. The glue dispenser may form part of the pellicle attachment apparatus 855. The glue dispenser may comprise a syringe. The syringe may dispense a defined volume of one or more components of the glue. The glue dispenser may comprise a nozzle. For example, the nozzle may be connected to the syringe and one or more components of the glue may be provided using the syringe connected to the nozzle. The glue may be applied with a cylindrical nozzle. The glue may be applied with a tapered nozzle. The glue dispenser may comprise a brush and may apply one or more components of the glue using the brush. The glue dispenser may comprise a sponge and may apply one or more components of the glue using the sponge. The glue dispenser may comprise a printing apparatus (for example, a screen printing apparatus) for providing one or more components of the glue. The glue dispenser may comprise a dispensing apparatus for providing one or more components of the glue as a spray (for example, an aerosol spray dispensing system may be used). It will be appreciated that the glue may be provided in any known manner.

The glue dispenser may provide a glue in multiple components (for example, an accelerator and an initiator of the glue). One component of a glue may have a higher viscosity than another component of a glue. That is, there may be a component of the glue having a relatively high viscosity (a "thick" component) and a component of the glue having a relatively low viscosity (a "thin" component). In an example embodiment, a glue dispenser may dispense a thick component of the glue using a syringe and a nozzle. In an example embodiment, a glue dispenser may dispense a thin component of the glue using a brush, sponge, screen printing apparatus, or aerosol spray dispensing system.

Although the use of glue to attach the pellicle 19 to the pellicle frame 17 is described above, the pellicle may be attached to the pellicle frame using any suitable type of bonding (including without using glue).

The resulting pellicle assembly 16 is inspected using a particle inspection tool. The particle inspection tool may form part of the pellicle attachment apparatus 855 (or may be a separate tool). The particle inspection tool may be configured to inspect for particles disposed on the pellicle 19 and/or the pellicle frame 17. The particle inspection tool may, for example, reject a pellicle assembly 16 which has a number of particles which is greater than a given particle threshold. The particle inspection tool may also be used to inspect a pellicle 19 and/or a pellicle frame 17 before the pellicle and pellicle frame are glued together.

The pellicle attachment apparatus 855 may be configured, following inspection, to seal the pellicle assembly 16 in a pellicle assembly transport device 881 (a sealed box). As depicted, the pellicle assembly transport device 881 may be arranged to hold the pellicle assembly in an orientation in which the pellicle 19 is below the pellicle frame 17. Because the transport device 881 is sealed, the pellicle assembly can be transported without the pellicle assembly 16 being contaminated. The pellicle assembly 16 may be transported in the transport device 881 to a pellicle frame attachment apparatus 857.

The pellicle attachment apparatus 855 may include a clean environment so as to reduce the number of particles inside the sealed environment, thereby reducing the number or particles which may be deposited on the pellicle 19. The pellicle attachment apparatus 855 may, for example, be situated at a site at which pellicles are manufactured. In some embodiments a pellicle 19 may be provided to the pellicle attachment apparatus 855 directly from a pellicle manufacturing tool (not shown) in which the pellicle 19 is manufactured. A pellicle 19 may, for example, be provided to the pellicle attachment apparatus 855 from a pellicle manufacturing tool whilst keeping the pellicle 19 inside a clean environment. This may reduce the chance of a pellicle 19 from being contaminated or damaged before being provided to the pellicle attachment apparatus 855. The clean environment may, for example, be a sealed environment (i.e. fully isolated from an external environment). The sealed environment may be pumped so as to maintain a vacuum in the sealed environment.

The attachment of the pellicle 19 to the pellicle frame 17 may be controlled so as to achieve a desirable tension in the pellicle 19. For example, the tension in the pellicle 19 may be measured during or after attachment of the pellicle 19 to the pellicle frame 17 and the tension may be adjusted in response to the measurement in order to achieve a desirable tension in the pellicle 19. The tension in the pellicle 19 may be maintained, for example, by applying an outward force to components of the pellicle frame 17 so as to stretch the pellicle 19. Tension in the pellicle 19 may for example be maintained by using differences in thermal expansion coefficients between the pellicle frame and the pellicle.

In an embodiment, the patterning device (which may be referred to as a mask) MA may be provided with protrusions which are received by engagement mechanisms (e.g. as described further below). The patterning device may for instance receive four protrusions (referred to herein as studs). As depicted in FIG. 2, the stud attachment apparatus 840 may be used to attach studs 51 to the patterning device MA.

The studs 51 and the patterning device MA may be manually placed in the stud attachment apparatus 840. The patterning device MA may be held in a controlled environment 841 which is separated from the rest of the stud attachment apparatus 840. Separation may be provided by a partition 842 with openings through which the studs 51 may project in order to contact the patterning device MA. The controlled environment 841 may be held at a higher pressure than other parts of the stud attachment apparatus 840 (e.g. by delivering gas through an outlet in the controlled environment). This will inhibit or prevent passage of contamination particles into the controlled environment 841 from other parts of the stud attachment apparatus.

The stud attachment apparatus 840 may include a stud manipulator (not depicted), such as a robot or actuators for accurately placing the studs. An example of a suitable actuator for placing studs onto the patterning device is a Lorentz actuator (not depicted). The stud attachment apparatus 840 may also include a device for automatically providing a given amount of glue or adhesive to the stud surface to be attached to the patterning device MA. Applying a glue or adhesive may also be done manually. Contamination of the patterning device MA by contaminants from the glue or adhesive is prevented or reduced by a flow of air from the controlled environment 841 above the partition 842 to below the partition (the flow of air is caused by the pressure above the partition being higher than the pressure below the partition).

The stud attachment apparatus 840 may further include an optical alignment system which aligns the studs with respect to alignment markers present on the reticle in order to accurately position the studs. For example, the alignment markers conventionally provided on the patterning device MA and used for pattern alignment may also be used for aligning the studs.

The stud attachment apparatus may include a support structure movable in the X-Y-Z and Rz directions for adjusting the position of the patterning device MA. The position of the support structure holding the patterning device MA may be adjustable manually by means of coarse and fine mechanical adjusting devices, or using automated (or semi-automated) actuators or any other type of devices suitable for alignment and positioning which are coupled to the patterning device table.

Once the studs 51 and the patterning device MA have been aligned, the studs 51 are then pressed against the patterning device MA. The studs 51 may be held against the patterning device MA at room temperature for a period of time which is sufficient to allow the glue to cure, thereby securing the studs 51 to the mask MA. Alternatively, the studs 51 may be heated in order to accelerate curing of the glue. Additional curing of the glue at an elevated temperature may then be performed using a curing oven (which may form part of the stud attachment apparatus 840).

Glue may be provided by a glue dispenser. The glue dispenser may form part of the stud attachment apparatus 840. The glue dispenser may comprise a syringe. The syringe may dispense a defined volume of one or more components of the glue. The glue dispenser may comprise a nozzle. For example, the nozzle may be connected to the syringe and one or more components of the glue may be provided using the syringe connected to the nozzle. The glue may be applied with a cylindrical nozzle. The glue may be applied with a tapered nozzle. The glue dispenser may comprise a brush and may apply one or more components of the glue using the brush. The glue dispenser may comprise a sponge and may apply one or more components of the glue using the sponge. The glue dispenser may comprise a printing apparatus (for example, a screen printing apparatus) for providing one or more components of the glue. The glue dispenser may comprise a dispensing apparatus for providing one or more components of the glue as a spray (for example, an aerosol spray dispensing system may be used). It will be appreciated that the glue may be provided in any known manner.

The glue dispenser may provide a glue in multiple components (for example, an accelerator and an initiator of the glue). One component of a glue may have a higher viscosity than another component of a glue. That is, there may be a component of the glue having a relatively high viscosity (a "thick" component) and a component of the glue having a relatively low viscosity (a "thin" component). In an example embodiment, a glue dispenser may dispense a thick component of the glue using a syringe and a nozzle. In an example embodiment, a glue dispenser may dispense a thin component of the glue using a brush, sponge, screen printing apparatus, or aerosol spray dispensing system.

The patterning device MA and studs 51 may be inspected using a particle inspection tool (which may form part of the stud attachment apparatus 840).

The stud attachment apparatus 840 seals the patterning device MA and studs 51 in a mask transport device 880 (a sealed box). Because the mask transport device 880 is sealed, the patterning device MA and studs 51 can be transported without the mask MA being contaminated. The patterning device MA and studs may be transported in the mask transport device 880 to the pellicle frame attachment apparatus 857.

In an embodiment, the mask MA is provided to the stud attachment apparatus 840 in a sealed box (to reduce the risk of contamination). The box may remain sealed until just before the studs 51 are to be attached to the patterning device MA, thereby minimizing the time during which contamination could travel to the mask MA.

The controlled environment 841 of the stud attachment apparatus 840 may be provided in part by a housing which subsequently forms part of the patterning device MA transport device 880 (a sealed box). The housing may form walls and a roof of the mask transport device 880, with a floor of the mask transport device 880 being formed by a plate that is fitted after the studs 51 have been attached (e.g. immediately afterwards). Using the housing in this way may assist in preventing contamination from being incident upon the patterning device MA. The housing may comprise a cover of a pod. The mask table of the stud attachment apparatus 840 may be configured to receive the housing.

Similarly, the pellicle attachment apparatus 855 may also be formed in part by a housing that subsequently forms part of the pellicle assembly transport device 881.

The pellicle assembly 16 in the pellicle assembly transport device 881 and the patterning device MA (and studs 51)

in the mask transport device 880 are both transported to the pellicle frame attachment apparatus 857. The pellicle frame attachment apparatus 857 may be provided in a fab in which one or more lithographic apparatus are also provided.

The pellicle frame attachment apparatus 857 is configured to attach the pellicle frame 17 of the pellicle assembly 16 to the studs 51 on the patterning device MA so as to form a mask assembly 15. The pellicle frame attachment apparatus 857 may include a controlled environment 860 which is separated from the rest of the pellicle frame attachment apparatus 857. Separation may be provided by a partition 862 with openings through which manipulators extend (not shown in FIG. 2). The manipulators may be operated by a control system 870 (described further below). The controlled environment 860 may be maintained as a clean environment so as to reduce the number of particles inside the controlled environment, thereby reducing the number of particles which may be deposited on the mask assembly 15. The controlled environment 860 may be held at a higher pressure than other parts of the pellicle frame attachment apparatus 857 (e.g. by delivering gas through an outlet in the controlled environment 860). This will inhibit or prevent passage of contamination particles into the controlled environment 860 from other parts of the pellicle frame attachment apparatus 857.

The mask assembly 15 which is assembled by the pellicle frame attachment apparatus 857 is transported from the pellicle frame attachment apparatus 857 to the lithographic apparatus LA in a mask assembly transport device 853. The mask assembly transport device 853 may comprise a sealed and clean environment in which the mask assembly 15 is transported. This reduces the chances of the mask assembly 15 being contaminated or damaged during transport of the mask assembly 15. The sealed and clean environment may, for example, be pumped to a vacuum.

The pellicle frame attachment apparatus 857 may be used to mount, demount or remount the pellicle assembly 16 to/from the patterning device MA. The pellicle frame attachment apparatus 857 may comprise manipulators arranged to manipulate engagement mechanisms of the pellicle frame 17 (as described further below).

The patterning device MA may, for example, be provided with alignment marks. The pellicle frame 17 may be positioned relative to the alignment marks on the patterning device MA. Aligning the pellicle frame 17 relative to alignment marks on the patterning device MA may advantageously increase the accuracy with which the pellicle frame 17 is positioned on the patterning device MA during attachment of the pellicle frame 17 to the patterning device MA.

In some embodiments the patterning device MA may be cleaned in the pellicle frame attachment apparatus 857, for example, to remove particles from the patterning device MA. In other embodiments cleaning of the patterning device MA may be performed in a dedicated cleaning tool.

Although illustrated embodiments show the pellicle frame 17 being attached at the front of the mask MA, in other embodiments the pellicle frame 17 may be attached at other parts of the mask MA. For example, the pellicle frame 17 may be attached to sides of the mask MA. This may be achieved for example using sub-mounts which provide releasably engageable attachment between the pellicle frame 17 and sides of the mask MA. In an alternative arrangement the pellicle frame 17 may be attached to the mask MA through a combination of some attachment locations on sides of the mask MA and some attachment locations on the front of the mask MA. Attachment may for example be provided by sub-mounts which releasably engage the pellicle frame 17 and the mask MA.

In some embodiments the pellicle frame attachment apparatus 857 may include a particle inspection tool (not shown). The particle inspection tool may be configured to inspect the mask assembly 15 for particles disposed on the mask assembly 15. The particle inspection tool may, for example, reject mask assemblies 15 which have a number of particles disposed on them which is greater than a given particle threshold.

In some embodiments the pellicle frame attachment apparatus 857 may include a pattern inspection system which inspects the pattern on the patterning device MA for any defects. The pattern inspection system may inspect the pattern on the patterning device MA before and/or after the pellicle frame 17 is attached to the patterning device MA.

The attachment of the pellicle frame 17 to the patterning device MA may be controlled so as to achieve a desirable tension in the pellicle 19. For example, the tension in the pellicle 19 may be measured during attachment of the pellicle frame 17 to the patterning device MA and the tension may be adjusted in response to the measurement in order to achieve a desired tension in the pellicle 19.

The lithographic apparatus LA may, for example, correspond with the lithographic apparatus LA which is depicted in FIG. 1. The lithographic apparatus LA may include components which are configured to receive a mask assembly 15 from the mask assembly transport device 853 and load the mask assembly 15 onto a support structure MT of the lithographic apparatus LA. The mask assembly 15 may be illuminated with a conditioned radiation beam B provided by an illumination system IL. The patterning device MA of the mask assembly 15 may impart the conditioned radiation beam with a pattern in its cross-section to form a patterned radiation beam. The patterned radiation beam may be projected by a projection system PS onto a substrate W held by a substrate table WT. The conditioned radiation beam may, for example, comprise EUV radiation. In embodiments in which the conditioned radiation beam comprises EUV radiation the pellicle 19 of the mask assembly 15 may be substantially transparent to EUV radiation.

In some embodiments a pellicle assembly 16 may be attached to a patterning device MA so as to form a mask assembly 15 under vacuum conditions in the pellicle frame attachment apparatus 857. The mask assembly 15 may subsequently be transported to the lithographic apparatus LA under vacuum conditions by the mask assembly transport device 853 and may be held under vacuum conditions in the lithographic apparatus LA. The mask assembly 15 may therefore be exposed to approximately the same pressure conditions throughout its assembly in the pellicle frame attachment apparatus 857 and use in the lithographic apparatus LA. This advantageously reduces any pressure changes to which the mask assembly 15 is exposed and therefore reduces any pressure differences which may develop across the pellicle 19.

In some embodiments the patterning device MA and/or the pellicle 19 may be inspected for particles and/or defects in the pellicle frame attachment apparatus 857 whilst the components are held in a vacuum. The patterning device MA and/or the pellicle 19 are therefore advantageously inspected under similar pressure conditions to those to which they are exposed during use in the lithographic apparatus LA. This is advantageous since any particles which may be deposited onto patterning device MA and/or the pellicle during pumping down to vacuum conditions may be detected in the pellicle frame attachment apparatus 857.

In some embodiments the lithographic system may further comprise a separate inspection apparatus (not shown) which is configured to inspect one or more components of a mask assembly 15 for particles and/or defects. A mask assembly 15 may, for example, be transported to an inspection apparatus (e.g. by the mask assembly transport device 853) after being assembled in the pellicle frame attachment apparatus 857 and prior to transporting the mask assembly 15 to the lithographic apparatus LA.

Embodiments of the invention as described above advantageously allow a mask assembly 15 to be assembled and passed to a lithographic apparatus LA in an automated (or semi-automated) process. The assembly and transport of the mask assembly 15 may all be conducted in a sealed clean environment which may, for example, be pumped to vacuum pressure conditions. This may reduce the chance of components of the mask assembly 15 from being contaminated or damaged prior to the use of the mask assembly 15 in a lithographic apparatus LA.

In general, the useful lifetime of a pellicle 19 may be less than the useful lifetime of a patterning device MA. It may therefore be desirable to remove a pellicle assembly 16 from patterning device MA and replace the pellicle assembly with a new pellicle assembly so as to allow for continued use of the patterning device MA. Replacement of a pellicle assembly 16 may, for example, be carried out in the pellicle frame attachment apparatus 857. For example, after use in the lithographic apparatus LA, a mask assembly 15 may be passed back to the pellicle frame attachment apparatus 857 using the mask assembly transport device 853 for pellicle assembly replacement in the pellicle frame attachment apparatus 857. The patterning device MA may be subjected to a cleaning process so as to remove contamination from the patterning device MA after the pellicle assembly 16 has been removed. The studs 51 may be removed from the patterning device MA before the patterning device is subjected to the cleaning process.

It will be noted that the patterned side of the patterning device MA is directed downwards during the various operations that are depicted in FIG. 2. Keeping the patterned side of the patterning device MA facing downwards is advantageous because this reduces the likelihood of a contamination particle being incident upon the pattern. Larger contamination particles tend to fall downwards due to gravity and thus will be incident upon the opposite side of the mask. Smaller contamination particles are less influenced by gravity and may instead be influenced by other transport physics. Apparatus of embodiments of the invention may include devices intended to address this. For example, the apparatus may include an ionizer to remove static charges and thereby reduce the risk of electrostatics causing particles to become attached to the pellicle.

A mask assembly is illustrated in FIGS. 3-5. A pellicle frame 17 and pellicle 19 are suspended relative to a patterning device MA. The pellicle frame 17 is releasably engageable with the patterning device MA. The releasable engagement is provided by a mount which comprises a plurality of sub-mounts 10 (for example 2, 3, 4 or even more sub-mounts). The mount allows the pellicle frame 17 (and pellicle 19) to be removed from the patterning device MA in an easy and convenient manner. The removal of the pellicle frame 17 and pellicle 19 from the patterning device MA may be clean, i.e. may generate substantially no contamination particles. Once the pellicle frame 17 has been removed from the patterning device MA the patterning device MA may be inspected using an inspection tool (and may be cleaned if necessary). The pellicle frame 17 and pellicle 19 can subsequently be easily reattached to the patterning device MA or may be replaced with a new pellicle frame 17 and pellicle 19. Each sub-mount 10 of the mount is formed by an engagement mechanism and a protrusion (discussed in more detail below with reference to FIG. 4).

Referring first to FIG. 3, a pellicle 19 is attached to a pellicle frame 17. The pellicle 19 may, for example, be glued to the pellicle frame 17. The pellicle frame 17 is provided with four engagement mechanisms 50A-D. Each engagement mechanism 50A-D is provided on a ramp portion 49A-D. The ramp portions 49A-D are generally trapezoidal. The ramp portions 49A-D are attached to the pellicle frame 17 and protrude from the pellicle frame 17 in a main plane of the pellicle frame 17. Each engagement mechanism 50A-D is configured to receive a protrusion 51 (which may for example be referred to as a stud 51) which extends from a patterning device MA (as described below in connection with FIG. 4). Two engagement mechanisms 50A, 50B are provided on one side of the pellicle frame 17 and two engagement mechanisms 50C, 50D are provided on an opposite side of the pellicle frame 17. Other combinations may also be possible, such as an engagement mechanism 50 on each of the four frame sides etc. The engagement mechanisms 50A-D are provided on sides of the pellicle frame 17 which will be oriented in the scanning direction during use in a lithographic apparatus LA (indicated in FIG. 3 as the y-direction in accordance with conventional notation). However, the engagement mechanisms 50A-D may also be provided on sides of the pellicle frame 17 which will be oriented perpendicular to the scanning direction during use in a lithographic apparatus LA (indicated in FIG. 3 as the x-direction in accordance with conventional notation).

The protrusions 51 which are received by the engagement mechanisms 50A-D may be located on the front surface of the patterning device MA. Additionally or alternatively, the protrusions 51 may be located on sides of the patterning device MA. Protrusions 51 may extend upwardly from sides of the patterning device MA. In such an arrangement the protrusions 51 may each have a flattened lateral surface to facilitate secure bonding to a side of the patterning device MA.

FIG. 3 depicts four engagement mechanisms 50A-D secured to a pellicle frame 17. Two engagement mechanisms 50A, 50D are configured to allow for movement in the y-direction (i.e. provide flexibility or compliance in the y-direction). Two engagement mechanisms 50B, 50C are configured to allow for movement in the x-direction (i.e. provide flexibility or compliance in the x-direction). However, all four engagement mechanisms 50A-D are configured to allow engagement to be achieved between the engagement mechanisms 50A-D and protrusions 51 (not depicted) via movement in the y-direction and thus, as may be seen, all four engagement mechanisms 50A-D include engagement arms 80 which extend in the y-direction. A possible disadvantage of this configuration is that sudden deceleration during a y-direction scanning movement could cause the engagement mechanisms 50A-D to slide out of attachment to the protrusions (due to inertia of the pellicle frame 17). This might occur for example if there is a 'crash' of the mask support structure MT (see FIG. 1). In an alternative arrangement, all four engagement mechanisms 50A-D may include engagement arms 80 which extend in the x-direction (i.e. the non-scanning direction). Having the engagement arms 80 all extending in the non-scanning direction is advantageous because this avoids the possibility of a sudden y-direction deceleration causing disengagement of the engagement mechanisms 50A-D. In general, the engagement arms 80 of each engagement mechanism 50A-D may all extend in substantially the same direction.

In order to allow movement/flexibility in the x-direction, arms 62 which support locking members of two of the engagement mechanisms 50B, C extend in the y-direction. These arms 62 are resiliently flexible in the x-direction and thus provide movement/flexibility in the x-direction. Thus, engagement arms 80 of two of the engagement mechanisms 50B, 50C extend generally parallel to the arms 62 of those engagement mechanisms. In order to allow movement/flexibility in the y-direction, arms 62 which support locking members of the other two engagement mechanisms 50A, D extend in the x-direction. These arms 62 are resiliently flexible in the y-direction and thus provide movement/flexibility in the y-direction. Thus, engagement arms 80 of two of the engagement mechanisms 50A, 50D extend generally perpendicular to the arms 62 of those engagement mechanisms. The movement/flexibility which is provided by the engagement mechanisms 50A-D allows flexing of the pellicle frame 17 relative to the patterning device MA as needed when temperature changes occur. This is advantageous because it avoids potentially damaging thermal stresses arising in the pellicle frame 17.

The engagement mechanisms 50A-D in FIG. 3 are depicted with tabs 56 which have a different configuration from the tabs 56 depicted in FIG. 5. However, the tabs 56 provide the same function of facilitating engagement between the engagement mechanisms 50A-D and the pellicle frame 17. Any suitable configuration of tabs 56 may be used.

FIG. 4 depicts in cross-section one engagement mechanism 50A along with a protrusion 51 which projects from a patterning device MA. Together, the engagement mechanism 50A and the protrusion 51 constitute a sub-mount 10. The protrusion 51, which may be referred to as a stud, may for example be glued to the patterning device MA or may be attached by other bonding means (optical contacting, magnetic or van der Waals forces, etc.). The protrusion 51 comprises a distal head 53 located on a shaft 55 which extends from a base 57. The base 57 is fixed to the patterning device MA for example by using glue. The shaft 55 and distal head 53 may be cylindrical, or they may have any other suitable cross-sectional shape.

The sub-mount 10 suspends the pellicle frame 17 relative to the patterning device MA such that there is a gap G (which may be considered to be a slit) between the pellicle frame 17 and the patterning device MA. The gap G may be maintained by engagement between a cap 66 of the engagement mechanism 50A and the distal head 53 of the protrusion 51 (or by some other movement limiting component). The gap G may be sufficiently wide to allow equalization of pressure between the exterior environment and the space between the pellicle 19 and the patterning device MA. The gap G may also be sufficiently narrow that it provides a desired restriction of the potential route of contamination particles from the exterior environment to the space between the pellicle 19 and the patterning device MA. The gap G may for example be at least 100 microns in order to allow equalization of pressure between the exterior environment and the space between the pellicle 19 and the patterning device MA. The gap G may for example be less than 500 microns, more preferably less than 300 microns. The gap G may for example be between 200 microns and 300 microns.

FIG. 5 depicts the sub-mount 10 of FIG. 4 (comprising the engagement mechanism 50A and the protrusion 51) in more detail. The pellicle frame 17 attached to the engagement mechanism 50A is not depicted in FIG. 5. Similarly, the patterning device MA from which the protrusion 51 projects is not depicted in FIG. 5. FIG. 5A shows the sub-mount 10 viewed from below and FIG. 5B shows the sub-mount 10 in a perspective view seen from below.

The engagement mechanism 50A comprises a rectangular outer wall 60 which is received in an opening in a pellicle frame 17 (see FIG. 3). A pair of arms 62 extend in the y-direction across a space defined by the outer wall 60. A connecting member 63 extends between distal ends of the arms 62. The arms 62 are examples of resilient members. Other resilient members may be used. The arms 62 and connecting member 63 together form a generally U-shaped support. A locking member 70 is connected to a distal end of the generally U-shaped support. The locking member 70 engages with the protrusion 51 (which may be referred to as a stud) thereby securing the pellicle frame 17 to the patterning device MA.

The locking member 70 comprises a pair of engagement arms 80 provided with engagement tabs 81 and further comprises a cap 66. As may be best seen in FIG. 5B, when the locking member 70 is engaged with the protrusion 51, the engagement tabs 81 press against an under-surface of a distal head 53 of the protrusion 51, and the cap 66 presses against an outer surface of the distal head 53. This pressing of the engagement tabs 81 and cap 66 against the distal head 53 of the protrusion 51 secures the engagement mechanism 50A to the protrusion to provide a secure sub-mount 10. This provides a secure connection between the pellicle frame 17 and the patterning device MA.

The cap 66 and the engagement arms 80 extend from intermediate arms 82a, 82b. The intermediate arms 82a,b extend from the connecting member 63 and extend in the y-direction back across a space generally defined by the outer wall 60. A connecting member 83 extends between the intermediate arms 82a,b. The intermediate arms 82a,b and connecting member 83 together form a generally U-shaped support.

Thus, a first generally U-shaped support formed by arms 62 and connecting member 63 extends in the y-direction across the space generally defined by the outer wall 60, and a second U-shaped support formed by support arms 82a,b and connecting member 83 extends back across that space.

The arms 62 which form the first generally U-shaped support have some flexibility in the x-direction, and this allows some movement in the x-direction of the locking member 70. Thus the sub-mount 10 allows some movement in the x-direction of a pellicle frame relative to a patterning device at the location of that sub-mount. The arms 62 are formed from resilient material and therefore tend to return to their original orientations. The sub-mount 10 may be considered to be a kinematic sub-mount. The arms 62 are significantly thicker in the z-direction than in the x-direction (as may best be seen in FIG. 5B), and as a result significantly less bending of the arms in the z-direction is possible compared with bending of the arms in the x-direction. Since the arms extend in the y-direction, they do not provide for significant movement in the y-direction. The arms 62 may thus prevent or substantially prevent local movement of a pellicle frame 17 in the y and z-directions whilst allowing some movement of a pellicle frame 17 in the x-direction.

The cap 66 extends from the first support arm 82a. Engagement arms 80 extend from the second support arm 82b. The first support arm 82a is significantly thicker in the x-direction than the arms 62, and thus does allow significant movement in the x-direction relative to the arms 62. The second support arm 82b has a similar thickness to the arms 62 in the x-direction, but the connecting member 83 which extends between the intermediate arms 82a, 82b inhibits movement of the second support arm 82b in the x-direction because such movement can only occur if the first support arm 82a also moves.

The engagement arms 80 extend from the second support arm 82b in the general direction of the cap 66. Proximal ends of the engagement arms 80 extend along the majority of the second support arm 82b (thereby substantially preventing the engagement arms 80 from flexing in directions which are generally parallel to a patterned surface of the patterning device MA). The engagement arms 80 taper as they extend in the general direction of the cap 66. Engagement tabs 81 extend inwardly from distal ends of the engagement arms 80 to engage with an under-surface of a distal head 53 of the protrusion 51. Blocks 54 are provided above the engagement tabs 81 and provide actuator receiving surfaces as is explained further below. The engagement arms 80 are resiliently deformable in the z-direction. The engagement arms 80 may be sufficiently thin that they bend in the z-direction. Additionally or alternatively, some bending in the z-direction of the engagement arms 80 may be facilitated by a groove 59 which extends in the y-direction at the point where the engagement arms 80 connect to the support arm 82b.

Tabs 56 extend outwardly from the outer wall 60. The tabs 56 may be used to secure the engagement mechanism 50A to a pellicle frame. This is depicted in FIG. 3 but with a different configuration of tabs 56.

Figure 6:
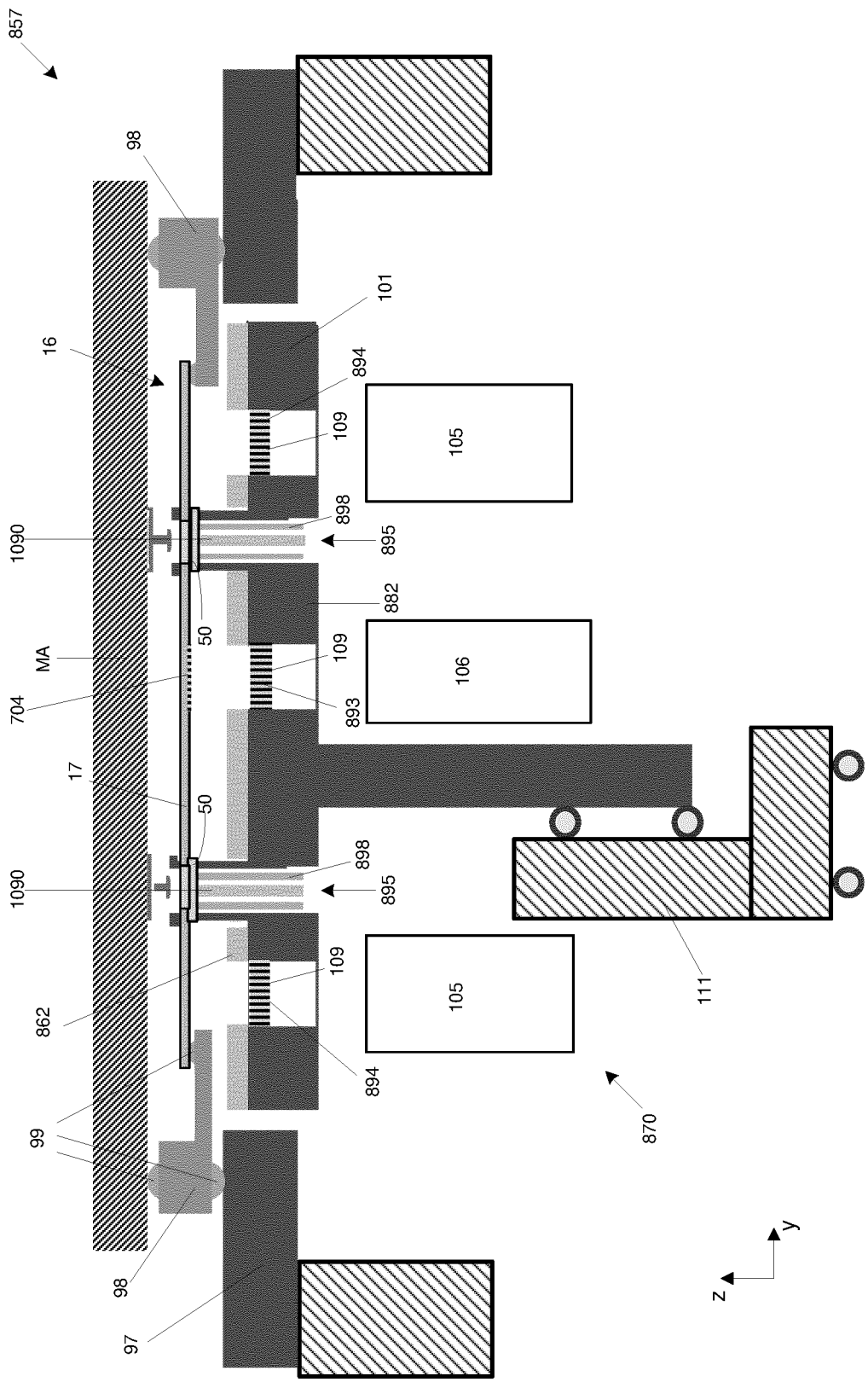
FIG. 6 schematically depicts a pellicle frame attachment apparatus according to an embodiment of the invention.

An embodiment of a pellicle frame attachment apparatus 857 is depicted in FIG. 6. The pellicle frame attachment apparatus 857 may correspond with the pellicle frame attachment apparatus 857 shown in FIG. 2. FIG. 6 schematically shows the pellicle frame attachment apparatus 857 in cross-section. A mask assembly 15 comprises a patterning device MA provided with a pellicle frame 17 and a pellicle 19 (not depicted). The frame 17 is provided with four engagement mechanisms 50 which correspond with the engagement mechanisms 50A-D described further above in connection with FIGS. 3 to 5. Pins 1090 of the pellicle frame attachment apparatus 857 project through holes 895 in a partition 862. The partition 862 may correspond with, or be located on top of, a support structure 101. Windows 893, 894 are located in the support structure 101, and imaging sensors 105, 106 are located beneath the windows 893, 894. Alignment marks 109 are provided on the windows 893, 894. Alignment marks 704 are also provided on the patterning device MA.

An additional support structure 97 is provided at an outer perimeter of the pellicle frame attachment apparatus 857. The additional support structure may have a fixed position (as depicted), and is referred to herein as the fixed support structure 97. An intermediate support structure 98 is provided on top of the fixed support structure 97. The intermediate support structure 98 extends inwardly from the fixed support structure 97 as depicted. The intermediate support structure 98 supports both the pellicle frame 17 and the patterning device MA prior to attachment of the pellicle frame 17 to the patterning device MA. Contacts 99 between the intermediate support structure 98 and other entities may for example be kinematic connections. The contacts 99 may be provided with a coating of polyether ether ketone (PEEK).

In use, the pellicle assembly 16 is loaded into the pellicle frame attachment apparatus 857. It may be transferred to the pellicle frame attachment apparatus 857 without exposing it to contamination. For example, the pellicle assembly transport device 881 may be received in a load lock or in a controlled flow environment within the pellicle frame attachment apparatus 857, and the pellicle assembly 16 may be removed from the transport device within the load lock or controlled flow environment. The pellicle assembly 16 may then be transferred to the controlled environment 857 above the partition 862.

Figure 7A:
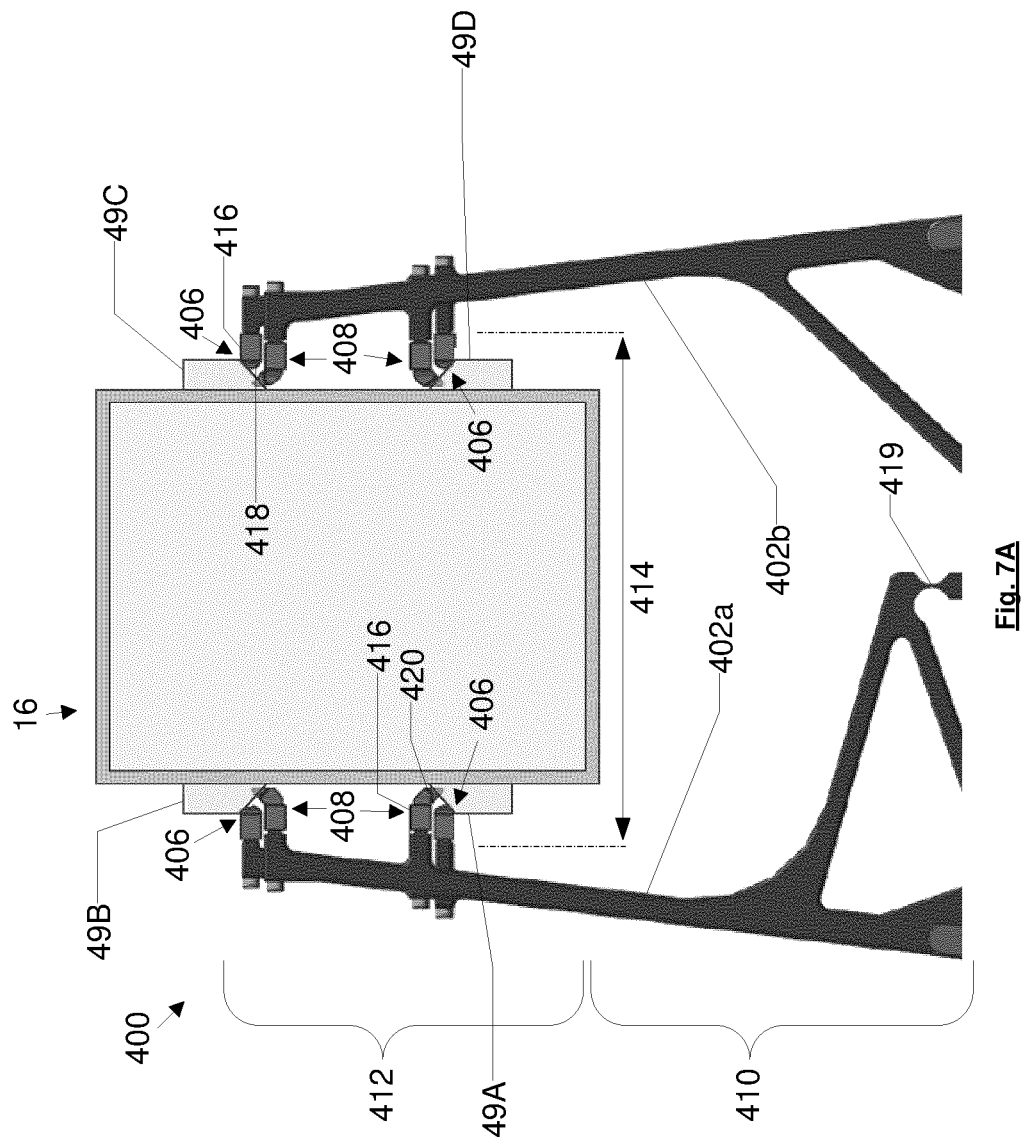
FIG. 7 shows a pellicle assembly handling system according to an embodiment of the invention.

The pellicle assembly 16 may be positioned relative to the pellicle frame attachment apparatus 857, for example using a pellicle assembly handling system. A pellicle assembly handling system may comprise a pellicle assembly gripper. FIG. 7 shows an example of a pellicle assembly gripper 400. FIG. 7A shows a top view of the pellicle assembly gripper 400. FIG. 7A also shows a pellicle assembly 16. The pellicle assembly 16 shown in FIG. 7A may correspond to the pellicle assembly 16 shown in FIG. 3. FIG. 7B shows a perspective view of the pellicle assembly gripper 400. The pellicle assembly gripper 400 comprises: a first arm 402a; a second arm 402b; a plurality of pellicle assembly aligners 406; and a plurality of pellicle assembly support pads 408

The first arm 402a and the second arm 402b each comprise a base portion 410 and a grip portion 412. The base portion 410 of each of the first arm 402a and the second arm 402b is movably attached to a pellicle assembly gripper control apparatus 422. In particular, the base portion 410 of each of the first arm 402a and the second arm 402b is rotationally or pivotally attached to the pellicle assembly gripper control apparatus 422. Each of the first arm 402a and the second arm 402b may be described as being moveable between at least an open position and a closed position. A gap 414 between the grip portion 412 of the first arm 402a and the grip portion 412 of the second arm 402b can be varied. The gap 414 can be varied by moving either or both of the first arm 402a and the second arm 402b. The gap 414 can be varied using pellicle assembly gripper control knobs 424 which form part of the pellicle assembly gripper control apparatus 422. The pellicle assembly gripper control knobs 424 are configured such that rotation thereof alters the position and/or rotation of arms 402a, 402b, thereby altering the gap 414. The pellicle assembly gripper 400 may be described as being in an open configuration or a closed configuration. The open configuration of the pellicle assembly gripper 400 may correspond to the first arm 402a and the second arm 402b of the pellicle assembly gripper 400 defining a wider gap 414 than the gap 414 present when the pellicle assembly gripper 400 is in a closed configuration. In FIG. 7 the pellicle assembly gripper 400 is shown in a closed configuration. In a closed configuration of the pellicle assembly gripper 400, the gap 414 is approximately the same size as an outer dimension of the pellicle frame 17. In an open configuration of the pellicle assembly gripper 400, the gap 414 is greater than said outer dimension of the pellicle frame 17.

The plurality of pellicle assembly aligners 406 and the plurality of pellicle assembly support pads 408 are arranged such that at least one pellicle assembly aligner 406 and at least one pellicle assembly support pad 408 is disposed on the grip portion 412 of each arm 402a, 402b. The pellicle assembly gripper 400 shown in FIG. 7 comprises two pellicle assembly aligners 406 and two pellicle assembly support pads 408 on each arm 402a, 402b. Each pellicle assembly aligner 406 is disposed within the gap 414. Each pellicle assembly support pad 408 is disposed within the gap 414. Surfaces of the generally cuboidal bodies 416 of the pellicle assembly aligners 406 and the pellicle assembly support pads 408 may be generally flat. In particular, surfaces of the generally cuboidal bodies 416 of the pellicle assembly aligners 406 and the pellicle assembly support pads 408 which face the gap 414 may be generally flat. Each pellicle assembly support pad 408 comprises a generally cuboidal body 416 which is provided with a shelf 420. Each shelf 420 protrudes from a corresponding generally cuboidal body 416. Each shelf 420 protrudes into the gap 414. Each support pad 408 may be described as being generally L-shaped. Protruding portions of the support pads 408 (i.e., shelves 420) may be described as providing a ledge. The shelves 420 of the support pads 408 are shaped and disposed so as to support portions of a pellicle frame 17. Each shelf 420 is configured so as to be capable of supporting a ramp portion 49 of a pellicle assembly 16 (see FIG. 3). In particular, the shelves 420 of the support pads 408 are shaped and disposed so as to support ramp portions 49 of a pellicle frame 17 when a pellicle assembly 16 is placed within the grip portion 412 of the pellicle assembly gripper 400 and when the pellicle assembly gripper 400 is in a closed configuration. The shelves 420 of the support pads 408 are configured to locally contact a surface of the ramp portions 49 of the pellicle assembly 16 and apply a force thereto which is generally perpendicular to a plane of the pellicle assembly 16 so as to support the pellicle assembly 16.

Each pellicle assembly aligner 406 comprises a generally cuboidal body 416 which is attached to an alignment head 418. Each alignment head 418 protrudes from a portion of a corresponding generally cuboidal body 416. Each alignment head 418 protrudes into the gap 414. Each alignment head 418 may be rounded. The alignment heads 418 of the aligners 406 are shaped and disposed so as to make contact with portions of a pellicle frame 17. Each alignment head 418 is configured so as to be capable of making contact with an edge of a ramp portion 49 of a pellicle assembly 16 (see FIG. 3). In particular, the alignment heads 418 of the support pads 408 are shaped and disposed so as to ensure a pellicle frame 17 is in a predetermined position when a pellicle assembly 16 is placed within the grip portion 412 of the pellicle assembly gripper 400 and when the pellicle assembly gripper 400 is in a closed configuration. The alignment heads 418 of the aligners 406 are configured to locally contact a surface of the ramp portions 49 of the pellicle assembly 16 and apply a force thereto generally in a plane of the pellicle assembly 16 so as to align the pellicle assembly 16.

The plurality of pellicle assembly aligners 406 and the plurality of pellicle assembly support pads 408 may be formed from PEEK. Alternatively, the plurality of pellicle assembly aligners 406 and/or the plurality of pellicle assembly support pads 408 may be formed from a different material.

Components of the pellicle assembly gripper 400 may be formed as per user requirements. Each of the first arm 402a and the second arm 402b may be formed from a continuous section of material. Each of the first arm 402a and the second arm 402b may be formed from a plurality of sub-sections of material. Each of the first arm 402a and the second arm 402b may comprise one or more cut-outs (for example voids, apertures or recesses). Cut-outs may be beneficial for reducing weight of the arms 402a, 402b. Cut-outs may be beneficial for reducing cost of manufacturing of the arms 402a, 402b. Cut-outs may be formed such that the cut-outs comprise no sharp corners. Corners of cut-outs may be rounded. Rounded corners of cut-outs may be beneficial for reducing mechanical stresses (relative to rounded corners not being provided) within a structure in which the cut-outs are provided. In FIG. 7, the first arm 402a comprises a single cut-out having rounded corners, and the second arm comprises a two cut-outs having rounded corners.

Cut-outs may provide internal hinge points 419 (for example, formed as living hinges). Cut-outs may be shaped such that they provide end-stops to any movement which is enabled by the hinge points. Cut-outs may be described as constituting an active part of the structure of the pellicle assembly gripper 400. Advantageously, cut-outs may reduce friction between components (relative to using a standard hinge). Lower friction may lead to less particulate generation and subsequent contamination. Further, cut-outs may reduce tolerance build-up (relative to using a standard hinge).

The patterning device MA (with studs 51) may be transferred to the pellicle frame attachment apparatus 857 without exposing it to contamination. For example, the mask transport device 881 may be received in a load lock or a controlled flow environment within the pellicle frame attachment apparatus 857, and the patterning device MA may be removed from the transport device within the load lock or controlled flow environment. The patterning device MA may then be transferred to the controlled environment 857 above the partition 862.

Figure 8B:
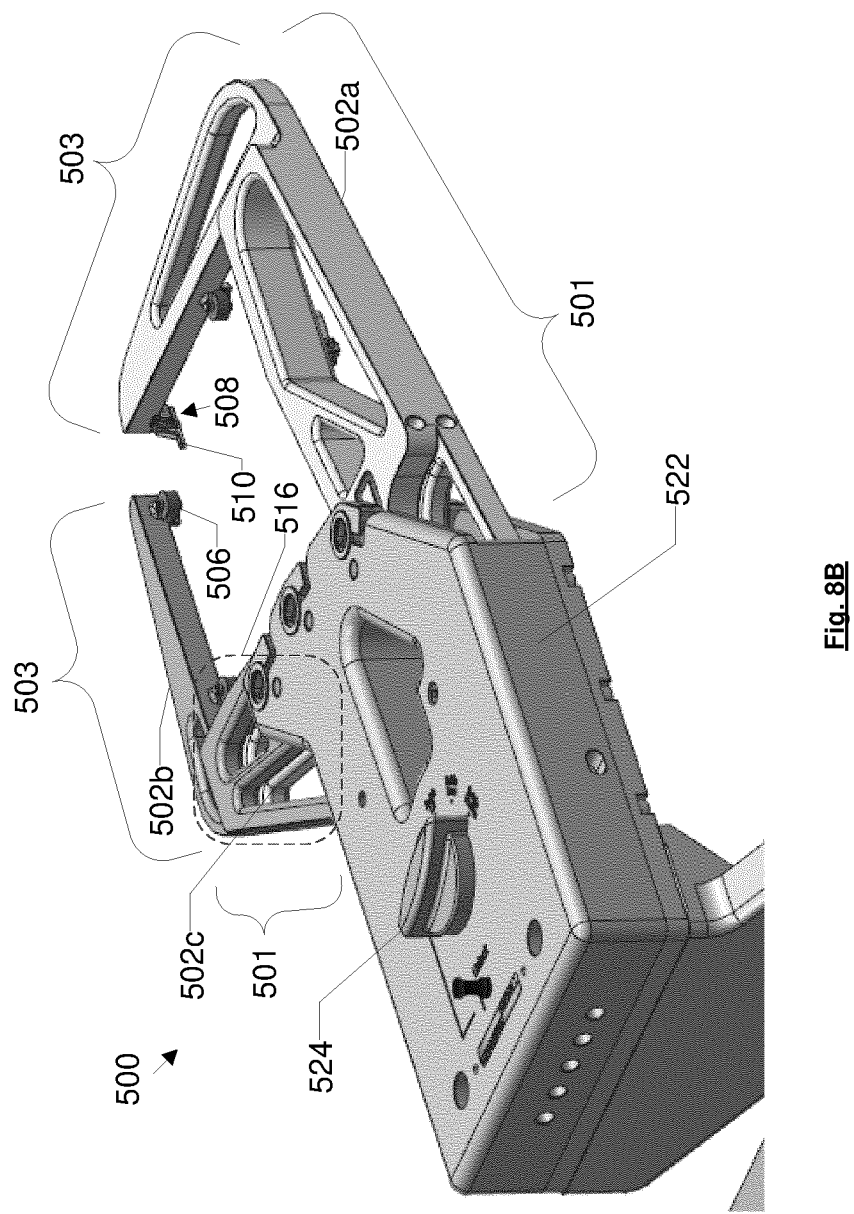
FIG. 8 shows a patterning device handling system according to an embodiment of the invention.

The patterning device MA may be positioned relative to the pellicle frame attachment apparatus 857, for example using a patterning device handling system. A patterning device handling system may comprise a patterning device gripper. FIG. 8 shows an example of a patterning device gripper 500. FIG. 8A shows a top view of the patterning device gripper 500. FIG. 8B shows a perspective view of the patterning device gripper 500. The patterning device gripper 500 comprises: a first arm 502a; a second arm 502b; a third arm 502c; a plurality of patterning device aligners 506; and a plurality of patterning device support fingers 508.

Each of the first arm 502a and the second arm 502b is generally L-shaped. Each of the first arm 502a and the second arm 502b comprises a base portion 501 and a distal portion 503. A base portion 501 and a corresponding distal portion 503 are generally mutually perpendicular. The base portion 501 of each of the first arm 502a and the second arm 502b extends from the patterning device gripper control system 522. The base portion 501 of the first arm 502a and the base portion 501 of the second arm 502b are generally mutually perpendicular. The third arm 502c is generally of the same shape as the base portion 501 of the second arm 502b. The third arm 502c does not comprise a distal portion. In the top view of the patterning device gripper 500 shown in FIG. 8A, the third arm 502c is substantially hidden from view by the second arm 502b. The third arm 502c may be described as being disposed underneath the base portion 501 of the second arm 502b. As the third arm 502c is generally hidden from view in FIGS. 8A and 8B, region 516 is provided in these Figures, which illustrates the spatial extent of the third arm (underneath the second arm 502b).

The base portion 501 of each of the arms 502a, 502b, 502c is fixed to a patterning device gripper control apparatus 522. The base portion 501 of each of the arms 502a, 502b, 502c is movably attached to the patterning device gripper control apparatus 522. In particular, the base portion 501 of each of the arms 502a, 502b, 502c is rotationally or pivotally attached to the patterning device gripper control apparatus 522. A point where each of the arms 502a, 502b, 502c is attached to the patterning device gripper control system 522 may be spring loaded. Each of the arms 502a, 502b, 502c is rotatable (relative to the patterning device gripper control system 522) about an axis defined by a point where the each of the arms 502a, 502b, 502c is movably attached to the patterning device gripper control system 522, respectively. Each of the arms 502*a*, 502*b*, 502*c* may be described as being moveable between at least an open position and a closed position. An angle between the base portion 501 of the arm 502*a* and the base portions 501 of the arms 502*b*, 502*c* may be varied by movement of the arms 502*a*, 502*b*, 502*c*. However, when each of the arms 502*a*, 502*b*, 502*c* is disposed in a closed position, the base portion 501 of the arm 502*a* is generally perpendicular to the base portions 501 of the arms 502*b*, 502*c*. The arms 502*a*, 502*b*, 502*c* are shaped and disposed such that the arms 502*a*, 502*b*, 502*c* define a generally rectangular space 514 therebetween.

The generally rectangular space 514 can be varied in size and shape. The generally rectangular space 514 can be varied in size and shape by moving the arms 502*a*, 502*b*, 502*c* with respect to the patterning device gripper control system 522. The generally rectangular space 514 can be varied in size and shape using a patterning device gripper control knob 524 which forms part of the patterning device gripper control apparatus 522. The patterning device gripper control knob 524 is configured such that rotation thereof alters the position and/or rotation of the arms 502*a*, 502*b*, 502*c* (relative to the patterning device gripper control system 522), thereby altering the size and shape of the generally rectangular space 514. The patterning device gripper 500 may be described as being in an open configuration or a closed configuration. The open configuration of the patterning device gripper 500 may correspond to the arms 502*a*, 502*b*, 502*c* of the patterning device gripper 500 defining a larger generally rectangular space 514 than the generally rectangular space 514 present when the patterning device gripper 500 is in a closed configuration. In FIG. 8 the patterning device gripper 500 is shown in a closed configuration. In a closed configuration of the patterning device gripper 500, dimensions of the generally rectangular space 514 are similar to but slightly smaller than two outer dimensions of the patterning device MA. A spring loaded connection between each of the arms 502*a*, 502*b*, 502*c* and the patterning device gripper control system 522 allows the generally rectangular space 514 to be increased to the size of two outer dimensions of a patterning device MA when the patterning device gripper 500 is in a closed configuration. In an open configuration of the patterning device gripper 500, the generally rectangular space 514 is larger than a space defined by two outer dimensions of the patterning device MA.

Each patterning device support finger 508 comprises a protrusion 510. Each protrusion 510 protrudes from one of the arms 502*a*, 502*b*, 502*c* into the generally rectangular space 514. In the patterning device gripper 500 shown in FIG. 8, one patterning device support finger 508 is attached to the base portion 501 of the first arm 502*a*, one patterning device support finger 508 is attached to the distal portion 503 of the first arm 502*a*, and one patterning device support finger 508 is attached to the base portion 501 of the second arm 502*b*.

The protrusions 510 of the patterning device support fingers 508 may be described as providing a ledge. The protrusions 510 of the patterning device support fingers 508 are shaped and disposed so as to support portions of a patterning device MA. In particular, the protrusions 510 of the support fingers 508 are shaped and disposed so as to support portions of a patterning device MA when a patterning device MA 16 is placed within the generally rectangular space 514 and when the patterning device gripper 500 is in a closed configuration. The protrusions 510 of the patterning device support fingers 508 are configured to locally contact a surface of the patterning device and apply a force thereto generally perpendicular to a plane of the patterning device so as to support the patterning device.

Each patterning device aligner 506 comprises a generally cylindrical member. The generally cylindrical member may be described as a wheel. Each patterning device aligner 506 is attached to one of the arms 502*a*, 502*b*, 502*c* using an axle and one or more supplementary members such that each patterning device aligner 506 is rotatable about a longitudinal axis thereof. Each patterning device aligner 506 protrudes from one of the arms 502*a*, 502*b*, 502*c* into the generally rectangular space 514. In the patterning device gripper 500 shown in FIG. 8, one patterning device aligner 506 is attached to the base portion 501 of the first arm 502*a*, one patterning device aligner 506 is attached to the distal portion 503 of the first arm 502*a*, one patterning device aligner 506 is attached to the third arm 502*c*, and two patterning device aligners 506 are attached to the distal portion 503 of the second arm 502*b*. The patterning device aligners 506 are shaped and disposed so as to make contact with portions of a patterning device MA. In particular, the patterning device aligners 506 are shaped and disposed so as to ensure a patterning device MA is in a predetermined position when the patterning device MA is placed within the generally rectangular space 514 and when the patterning device gripper 500 is in a closed configuration. The patterning device aligners 506 are configured to locally contact a surface of the patterning device MA and apply a force thereto generally in a plane of the patterning device MA so as to align the patterning device MA.

The plurality of patterning device aligners 506 and the plurality of patterning device support fingers 508 may be formed from PEEK. Alternatively, the plurality of patterning device aligners 506 and/or the plurality of patterning device support fingers 508 may be formed from a different material.

Components of the patterning device gripper 500 may be formed as per user requirements. Each of the arms 502*a*, 502*b*, 502*c* may be formed from a continuous section of material. Each of the arms 502*a*, 502*b*, 502*c* may be formed from a plurality of sub-sections of material. Each of the arms 502*a*, 502*b*, 502*c* may comprise one or more cut-outs (for example voids, apertures or recesses). Said cut-outs may be beneficial for reducing weight of the arms 502*a*, 502*b*, 502*c*. Said cut-outs may be beneficial for reducing cost of manufacturing of the arms 502*a*, 502*b*, 502*c*. Said cut-outs may be formed such that the cut-outs comprise no sharp corners. Corners of said cut-outs may be rounded. Rounded corners of cut-outs may be beneficial for reducing mechanical stresses (relative to rounded corners not being provided) within a structure in which the cut-outs are provided. Each of the arms 502*a*, 502*b*, 502*c* of the patterning device gripper 500 shown in FIG. 8 comprises a plurality of cut-outs having rounded corners.

Cut-outs may provide internal hinge points (for example, formed as living hinges). Cut-outs may be shaped such that they provide end-stops to any movement which is enabled by the hinge points. Cut-outs may be described as constituting an active part of the structure of the patterning device gripper 500. Advantageously, cut-outs may reduce friction between components (relative to using a standard hinge). Lower friction may lead to less particulate generation and subsequent contamination. Further, cut-outs may reduce tolerance build-up (relative to using a standard hinge).

Figure 9A:
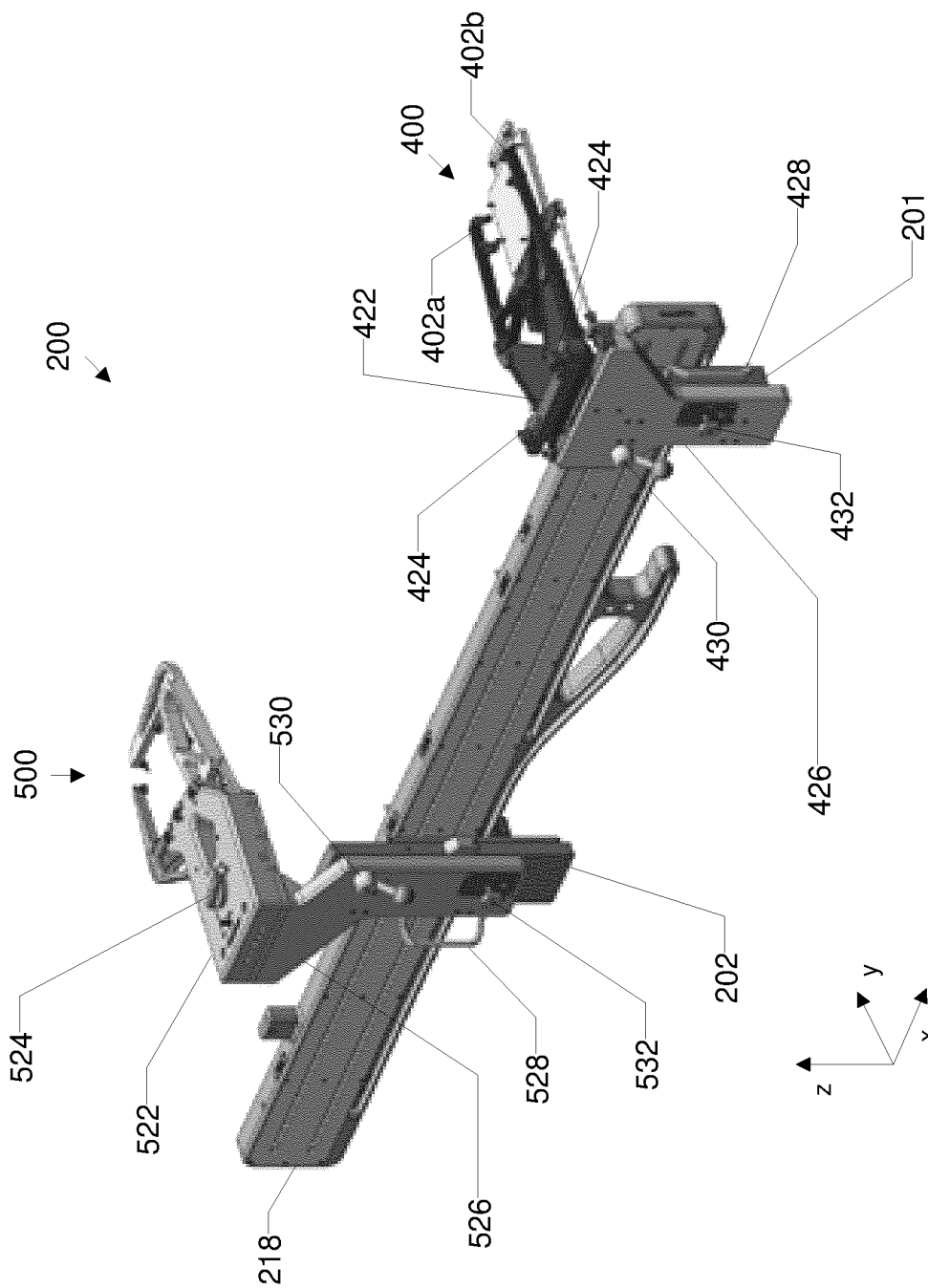
FIG. 9 shows an arrangement of the handling systems shown in FIG. 7 and FIG. 8, according to an embodiment of the invention.

FIG. 9A shows an example arrangement 200, comprising the pellicle assembly gripper 400 shown in FIGS. 7A and 7B and the patterning device gripper 500 shown in FIGS. 8A and 8B.

As shown in FIG. 9A, the first arm 402a, the second arm 402b, and the pellicle assembly gripper control system 422 are attached to a first intermediate member 426. The first intermediate member 426 comprises: a handle 428; a vertical control knob 430; and a locking block 432. Similarly, the patterning device gripper control system 522 is attached to a second intermediate member 526. The second intermediate member 526 comprises: a handle 528; a vertical control knob 530; and a locking block 532. The first intermediate member 426 is attached to a damper assembly 201. The second intermediate member 526 is attached to a damper assembly 202.

Figure 9B:
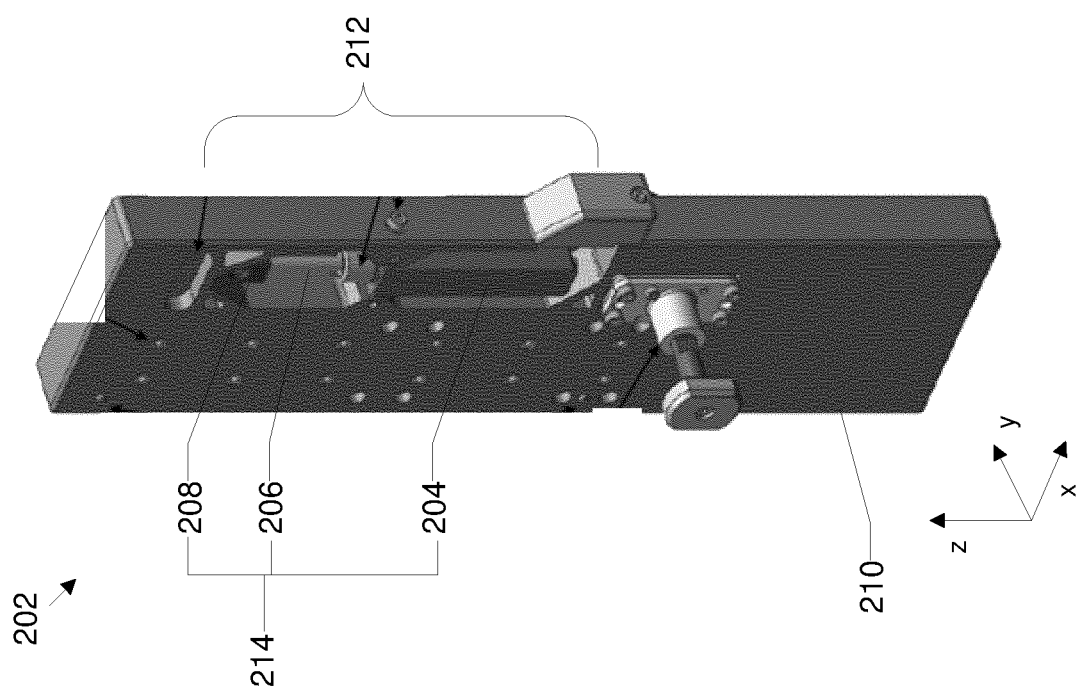

The damper assembly 202 is shown in more detail in FIG. 9B. The damper assembly 202 comprises: a body 210 having a cavity 212; and a damper mechanism 214 disposed within the cavity 212. The damper mechanism 214 comprises: a piston housing 204; a piston 206; and a fastening means 208. The piston 206 is capable of moving relative to the piston housing 204. The piston 206 is capable of moving relative to the piston housing 204 generally only in one dimension. This dimension may be the z-dimension (see axes in FIGS. 9A and 9B). The piston 206 is movably attached to an end of the piston housing 204 such that an extent to which the piston 206 is contained within the piston housing 204 may be varied. The piston 206 will generally remain stationary unless acted on by an external force. The function of the piston 206 is to damp movement. Damping may be achieved using a hydraulic dampening mechanism within the piston housing 204. The damper mechanism 214 is capable of damping movement of the piston 206 (relative to the piston housing 204) in the one dimension in which the piston 206 can move. The fastening means 208 is fixed to an end of the piston 206 which is opposite to an end of the piston 206 which is proximate to the piston housing 204.

In the arrangement 200 shown in FIG. 9A, the second intermediate member 526 supports the patterning device gripper 500 and the second intermediate member 526 is fixed to the fastening means 208. The vertical control knob 530 is operable to raise or lower a position of the patterning device gripper 500. This may be useful for positioning a patterning device MA using the patterning device gripper 500. The vertical control knob 530 may be manually operated. Vertical (z-direction in FIG. 9) movement of the patterning device gripper 500 may be damped by the damper assembly 202. In particular, vertical movement of the patterning device gripper 500 resulting from using the vertical control knob 530 may be damped by the damper assembly 202. Further to fastening the second intermediate member 526 to the fastening means 208, the second intermediate member 526 may also be attached to the damper assembly 202 by other means whilst still allowing for the damper mechanism 214 to damp movement of the patterning device gripper 500.

It will be appreciated that the first intermediate member 426 and the damper assembly 201 may comprise substantially the same components as the second intermediate member 526 and the damper assembly 202, respectively. It will be further appreciated that that the first intermediate member 426 and the damper assembly 201 may provide substantially the same functionality as the second intermediate member 526 and the damper assembly 202, respectively. Particularly, vertical movement of the pellicle assembly gripper 400 may be effected by the vertical control knob 430, and vertical movement of the pellicle assembly gripper 400 may be damped by the damper assembly 201.

Each of the damper assembly 201 and the damper assembly 202 is movably attached to a rail 218. The second intermediate member 526 supports the patterning device gripper 500 and is attached to the fastening means 208 of the damper assembly 202. The first intermediate member 426 supports the pellicle assembly gripper 400 and is attached to a fastening means in the damper assembly 201 equivalent to the fastening means 208 of the damper assembly 202.

Figure 9C:
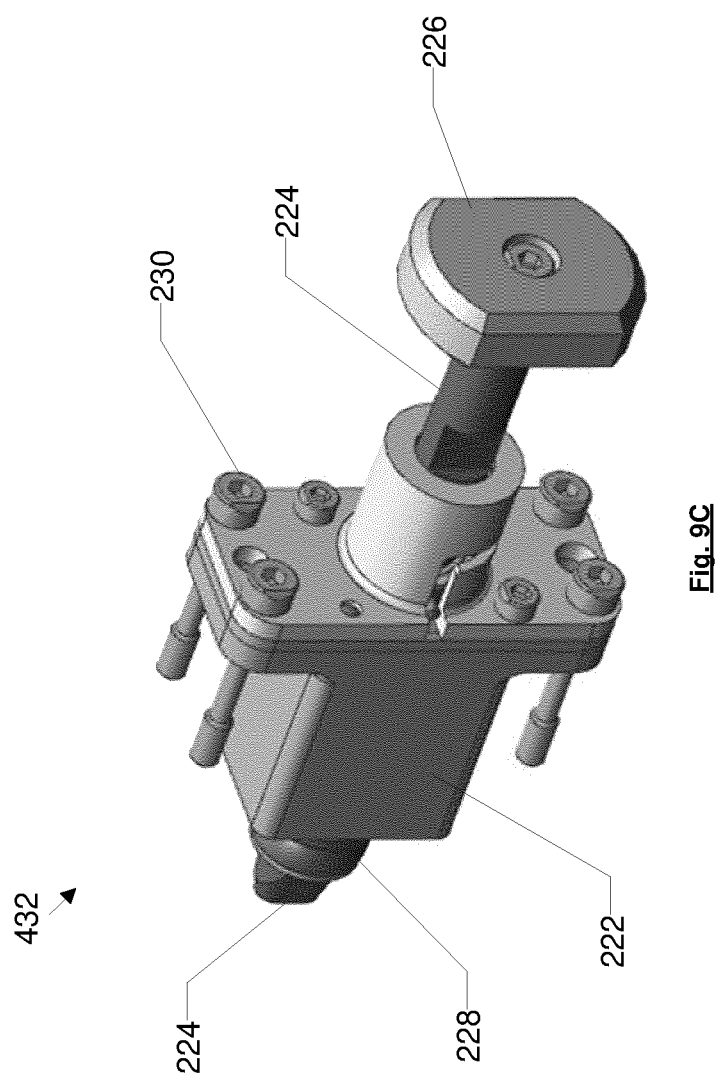

The locking block 432 is shown in more detail in FIG. 9C. The locking block 432 comprises: a housing 222; a pin 224; a pin handle 226; a wheel 228; and a plurality of fastening bolts 230. The housing 222 of the locking block 432 is fixed to the first intermediate member 426 and to the damper assembly 201 using the plurality of fastening bolts. The pin 224 is disposed within the housing 222 and protrudes from two opposite sides of the housing 222. The pin handle 226 is attached to one end of the pin 224. The wheel 228 is disposed at an end of the pin 224 opposite to the pin handle 226 such that the pin 224 protrudes through a central aperture of the wheel 228. The wheel 228 and the pin 224 have a common longitudinal axis. The wheel 228 is attached to the housing 222 such that the wheel 228 is operable to rotate about the common longitudinal axis of the wheel 228 and the pin 224. The wheel 228 may be attached to the housing 222 using a mechanism which comprises ball bearings. A further ball bearing mechanism may be provided between the pin 224 and the wheel 228. The pin 224 is operable to move in a direction parallel to the common longitudinal axis of the wheel 228 and the pin 224. A mechanism (such as a spring mechanism) contained within the housing 222 biases the pin 224 to an equilibrium position in which the pin 224 protrudes from a surface of the housing 222 a predetermined amount. The pin handle 226 may be operated such that the pin 224 moves in a direction parallel to the common longitudinal axis of the wheel 228 and the pin 224. Particularly, the pin handle 226 may be manually pulled, causing the pin 224 to move in a direction toward the pin handle 226. When the pin handle 226 is not being operated, the mechanism (such as a spring mechanism) contained within the housing 222 returns the pin 224 to the equilibrium position of the pin 224.

FIG. 9D shows the rail 218 with tracks 232, 234 highlighted. The wheel 228 of the locking block 432 is dimensioned such that the wheel 228 fits within a first track 232 disposed within the rail 218. The first track 232 defines a path which is generally a straight line parallel to the x-direction (see axes in FIG. 9D). Using the handle 428 (see FIG. 9A), the pellicle assembly gripper 400 may be manually moved along the first track 232 in the rail 218. The locking block 432 may be used to lock and unlock a position of the pellicle assembly gripper 400 relative to the first track 232 in the rail 218. When the locking block 432 is not being operated, the pin 224 protrudes from the housing 222 and engages with the rail 218 such that a position of the pellicle assembly gripper 400 along a path defined by the first track 232 is fixed. Pulling on the pin handle 226 retracts the pin 224 at least partially into the housing 222, the pin 224 no longer engages with the rail 218, and the pellicle assembly gripper 400 may be moved along a path defined by the first track 232 using the handle 428.

The locking block 532 is equivalent to the locking block 432. A housing of the locking block 532 is fixed to the second intermediate member 526 and to the damper assembly 202 using a plurality of fastening bolts in an equivalent setup to the locking block 432, the first intermediate member 426, and the damper assembly 201 described above. A wheel of the locking block 532 is dimensioned such that said wheel fits within a second track 234 disposed within the rail 218, shown in FIG. 9D. The second track 234 defines a path, part of which is generally a straight line parallel to the x-direction, and part of which has a component in the z-direction (see axes in FIG. 9D) such that the second track 234 is partially disposed below the first track 232. Using the handle 528 (see FIG. 9A), the patterning device gripper 500 may be manually moved along the second track 234 in the rail 218. The locking block 532 provides a mechanism for locking and unlocking a position of the patterning device gripper 500 relative to the second track 234 in the rail 218, similar to the locking block 432 described above.

Locking blocks 432, 532 are operable to lock a position of the grippers 400, 500. This may be useful when using the grippers 400, 500 to provide a pellicle assembly 16 and a patterning device MA to the intermediate support structure 98 of the pellicle frame attachment apparatus 857 (see FIG. 6), as is described in more detail below. Further, moving either the pellicle assembly gripper 400 along the first track 232 or moving the patterning device gripper 500 along the second track 234 generally requires the use of two hands (one holding a handle 428, 528 and one operating a pin handle 226). This may prevent accidental operation of a vertical control knob 430, 530 during movement of a gripper 400, 500 relative to a track 232, 234. This may be described as a safety mechanism.

The pellicle assembly gripper 400 is operable to grip a pellicle assembly 16. The pellicle assembly gripper 400 and/or the pellicle assembly 16 may be maneuvered such that the first arm 402a and the second arm 402b surround a pellicle assembly 16 when the pellicle assembly gripper 400 is in an open configuration. The arms 402a, 402b of the pellicle assembly gripper 400 may then be moved, using the pellicle assembly gripper control knobs 424, such that the pellicle assembly gripper 400 is in a closed configuration. The pellicle assembly 16 may be gripped by this action. The plurality of pellicle assembly aligners 406 ensure that the pellicle assembly 16 is in a desired position. The plurality of pellicle assembly support pads 408 support the pellicle assembly 16. In particular, the pellicle assembly 16 is provided to the pellicle assembly gripper 400 and protrusions 420 of the support pads 408 are arranged so as to contact a side of the pellicle frame 17 which does not face a patterning device MA. The pellicle assembly aligners 406 and the pellicle assembly support pads 408 (and no other component) make direct contact with the pellicle frame 17 of the pellicle assembly 16. Therefore, only a small proportion of a perimeter of the pellicle frame 17 is contacted using the pellicle assembly gripper 400. Advantageously, this may reduce the risk of contaminating the pellicle assembly 16 with particles compared with a gripper that makes contact with more of the perimeter of the pellicle frame 17.

The pellicle assembly gripper 400 and the control system 870 (see FIG. 6) may form part of the pellicle frame attachment apparatus 857. The pellicle assembly gripper 400 (gripping a pellicle assembly 16) and/or the control system 870 may be maneuvered such that the pellicle assembly 16 is in position above the partition 862 of the pellicle frame attachment apparatus 857. The pellicle assembly gripper 400 can then release the pellicle assembly 16 onto the intermediate support structure 98 (see FIG. 6) by switching the pellicle assembly gripper 400 into an open configuration using the pellicle assembly gripper control knobs 424.

The patterning device gripper 500 is operable to grip a patterning device MA. The patterning device gripper 500 and/or the patterning device MA may be maneuvered such that the arms 502a, 502b, 502c surround a patterning device MA when the patterning device gripper 500 is in an open configuration. The arms 502a, 502b, 502c may then be moved, using the patterning device gripper control knob 524, such that the patterning device gripper 500 is in a closed configuration. The patterning device MA may be gripped by this action. The plurality of patterning device aligners 506 ensure that the patterning device MA is in a desired position. The plurality of patterning device support fingers 508 support the patterning device MA. The patterning device aligners 506 and the patterning device support fingers 508 (and no other component) make direct contact with the patterning device MA. Therefore, only a small proportion of the patterning device MA is contacted using the patterning device gripper 500. Advantageously, this may reduce the risk of contaminating the patterning device MA with particles compared with a gripper that makes contact with more of the patterning device MA.

The patterning device gripper 500 and the control system 870 (see FIG. 6) may form part of the pellicle frame attachment apparatus 857. The patterning device gripper 500 (gripping a patterning device MA) and/or the control system 870 may be maneuvered such that the patterning device MA is in position above the partition 862 of the pellicle frame attachment apparatus 857. The patterning device gripper 500 can then release the patterning device MA onto the intermediate support structure 98 of the pellicle frame attachment apparatus 857 such that the patterning device MA is disposed above the pellicle assembly 16 which has already been placed onto the intermediate support structure 98, as described above. The patterning device gripper 500 can release the patterning device MA by switching the patterning device gripper 500 into an open configuration using the patterning device gripper control knob 524.

The patterning device MA may be damaged by, for example, dropping the patterning device MA. The patterning device MA may be damaged by, for example, dropping the patterning device MA into the generally rectangular space 514 of the patterning device gripper 500. Movement of the patterning device gripper 500 parallel to the z-axis is damped as a result of the second intermediate member 526 being attached to the rail 218 via the damper assembly 202. The damper assembly 202 can therefore reduce an impact force of a patterning device MA being dropped into the generally rectangular space 514 of the patterning device gripper 500. Advantageously, this can reduce damage to the patterning device MA.

Maneuvering the pellicle assembly gripper 400, as described above, may involve moving the pellicle assembly gripper 400 relative to the first track 232 of the rail 218. This may be performed manually. The handle 428 may be used for manual movement of the pellicle assembly gripper 400. Maneuvering the patterning device gripper 500, as described above, may involve moving the patterning device gripper 500 relative to the second track 234 of the rail 218. This may be performed manually. The handle 528 may be used for manual movement of the patterning device gripper 500. The rail 218 may form part of the pellicle frame attachment apparatus 857.

It will be appreciated that, in an alternative arrangement to the arrangement 200 shown in FIG. 9A, either or both of the first intermediate member 426 and the second intermediate member 526 may be directly movably attached to the rail 218 (i.e., without the damper assemblies 201, 202 being provided). As a further alternative, the pellicle assembly gripper 400 and the patterning device gripper 500 may be movably attached (with or without damper assemblies 201, 202) to separate rails. These separate rails may form part of a pellicle frame attachment apparatus. Movably attaching the pellicle assembly gripper 400 and the patterning device gripper 500 to a common rail 218 (as shown in the arrangement 200 of FIG. 9A) may allow for more accurate relative positioning of the pellicle assembly 16 and the patterning device MA.

The pellicle assembly gripper 400 and the patterning device gripper 500 have been described above in the context of the pellicle frame attachment apparatus 857. It will be appreciated that the pellicle assembly gripper 400 and the patterning device gripper 500 are operable to manipulate, respectively, a pellicle assembly 16 and a patterning device MA for other applications. For example, the pellicle assembly gripper 400 may be used to handle a pellicle assembly 16 in the pellicle attachment apparatus 855 (see FIG. 2). As a further example, the patterning device gripper 500 may be used to handle a patterning device MA in the stud attachment apparatus 840 (see FIG. 2). Advantages of the pellicle assembly gripper 400 and the patterning device gripper 500, described above, will generally apply when the pellicle assembly gripper 400 and the patterning device gripper 500 are used in other applications.

Referring back to FIG. 6, the pellicle frame attachment apparatus 857 includes actuators 111 which may be used to adjust the position of the pellicle assembly 16 in the x, y and z-directions and to rotate the pellicle assembly about the z-direction.

The partition 862 is provided with four windows 893, 894. The windows 893, 894 may for example be formed from quartz. Two of the windows 893 are positioned to allow the imaging sensors 106 to view alignment marks provided on the patterning device MA. Note that only one of the two windows 893 and only one of the two imaging sensors 106 is visible in FIG. 6. The other two windows 894 are positioned to allow the imaging sensors 105 to view the pellicle frame 17 (e.g., to view corners of the pellicle frame).

Figure 10:
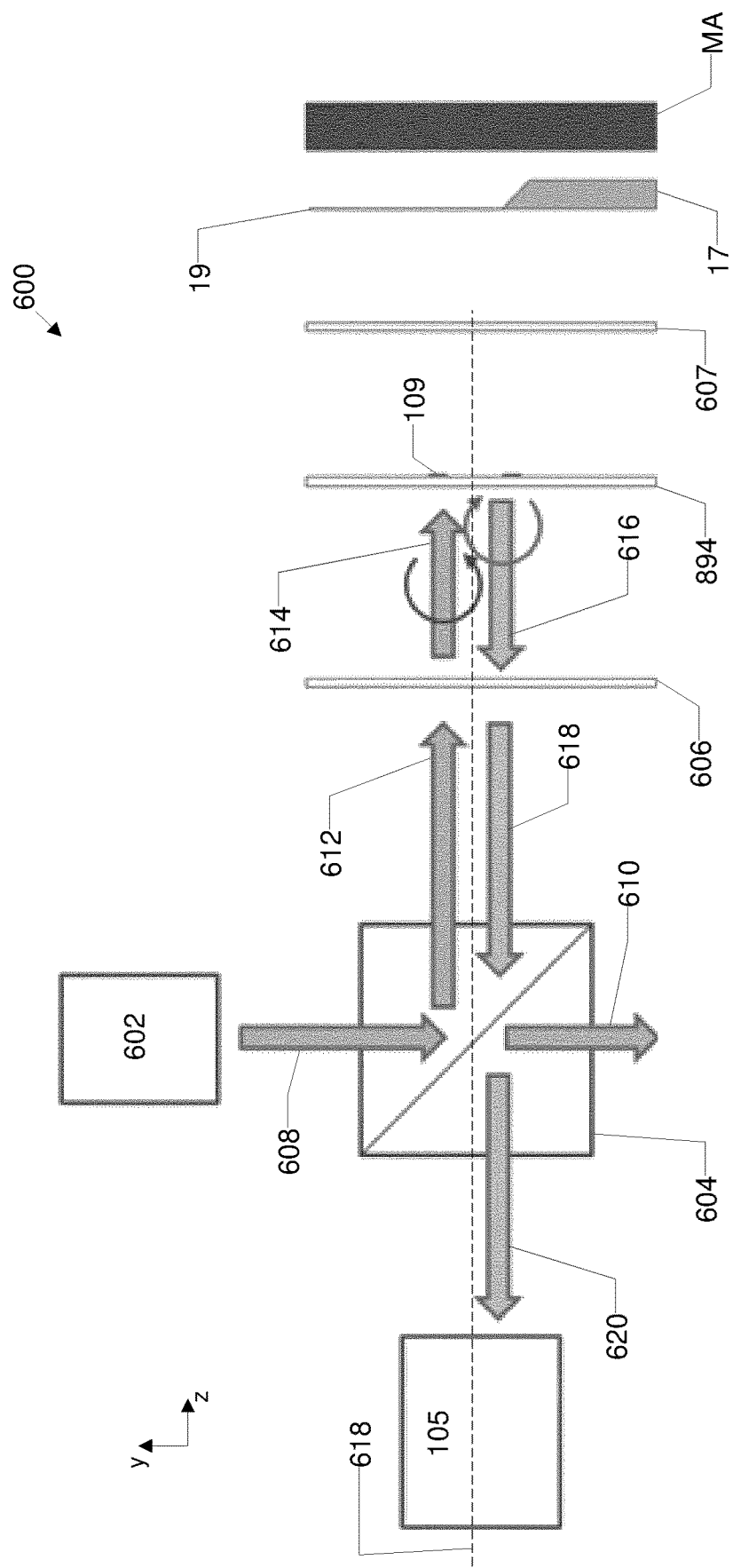
FIG. 10 shows an optical system according to an embodiment of the invention.

FIG. 10 shows in more detail an arrangement 600 for measuring the position of the pellicle assembly 16 using imaging sensors 105. The arrangement 600 of apparatus shown in FIG. 10 may form part of the pellicle frame attachment apparatus 857 shown in FIG. 6. The arrangement 600 of apparatus shown in FIG. 10 shows components which are not shown in FIG. 6. These components may form part of the pellicle frame attachment apparatus 857 but are not shown in FIG. 6, for clarity. Note that apparatus in FIG. 10 has an orientation which is perpendicular to apparatus in FIG. 6.

The arrangement 600 comprises: an imaging sensor 105; a radiation source 602; a beam splitter 604; a quarter-wave plate 606; a window 894 comprising alignment marks 109; a protective window 607; a pellicle 19 having a pellicle frame 17; and a patterning device MA. The imaging sensor 105 may comprise an array of sensor elements and may, for example, be a camera. The radiation source 602 may be a light-emitting diode (LED). The windows 894, 607 may be generally transparent. The protective window 607 may protect the alignment marks 109 from particulate contamination or other debris.

In FIG. 10, the imaging sensor 105, window 894, protective window 607, pellicle 19, and patterning device MA are disposed in the same manner as shown in FIG. 6. The beam splitter 604 is disposed between the imaging sensor 105 and the window 894. The quarter-wave plate 606 is disposed between the beam splitter 604 and the window 894. The imaging sensor 105, beam splitter 604, quarter-wave plate 606, window 894 and protective window 607 may be described as being aligned such that they all lie on an axis 618 and are spaced apart in the direction of the axis 618. This axis 618 is the z-axis. The radiation source 602 is disposed proximate to the beam splitter 604. The radiation source 602 is disposed such that the radiation source 602 and the beam splitter 604 are separated in a direction which is perpendicular to the axis 608 (such as the y-axis).

The arrangement 600 may be referred to as an optical measurement system. The optical measurement system exemplified in FIG. 10 is operable to measure a position of a pellicle frame 17 with respect to the alignment marks 109. The optical measurement system may provide measurements of position of a pellicle frame 17 with an accuracy of 5 um or better. The optical measurement system may be based on a telecentric optical system.

In use, the radiation source 602 emits an unpolarised light beam 608 in a direction perpendicular to the axis 618. The unpolarised light beam 608 is incident on the beam splitter 604. The beam splitter 604 splits the unpolarised light beam 608 into two linearly polarised beams 610, 612 which propagate in mutually perpendicular directions. A first beam 610 is p-polarised. That is, the first beam 610 is linearly polarised, the polarisation direction being perpendicular to the plane of incidence (i.e., out of the plane of FIG. 10). The first beam 610 propagates in the same direction as unpolarised light beam 608 emitted by the radiation source 602. A second beam 612 is s-polarised. That is, the second beam 612 is linearly polarised, the polarisation direction being parallel to the plane of incidence (i.e., in the plane of FIG. 10). The second beam 612 propagates parallel to the axis 618, towards the quarter-wave plate 606.

The quarter-wave plate 606 is arranged such that the axes of the quarter-wave plate 606 are aligned at 45° relative to the direction of linear polarisation of the second beam 612. The second beam 612, having propagated through the quarter-wave plate 606, becomes a circularly polarised beam 614. The circularly polarised beam 614 can be at least partially transmitted through the window 894, the protective window 607, the pellicle 19, and/or the pellicle frame 17. The circularly polarised beam 614 can be at least partially reflected from the alignment marks 109, the pellicle 19, the pellicle frame 17, and/or the patterning device MA. The circularly polarised beam 614, having been reflected, becomes a reflected circularly polarised beam 616 with a circular polarisation of opposite direction to the direction of circular polarisation of the circularly polarised beam 614. The reflected circularly polarised beam 616 propagates towards the quarter-wave plate 606.

The reflected circularly polarised beam 616, having propagated through the quarter-wave plate 606, becomes a linearly polarised beam 618. The direction of linear polarisation of the linearly polarised beam 618 is rotated by 90° relative to the direction of linear polarisation of the second beam 612. Specifically, the second beam 612 is s-polarised (having a polarisation direction in the plane of FIG. 10) and the linearly polarised beam 618 is p-polarised (having a polarisation direction out of the plane of FIG. 10). The linearly polarised beam 618 propagates through the beam splitter 604. As a result of the p-polarisation of the linearly polarised beam 618, the linearly polarised beam 618 is not split by the beam splitter 604. Rather, the linearly polarised beam 618 is transmitted through the beam splitter 604 as a transmitted beam 620. The transmitted beam 620 is then incident on the imaging sensor 105.

The pellicle 19 may be more transmissive for radiation from the circularly polarised beam 614 than the pellicle frame 17 (which may block substantially all of the radiation). At least a portion of the circularly polarised beam 614 is incident on and reflected by the patterning device MA. An edge of the pellicle frame 17 may obstruct light which is reflected from the patterning device MA. At least part of the radiation reflected by the patterning device MA is incident on the imaging sensor 105 (as the transmitted beam 620) and may have a measured spatial intensity (such as a measured image) at the imaging sensor 105 that varies depending on a position of an edge of the pellicle frame 17. In particular, a difference in level of transmission of light through the pellicle 19 and the pellicle frame 17 may give spatial contrast in intensity measurements. This spatial contrast may be particularly useful for measuring a position of, and subsequently aligning, the pellicle assembly 16. For example, a position of the pellicle assembly 16 relative to the alignment marks 109, which are also imaged by the imaging sensor 105, may be measured.

The quarter-wave plate 606 effects a phase shift (between the two orthogonal components of the electric field strength) in the light reflected from the patterning device MA (such as the reflected circularly polarised beam 616) as the light propagates through the quarter-wave plate 606. This phase shift is such that light reflected from the patterning device MA is maximally transmitted through the beam splitter 604. Maximal transmission of light through the beam splitter 604 can result in a high signal in intensity measurements performed by the imaging sensor 105. For example, it may be that the measurement made by the imaging sensor 105 is subject to background light, which may reduce the contrast in the image that represents the edge of the pellicle 19 and pellicle frame 17. However, such background radiation may be unpolarised and therefore only a fraction (for example half) of such background radiation may reach the imaging sensor. In contrast, the signal radiation (i.e. the portion of transmitted beam 620 which reflected from the patterning device MA) is maximally transmitted through the beam splitter 604. Advantageously, maximal transmission of this signal light through the beam splitter 604, enabled by the arrangement 600 shown in FIG. 10, can result in high spatial contrast in measurements performed by the imaging sensor. This can result in high accuracy of measurements of position of the pellicle assembly 16.

Figure 11:
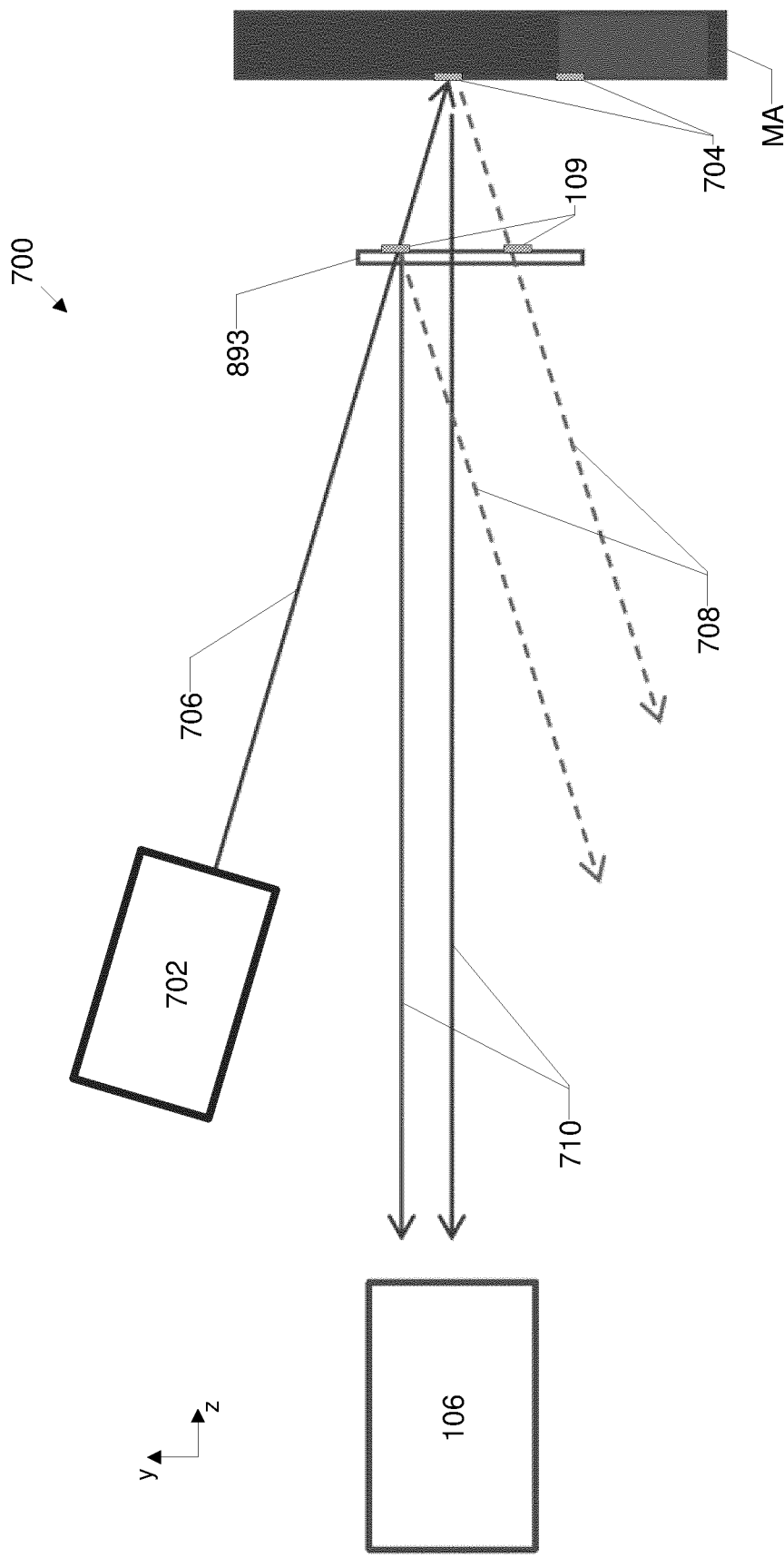
FIG. 11 shows an optical system according to a further embodiment of the invention.

FIG. 11 shows in more detail an arrangement 700 for measuring the position of the patterning device MA using imaging sensors 106. The arrangement 700 of apparatus shown in FIG. 11 may form part of the pellicle frame attachment apparatus 857 shown in FIG. 6. The arrangement 700 of apparatus shown in FIG. 11 shows components which are not shown in FIG. 6. These components may form part of the pellicle frame attachment apparatus 857 but are not shown in FIG. 6, for clarity. Note that apparatus in FIG. 11 has an orientation which is perpendicular to apparatus in FIG. 6.

The arrangement 700 comprises: an imaging sensor 106; a radiation source 702; a window 893 comprising alignment marks 109; and a patterning device MA comprising alignment marks 704. The imaging sensor 106 may comprise an array of sensor elements and may, for example, be a camera. The radiation source 702 may be an LED. The alignment marks 109 are arranged on the window 893 such that the alignment marks 109 constitute a diffraction grating. The alignment marks 704 are arranged on the patterning device MA such that the alignment marks 704 constitute a diffraction grating.

In FIG. 11, the imaging sensor 106, window 893, and patterning device MA are disposed in the same manner as shown in FIG. 6. The radiation source 702 is disposed such that the radiation source 702 does not obstruct an optical path between the imaging sensor 106 and the window 893. The radiation source 702 may be disposed proximate to the imaging sensor 106.

The arrangement 700 may be referred to as an optical measurement system. The optical measurement system exemplified in FIG. 11 is operable to measure a position of a patterning device MA with respect to the alignment marks 109.

In use, the radiation source 702 emits a light beam 706. The beam 706 propagates towards the window 893. A portion of the beam 706 may be backscattered (e.g., reflected) from the alignment marks 109. Another portion of the beam 706 may be transmitted through the window 893 and subsequently be backscattered (e.g., reflected) from the alignment marks 704. As a result of the alignment marks 109, 704 being arranged so as to form reflective diffraction gratings, the portion of the beam 704 which is backscattered from the alignment marks 109, 704 forms a plurality of diffracted orders. FIG. 11 shows beams 708 corresponding to a zero-order reflection of the beam 706 from an alignment mark 109 disposed on the window 893 and from an alignment mark 704 disposed on the patterning device MA. FIG. 11 also shows beams 710 corresponding to a first-order (reflected) diffraction order of the beam 706 from an alignment mark 109 disposed on the window 893 and from an alignment mark 704 disposed on the patterning device MA. The first-order beams 710 are incident on the imaging sensor 106. The imaging sensor 106 is hence operable to measure a signal which corresponds to a position of the patterning device MA. The zero-order beams 708 (corresponding to standard reflection) are not incident on the imaging sensor 106.

The angles at which the beam 706 is backscattered from the alignment marks 109, 704 are dependent on an angle of incidence between the beam 706 and the alignment marks 109, 704. Said angles are also dependent on a wavelength of the beam 706. Said angles also vary with the pitch of the alignment marks 109, 704. In the arrangement 700 shown in FIG. 11, the angle of incidence, wavelength of light, and the pitches of the alignment marks 109, 704 may be selected such that a first-order beam 710 is normal to the plane of the patterning device MA. Equivalently, a first-order beam may be configured to be normal to the plane of the pellicle 19.

It may be desirable to measure a position of a patterning device MA in a stud attachment apparatus 840 and/or a pellicle frame attachment apparatus 857 (see, for example, FIG. 2). It may also be desirable to measure a position of a patterning device MA when the patterning device MA is used in other situations (such as in a lithographic apparatus LA). Alignment marks 704 may be provided on a patterning device MA so as to enable measurement of a position of a patterning device MA when the patterning device MA is used in other situations (such as in a lithographic apparatus LA).

The arrangement 700 shown in FIG. 11 is operable to measure the position of the alignment marks 109 (which are fixed with respect to the pellicle frame attachment apparatus 857) and the alignment marks 704 (which are fixed with respect to patterning device MA). The arrangement 700 shown in FIG. 11 is hence operable to measure the position of the patterning device MA relative to the pellicle frame attachment apparatus 857. This may be used to align the patterning device MA relative to the pellicle frame attachment apparatus 857. Advantageously, measuring the position of alignment marks 109 and alignment marks 704 is based on measuring diffracted orders of light (as described above) and is performed using the same measurement apparatus (the arrangement 700). This may result in accurate measurements of position of the patterning device MA. This may result in measurements of position of the patterning device MA that are more accurate than if the position of the patterning device MA were based on measuring the position of an edge of the patterning device MA.

The arrangements 600, 700 have been described above in the context of the pellicle frame attachment apparatus 857. It will be appreciated that the arrangements 600, 700 may be used for other applications. For example, the arrangement 600 may be used to measure a position of a pellicle assembly 16 in the pellicle attachment apparatus 855 (see FIG. 2). As a further example, the arrangement 700 may be used to measure a position of a patterning device MA in the stud attachment apparatus 840 (see FIG. 2). Advantages of the arrangements 600, 700, described above, will generally apply when the arrangements 600, 700 are used in other applications.

Alignment marks 109, 704 may be provided with stickers. The stickers may be formed from anodised aluminium. The stickers may be black in colour. The stickers may have a generally circular shape. The stickers may comprise an aperture. The stickers may increase an effective size of alignment marks 109, 704. The stickers may reduce interference between light that is reflected from the alignment marks 109, 704 and any other light. Provision of the stickers may increase contrast of images acquired using imaging sensors 105, 106. Particularly, provision of the stickers may increase visibility of alignment marks 109, 704 against a light background. Provision of the stickers may limit dispersion of light that is reflected from the alignment marks 109, 704. Alignment marks 109, 704, as measured by imaging sensors 105, 106, may therefore appear sharper. This may increase accuracy of measurements of position that are based on measuring the position of the alignment marks 109, 704.

Figure 12:
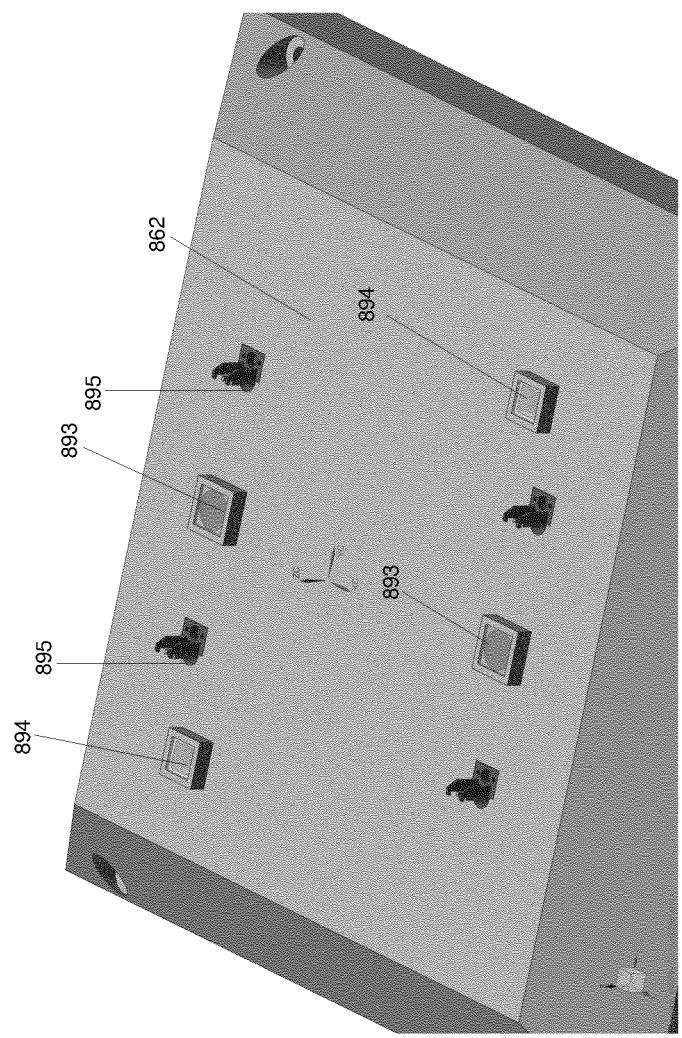
FIG. 12 is a perspective view of part of the pellicle frame attachment apparatus.
Figure 13:
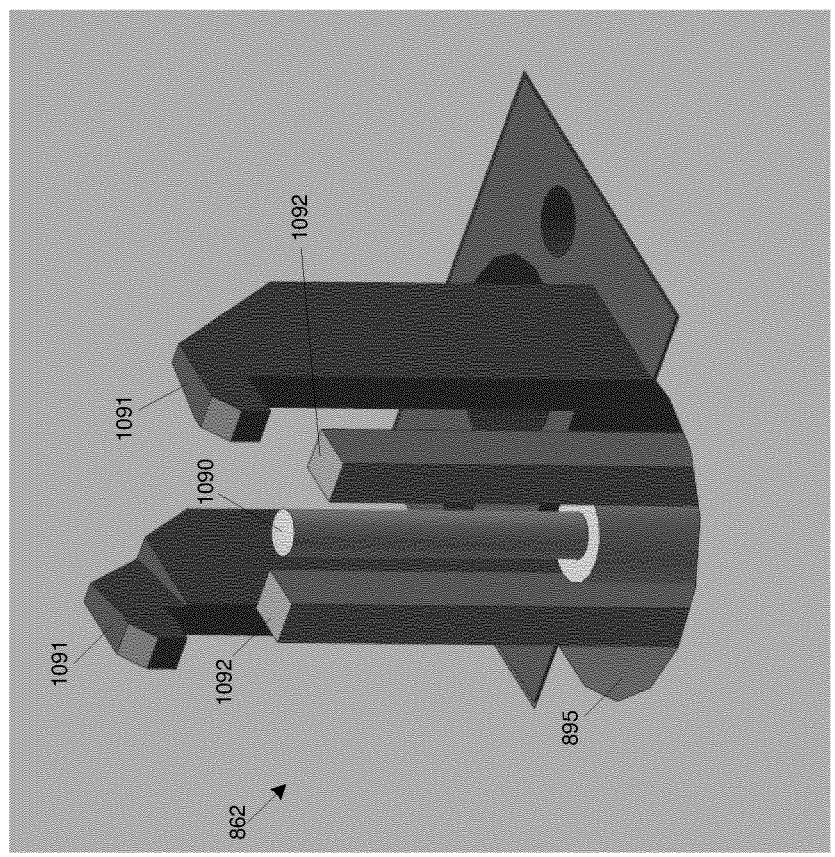
FIG. 13 shows part of pellicle frame attachment apparatus in greater detail.

Advantages of providing the stickers may be beneficial when measuring a position of the pellicle assembly 16 using the arrangement 600 shown in FIG. 12 and/or when measuring a position of the patterning device MA using the arrangement 700 shown in FIG. 13. Alternatively, a coating may be provided to alignment marks 109, 704 which achieves the same advantages as the stickers.

Imaging sensors 105, 106 shown in FIGS. 10 and 11 may correspond to imaging sensors 105, 106 shown in FIG. 6.

Alignment of two entities using alignment marks is well-known in the art and is not described further here. The actuators 111 and the arrangements 600, 700 may collectively be referred to as a control system 870.

Figure 14:
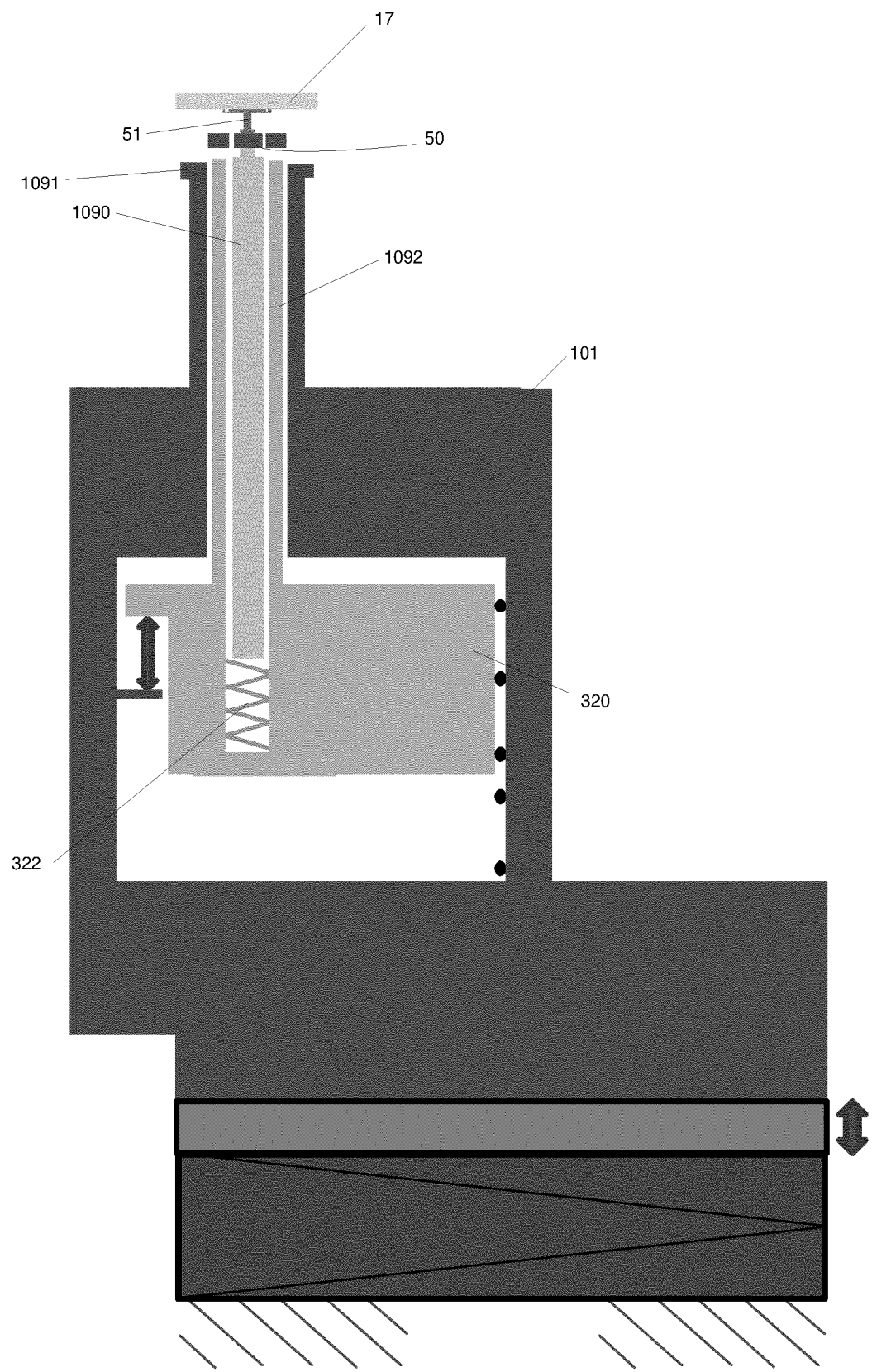
FIG. 14 schematically depicts an interrelationship between different parts of the pellicle frame attachment apparatus.

FIG. 12 depicts the partition 862 in more detail. A gas outlet (not depicted) may be configured to supply gas on the side of the partition 862 visible in FIG. 12. The gas may be delivered at a pressure which is higher than a gas pressure on an opposite side of the partition 862. The partition 862 is further provided with holes 895, the holes being positioned to correspond with the positions of engagement mechanisms 50 of the pellicle assembly 16. One of the holes 895 is depicted in more detail in FIG. 13. The hole 895 is dimensioned to allow a pin 1090 and manipulator pins 1092 to project through the hole. Hooked members 1091 project from sides of the hole. In other words, the hooked members 1091 are fixed to the partition 862 and project from the partition. The pin 1090, hooked members 1091 and manipulator pins 1092 are also depicted in FIGS. 6, 12 and 14.

As noted further above, the controlled environment 859 above the partition 862 may be held at a pressure higher than the pressure beneath the partition (e.g. by delivering gas above the partition). As will be appreciated from FIG. 12, the openings 895 in the partition 862 are relatively small, thus limiting the likelihood of contamination passing through the openings into the controlled environment. This likelihood is further reduced by the higher pressure of the controlled environment 859 with respect to the environment in the feed partition 862. The higher pressure ensures that air flows downwards through the holes 895, thereby carrying contamination away from the pellicle 19.

When securing the pellicle assembly 16 to the patterning device MA, the imaging sensors 105, 106 are used to monitor the positions of the pellicle assembly 16 relative to the patterning device MA. This occurs after the pellicle assembly 16 has been lifted from the intermediate support structure 98 by pins 1090. The position of the pellicle assembly 16 is adjusted using the actuators 111. This moves the support structure 101 and thus moves the pellicle assembly 16 relative to the patterning device MA. Operation of the actuators 111 may be manual, or may be controlled by an automated controller. The movement of the support structure 101 may continue until the pellicle assembly 16 is aligned relative to the patterning device MA.

Once the pellicle assembly 16 has been correctly positioned relative to the patterning device MA, the pins 1090, hooked members 1091 and manipulator pins 1092 are used to engage the engagement mechanisms 50 to the studs 51 which project from the patterning device MA.

The manner in which the pins 1090, hooked members 1091 and manipulator pins 1092 are capable of moving relative to each other is schematically illustrated in FIG. 14. As mentioned above, the hooked members 1091 extend from the support structure 101 and thus are not capable of movement relative to the support structure. The support structure itself 101 may be moved, as explained above, including movement in a generally vertical direction (z-direction). The manipulator pins 1092 are moveable in a generally vertical direction (z-direction) by an actuator 320. The manipulator pins 1092 are both fixed to the actuator 320 and thus both move together. The pin 1090 which supports the pellicle frame 17 is not actively moveable relative to the manipulator pins 1092. The pin 1090 is connected via a spring 322 to the actuator 320. As a result, upward and downward movement of the actuator 320 will cause corresponding movement of the pin 1090 unless the pin is in contact with the pellicle frame 17. If the pin 1090 is in contact with the pellicle frame 17 then further upward movement of the actuator 320 will not cause further upward movement of the pin but will instead cause compression of the spring 322. Once the spring 322 has been compressed, downward movement of the actuator 320 will not cause downward movement of the pin 1090 until the spring 322 has expanded to a relaxed configuration.

Each manipulator pin 1092 comprises a curved surface (for example, a generally convex curved surface) at an end of a generally cylindrical body section. Said curved surface is at an end of the manipulator pin 1092 which makes contact with a portion of the engagement mechanism 50 when the pins 1090, the hooked members 1091 and the manipulator pins 1092 are used to engage the engagement mechanisms 50 to the studs 51 which project from the patterning device MA. This process is explained further below with reference to FIG. 17D. The curved surface is shaped such that slippage between the manipulator pin 1092 and said portion of the engagement mechanism 50 is minimised.

Figure 15:
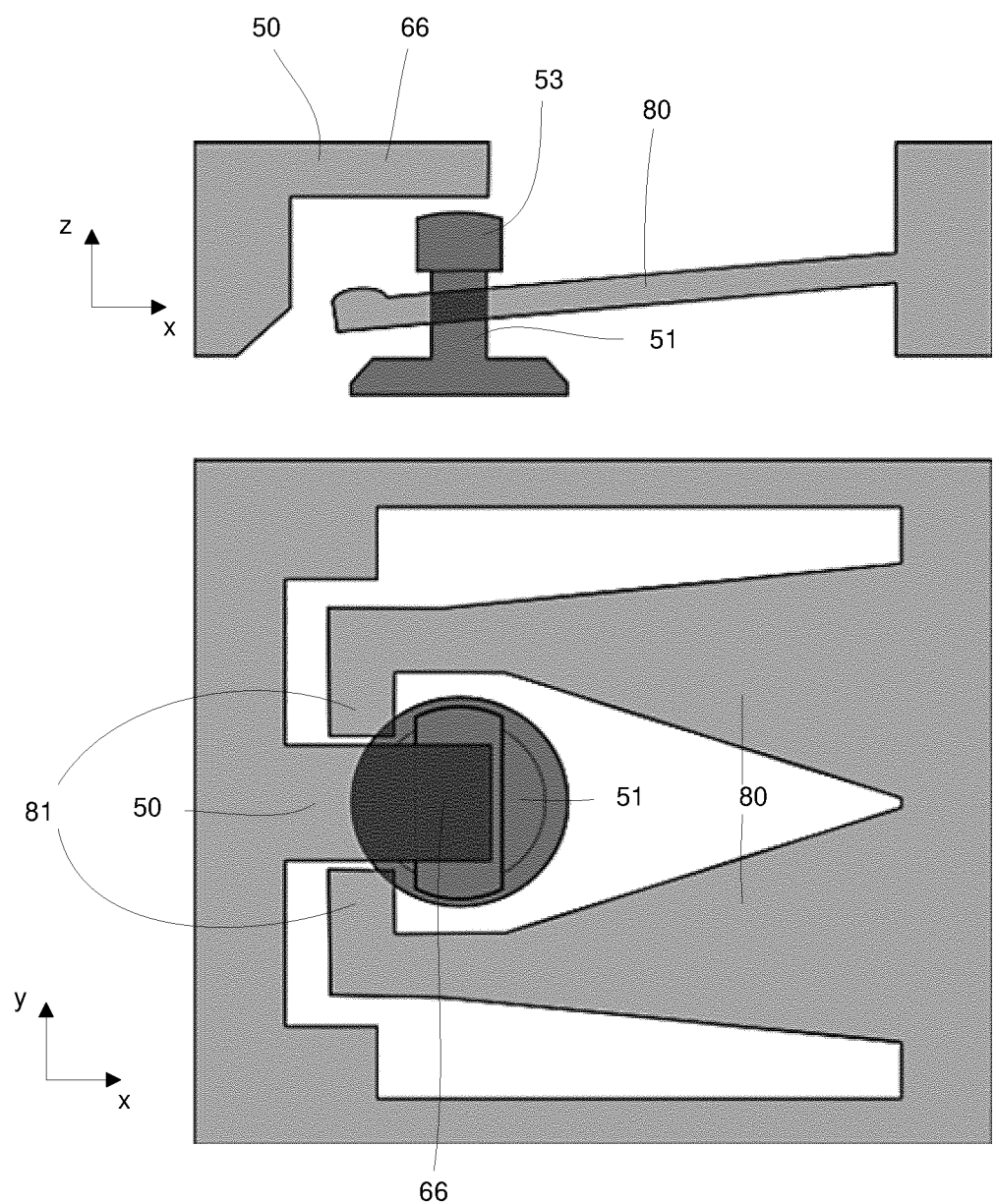
FIGS. 15 and 16 schematically depict operation of an engagement mechanism by the pellicle frame attachment apparatus.
Figure 16:
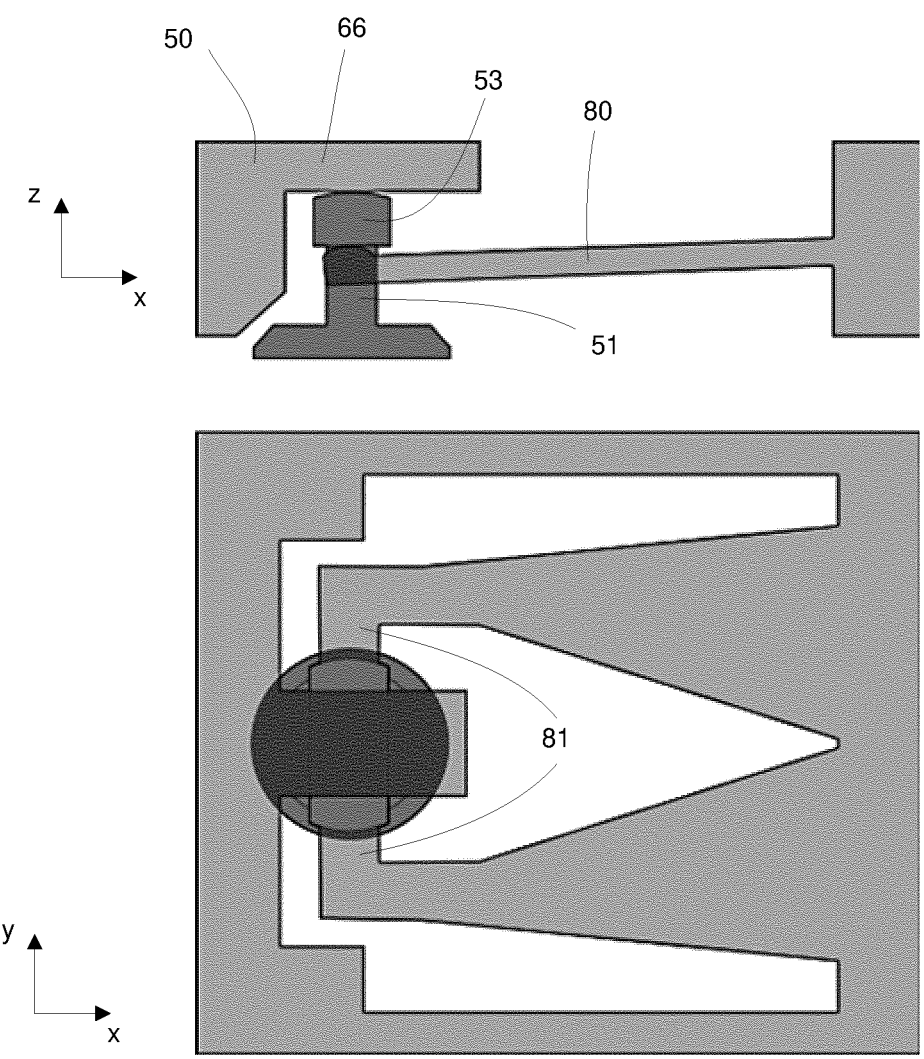

FIGS. 15 and 16 schematically depict the manner in which the engagement mechanism 50 is brought into engagement with the protrusion 51 (which may also be referred to as a stud). FIGS. 15 and 16 show the engagement mechanism 50 and protrusion 51 in cross-section viewed from one side and also viewed from below. Referring first to FIG. 15, the engagement arms 80 are pushed away from the cap 66 using manipulator pins 1092 (not depicted) which push against distal ends of the engagement arms 80. As may be seen from FIG. 15, there is no contact between the engagement mechanism 50 and the protrusion 51 at this point.

The engagement mechanism is moved in the x-direction until the distal head 53 of the protrusion 51 is located above the engagement tabs 81 which project from the engagement arms 80. This movement is achieved by moving the pellicle frame 17 to which the engagement mechanism 50 is fixed and thus moves all engagement mechanisms 50 in unison.

Once the engagement mechanism 50 is in position the manipulator pins which were pushing the engagement arms 80 away from the distal head 53 of the protrusion 51 are removed. Since the engagement arms 80 are resilient they move downwards and push against an inner surface of the distal head 53. The engagement tabs 81 thus press the distal head 53 against the cap 66, thereby securing the engagement mechanism 50 to the protrusion 51. This is depicted in FIG. 16.

It may be desired to remove the pellicle assembly 16 from the patterning device MA (e.g. if contamination has been detected on the pellicle). This removal may be performed by the pellicle frame attachment apparatus 857. The above sequence is reversed in order to disconnect the engagement mechanism 50 from the protrusion 51.

Operation of the pins 1090, hooked members 1091 and manipulator pins 1092 may be manual, automated, or semi-automated.

The pins 1090, hooked members 1091 and manipulator pins 1092 may for example be formed from steel. Surfaces of the pins 1090, hooked members 1091 and manipulator pins 1092 which contact the engagement mechanism 50 may be provided with a coating of material such as PEEK or some other robust material. Alternatively, the contact surfaces may simply be polished surfaces of the pins 1090, hooked members 1091 and manipulator pins 1092.

Once the pellicle assembly 16 and patterning device MA have been connected together to form a mask assembly 15, the mask assembly may be placed in a mask assembly transport device 853 for transportation to a lithographic apparatus LA (see FIG. 2).

Figure 17A:
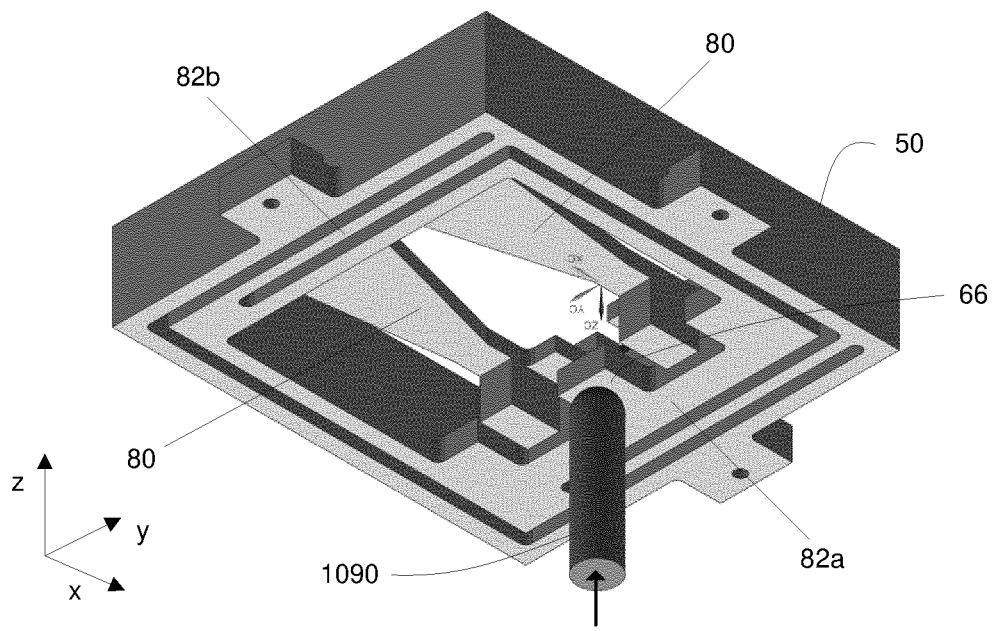
FIG. 17 depicts in more detail operation of the engagement mechanism by the pellicle frame attachment apparatus.

FIGS. 17A-H depict in more detail one manner in which the engagement mechanism 50 may be engaged with the protrusion 51. Referring first to FIG. 17A, a pin 1090 is moved in the z-direction until it touches the cap 66 of the engagement mechanism 50. The pin 1090 is moved further in the z-direction to lift up the engagement mechanism 50. Since the engagement mechanism is secured to the frame 17 (see FIG. 3) this lifts the entire pellicle assembly 16. The pin 1090 is one of four pins 1090 (see FIG. 12) and the pins 1090 are moved in unison. The pellicle assembly 16 is thus lifted by the four pins 1090 and is supported by those pins 1090. The position of the pellicle assembly 16 is then adjusted using the actuators 111 (see FIG. 6) until the pellicle assembly is aligned relative to the patterning device MA.

Figure 17B:
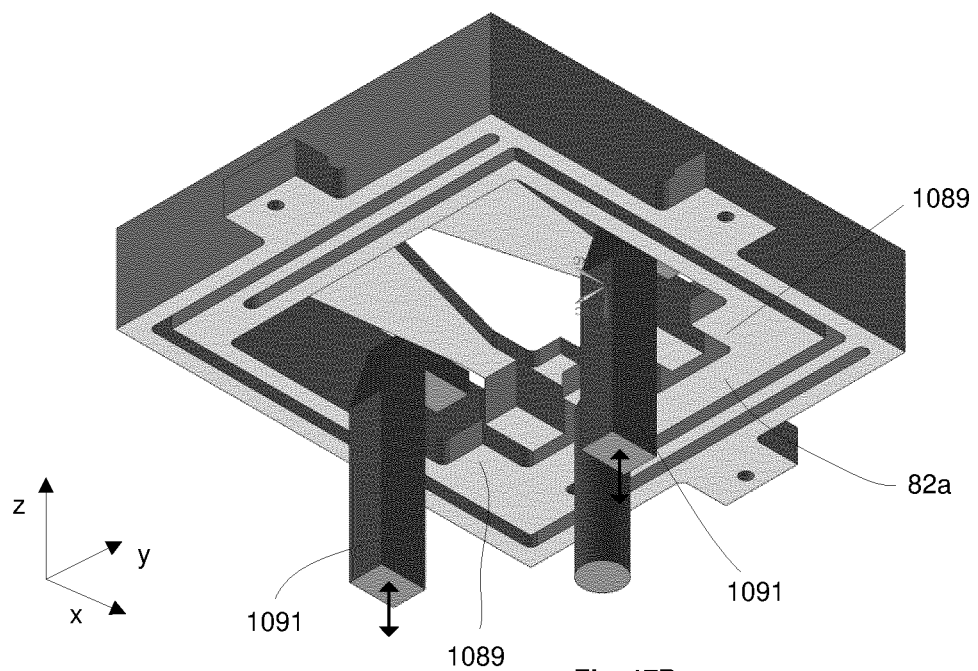

Referring to FIG. 17B, two hooked members are then moved in the z-direction until their distal ends are beyond an uppermost surface of the first support arm 82a. The hooked members 1091 are then moved in the x-direction until distal ends of the hooked members are above corner plates 1089 of the support arm 82a.

Figure 17C:
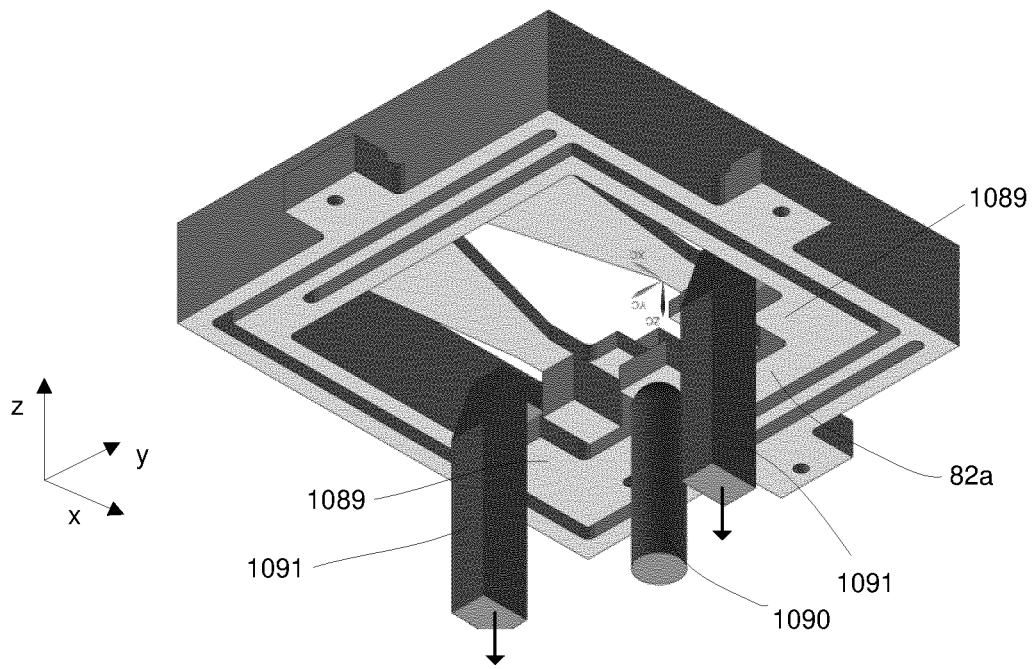

As depicted in FIG. 17C, the hooked members 1091 are then moved downwards until they come into contact with the corner plates 1089 of the support arm 82a. The pin 1090 and hooked members 1091 together grip the engagement mechanism 50 to allow subsequent operation of the engagement mechanism.

Figure 17D:
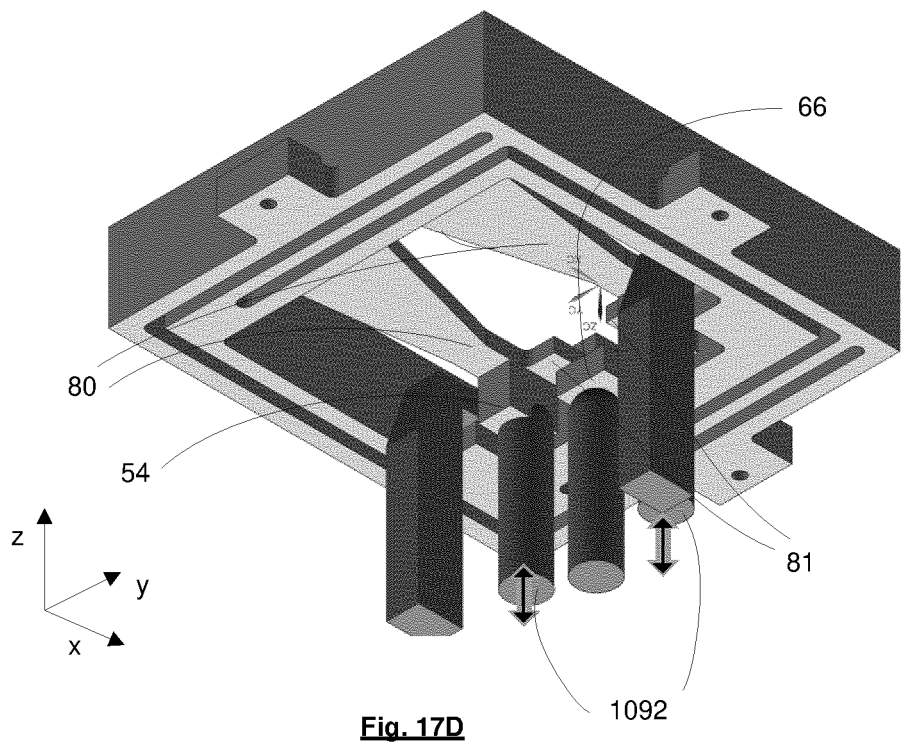

Referring to FIG. 17D, manipulator pins 1092 are moved in a generally vertical direction and push against blocks 54 provided at distal ends of the engagement arms 80. The manipulator pins 1092 push the engagement arms 80 upwards thereby enlarging a space between the engagement tabs 81 and the cap 66. As described above, a surface of each manipulator pin 1092 which makes contact with the distal ends of the engagement arms 80 (particularly the blocks 54 provided on the distal ends of the engagement arms 80) is a curved surface. Said curved surface may be a generally convex curved surface. The curved surface of manipulator pins 1092 is shaped such that, as the manipulator pins 1092 push the engagement arms 80 upwards, a contact edge between the manipulator pins 1092 and the distal ends of the engagement arms 80 smoothly shifts along the curved surface. This minimises the contact surface area between the manipulator pins 1092 and the blocks 54 provided on the distal ends of the engagement arms 80. Advantageously, such a design of manipulator pins 1092 may ensure minimal slipping between the manipulator pins 1092 and the blocks 54 provided on the distal ends of the engagement arms 80. The engagement arms 80 are not bent upwards in FIG. 17D due to the limitations of the software used to generate the Figures.

Figure 17E:
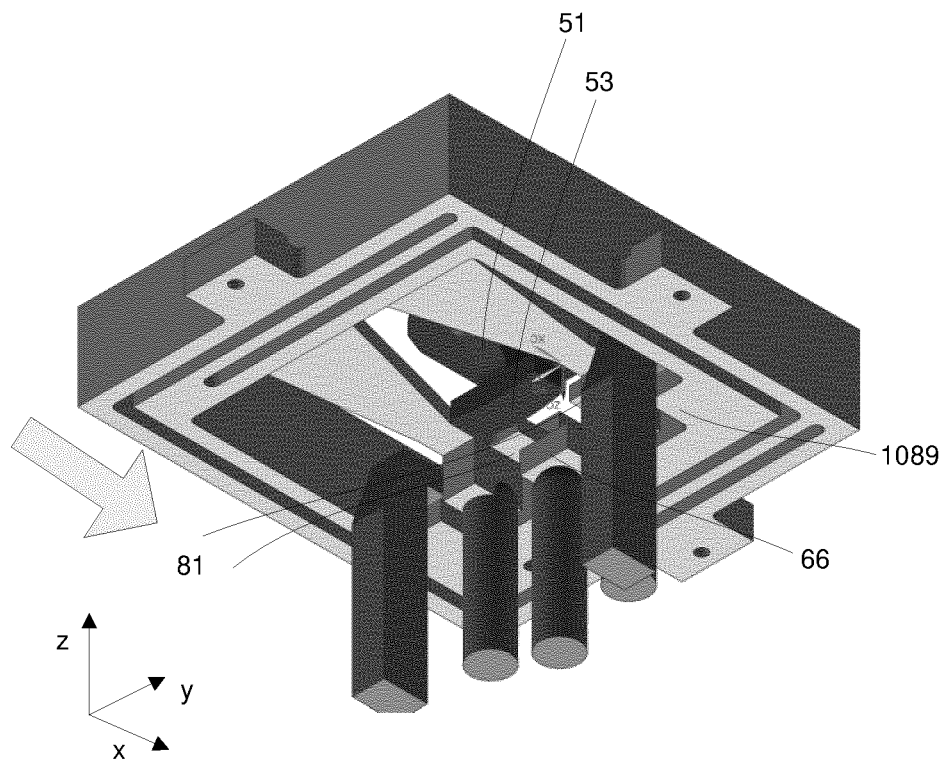
Figure 17F:
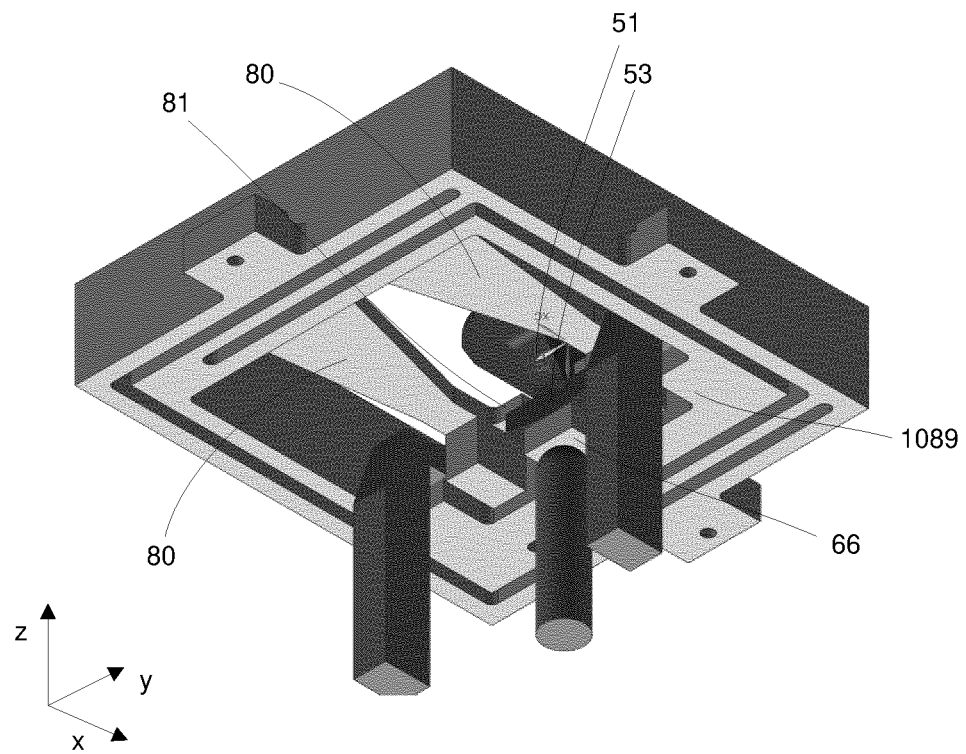

Referring to FIGS. 17E and 17F, the engagement mechanism 50 is then moved in the x-direction until the distal end 53 of the protrusion 51 is located above the cap 66 and is located beneath the engagement tabs 81.

As noted further above, all engagement mechanisms 50A-D are moved in unison via movement of the pins 1090. In an alternative arrangement the patterning device MA and protrusions 51 may all be moved instead of moving the pellicle frame 17. In general, lateral relative movement between the protrusions and the engagement mechanisms is all that is required. The direction of lateral movement will depend upon the orientation of the engagement arms 80 (and may for example be the y-direction rather than the x-direction).

Referring to FIG. 17F, once the cap 66 is positioned under the distal head 53 and the engagement tabs 81 are above the distal head 53, the manipulator pins 1092 are retracted. The resilience of the engagement arms 80 is such that they return towards their original positions and thus press the engagement tabs 81 against the distal head 53. The engagement tabs 81 push the distal head 53 against the cap 66. This secures the engagement mechanism 50 to the protrusion 51.

Figure 17G:
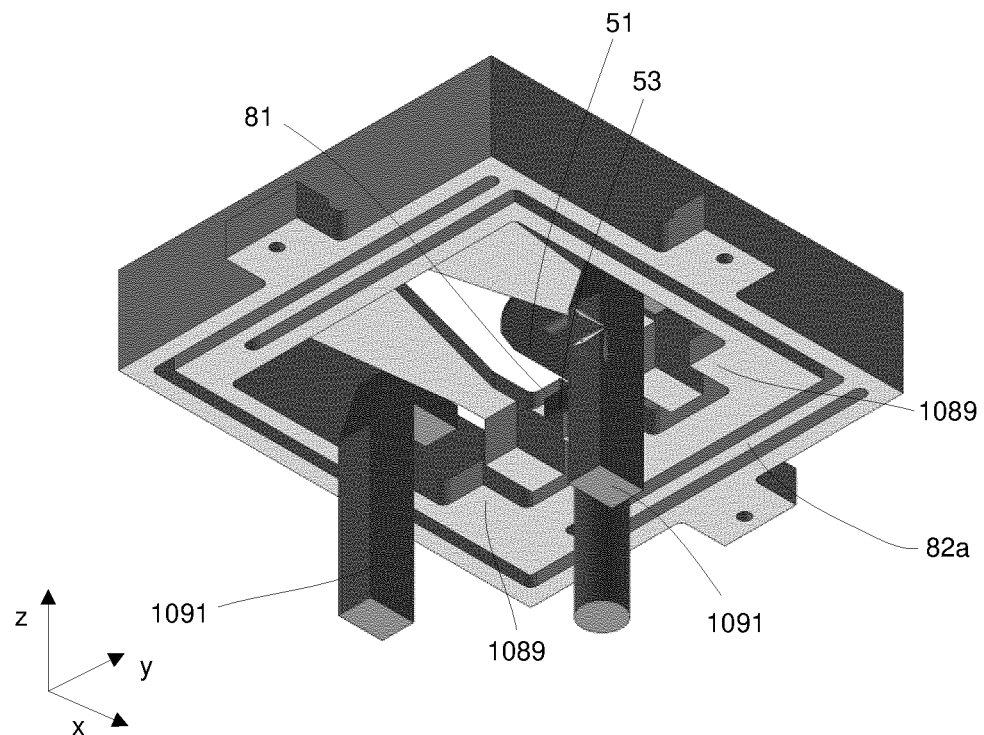

Referring to FIG. 17G, the hooked members 1091 are moved upwards (in the z-direction) and then moved sideways (in the x-direction) until the hooked members 1091 are located away from the corner plates 1089 of the support arm 82a. The hooked members 1091 are then retracted (moved in the negative z-direction).

Figure 17H:
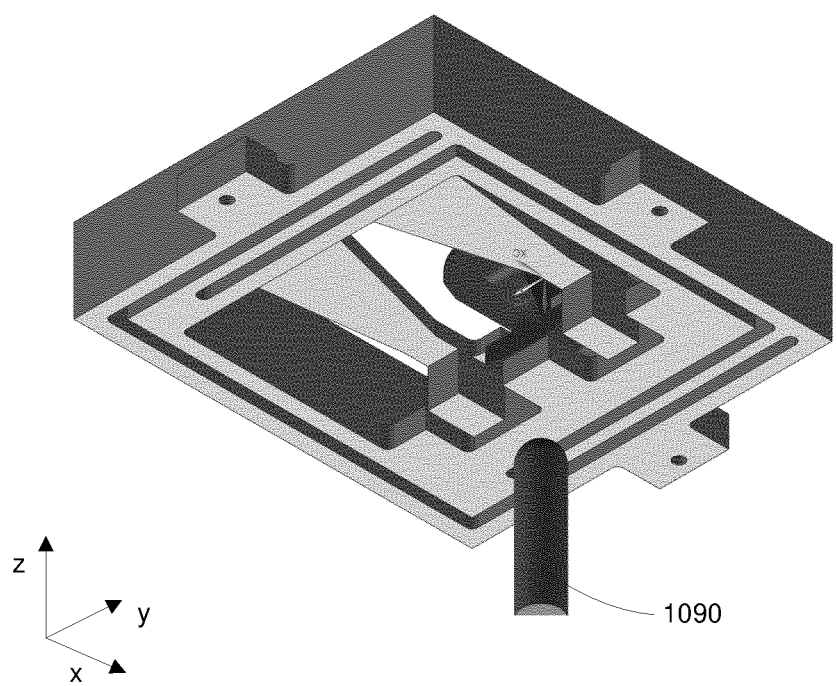

Referring to FIG. 17H, in a final step the pin 1090 is retracted. Referring to FIG. 6, when the pins 1090 are retracted the pellicle frame 17 is no longer supported by the pins 1090 but instead the pellicle frame 17 is supported by its connection to the protrusions 51 which project from the patterning device MA. In other words, the pellicle frame 17 is attached to and supported by the patterning device MA.

The engagement mechanism 50 is secured to the protrusion 51 and thus provides a secure sub-mount 10 for the pellicle frame (see FIG. 3). The pellicle frame 17 is thus securely attached to the patterning device MA. The pellicle, pellicle frame and patterning device (which may together be referred to as a mask assembly) may then be placed in a transport device 853 for transportation to a lithographic apparatus LA (see FIG. 2).

The steps depicted in FIGS. 17A-H are reversed in order to detach the engagement mechanism 50 from the protrusion 51 and thereby detach the pellicle frame 17 from the patterning device MA.

None of the steps by which the engagement mechanism 50 is secured to the protrusion 51 require any sliding movement between components. In other words, no rubbing of surfaces against each other in a sliding motion is required. This is advantageous because such rubbing may be liable to cause unwanted particulate contamination. The step depicted in FIG. 17D requires mechanical contact of separate components. This step may therefore be particularly liable to cause particulate contamination. The generally convex curved surface provided to manipulator pins 1092 reduces the contact surface area between the manipulator pins 1092 and the blocks 54 compared with the manipulator pins not having such a curved surface. The generally convex curved surface provided to manipulator pins 1092 also minimises the risk of slipping (i.e., rubbing) between a surface of manipulator pins 1092 and a surface of the blocks 54. Creation of particulate matter, potentially leading to particulate contamination, may therefore be avoided.

An alternative sequence of steps (not depicted) may be used to attach the engagement mechanism 50 to the protrusion 51. In this alternative sequence the hooked members 1091 are moved into position above the engagement tabs 1089 before the pins are used to raise the pellicle frame 17. Once the hooked members 1091 are in position the pin 1090 is then moved upwards to press against the engagement mechanism 50. The engagement mechanism 50 is thus gripped by the hooked members 1091 and the pin 1090. The engagement mechanism 50 is then lifted by moving the hooked members 1091 and the pin 1090 upwards. The same actions are performed for other engagement mechanisms 50, and thus the pellicle assembly 16 is lifted. The pellicle assembly 16 is then aligned relative to the patterning device MA using the actuators 111 and imaging sensors 105, 106 (see FIG. 6). The remaining steps may be as described above with reference to FIGS. 17A-H.

A safety system relevant to the step of engaging the engagement mechanism 50 with the protrusion 51, described above with reference to FIG. 17G, is provided. The hooked members 1091 may fail to fully disengage from the engagement mechanism 50 prior to retraction of the hooked members 1091. For example, there may be overlap of hooked portions of the hooked members 1091 and the corner plates 1089 of the support arm 82*a* if the distance by which the hooked members 1091 were moved in the x-direction, as described above, was not sufficient. Retraction of the hooked members 1091 when the hooked members 1091 are not fully disengaged from the engagement mechanism 50 may lead to damage to and/or failure of the pellicle assembly 16 and/or other components. The actuator 111 which controls the z-position of the support structure 101 (and in turn controls the z-position of the hooked members 1091) is operable to detach from the support structure 101. The actuator 111 is operable to detach from the support structure 101 if the support structure 101 exerts a resistive force on the actuator 111 (in response to an actuation force exerted by the actuator 111 on the support structure 101) above a threshold resistive force. This may be described as the support structure 101 being capable of detaching from the actuator 111 if movement of the support structure 101 is obstructed. Advantageously, the detachable nature of the actuator 111 prevents too large a force being applied to the engagement mechanism 50. This is beneficial as damage to and/or failure of the pellicle assembly 16 and/or other components, in the case that hooked members 1091 are not fully disengaged from the engagement mechanism 50 prior to retraction of the hooked members 1091, is prevented.

As a modification to the safety system described above, the hooked members 1091 may be provided on an insert which is disposed within a top surface of the support structure 101. The insert may be a detachable insert. Rather than the support structure 101 being capable of detaching from the actuator 111 if movement of the support structure 101 is obstructed, the insert may be capable of detaching from the support structure 101 if movement of the support structure 101 is obstructed. Advantages of the above-described safety system may apply in this modification of the safety system.

Features from the two described variants of safety systems may be used in isolation. Features from the two described variants of safety systems may be used in combination with each other. Further, variants to the described safety systems, which achieve substantially identical safety features, may be provided.

Embodiments of stud attachment apparatuses are now described in connection with FIGS. 18-20.

Figure 18:
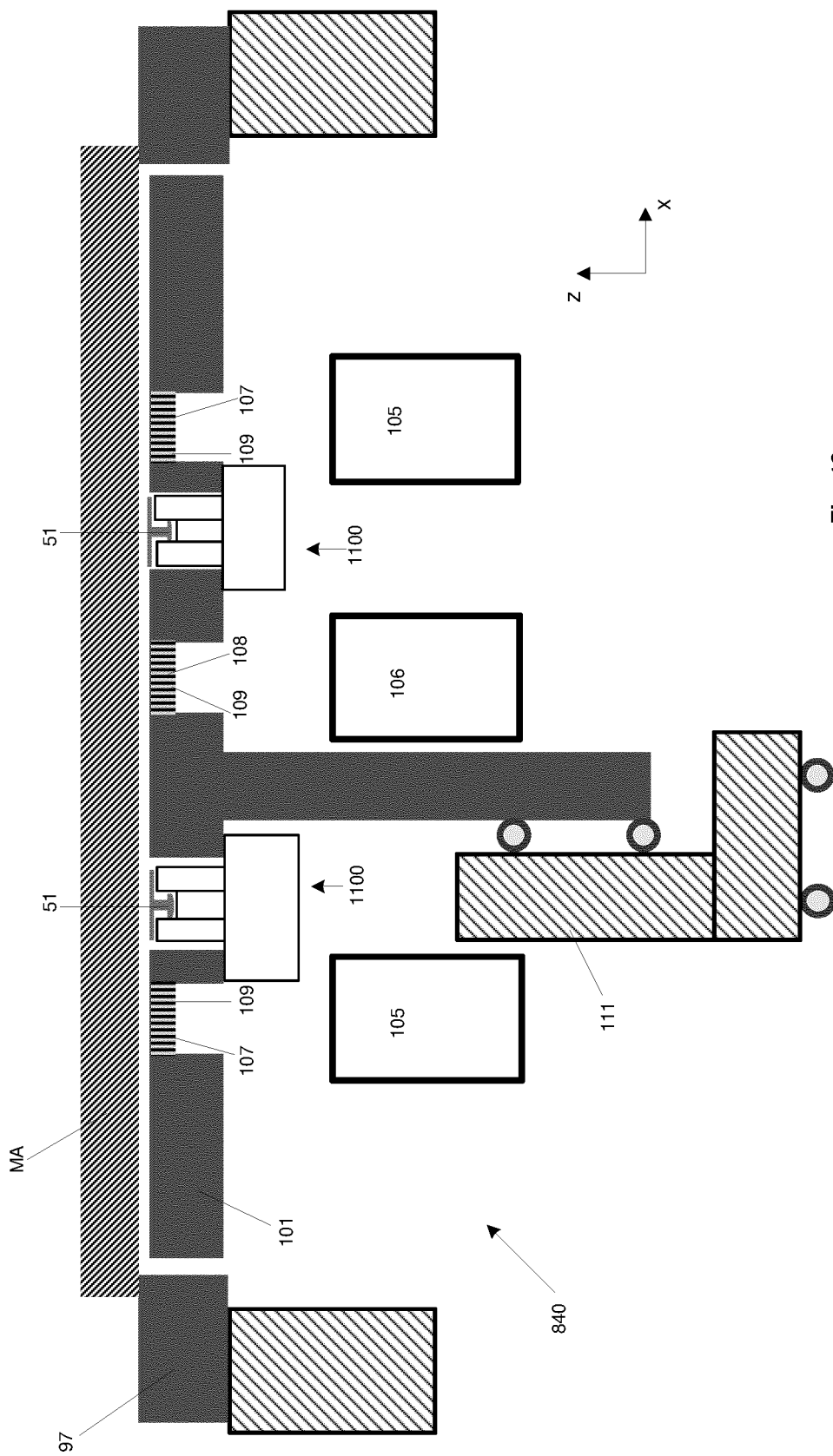
FIG. 18 schematically depicts a stud attachment apparatus according to an embodiment of the invention.

FIG. 18 schematically depicts in cross-section a stud attachment apparatus 840 according to an embodiment of the invention. The stud attachment apparatus 840 has similarities with the pellicle frame attachment 857 apparatus depicted in FIG. 6. Parts of the stud attachment apparatus 840 may correspond with parts of those other apparatuses.

The stud attachment apparatus 840 comprises a support structure 101 and stud manipulators 1100 configured to move protrusions 51 (which may also be referred to as studs) vertically such that they come into contact with the patterning device MA. Windows 107, 108 are provided in the support structure 101 and imaging sensors 105, 106 (e.g. cameras) are positioned to look through the windows 107, 108 towards the patterning device MA. Imaging sensors 105, 106 shown in FIG. 18 may correspond to imaging sensors 105, 106 shown in FIGS. 10 and 11. Alignment marks 109 are provided on the windows 107, 108 and may be used to align the support structure 101 relative to the patterning device MA. Actuators 111 are provided to move the support structure 101, and thus to move studs 51 which are held by the support structure 101. The actuators 111 are capable of moving the support structure in the x, y and z-directions and are also capable of rotating the support structure about the z-direction. The actuators 111 may be automated, manual or semi-automated (i.e. partially automated and partially manual). The stud attachment apparatus 840 further comprises an additional support structure 97 which is configured to support the patterning device MA. This additional support structure may be fixed, and is referred to herein as the fixed support structure 97.

The base of each stud 51 may be prepared with a preparation liquid. The preparation liquid may be isopropanol (or another alcohol), acetone, or ultra-pure water. The preparation liquid may be a mixture of one of these substances with demineralised water. The preparation liquid may be applied to the base of each stud 51 using a swab (such as a micro swab). Foil (such as plastic foil) may be applied to the base of each stud 51 after production and cleaning of the stud. Application of the foil may be performed instead of or in addition to preparation of the base of each stud 15 with the preparation liquid. Preparation of studs 51 using the preparation liquid can remove contaminants from the base of the studs 51. Application of the foil to the studs 51 can prevent new contaminants from settling on the base of the studs 51. The foil may be removed when the studs 51 are to be attached to the patterning device MA (for example, immediately prior to attaching the studs 15 to the patterning device MA)

Glue may then be provided on the base of each stud 51 whilst the studs are being held by the stud manipulators 1100 which form part of the support structure 101. Glue may be provided by a glue dispenser. The glue dispenser may form part of the stud attachment apparatus 840 It will be appreciated that the glue may be provided in any known manner. An amount of dispensed glue may be controlled by selecting a pressure and a pulse time of glue dispensing. An amount of dispensed glue may be controlled using volumetric dispensing. Volumetric dispensing may be beneficial for accurately controlling the glue as the viscosity of the glue may vary whilst the glue is being dispensed.

The patterning device MA is then placed onto the fixed support structure 97, such that the patterning device MA is positioned a few millimeters above the support structure 101. The actuators 111 are used to move the support structure 101 until alignment marks 109 provided in the windows 107, 108 are aligned with alignment marks provided on the patterning device MA. The studs 51 are held by the stud manipulators 1100 and have fixed positions in the x and y directions relative to the support structure 101. The separation between the studs 51 (of which there may be four in practice) is a fixed predetermined separation. The separation between the studs 51 corresponds with the separation between the engagement members 50A-D provided on a pellicle frame 17 (see FIG. 3) which will be attached to the patterning device MA.

Once the support structure 101 has been positioned correctly relative to the patterning device MA, the support structure 101 is moved upwards and closer to the patterning device MA. The stud manipulators 1100 are then used to move the studs 51 upwards from a position in which the bases of the studs 51 do not contact the patterning device MA to a position in which the bases of the studs 51 press against the patterning device MA. Heaters may then be used to heat the studs 51 in order to promote curing of the glue at an interface between the bases of the studs 51 and the patterning device MA.

Points at which the patterning device MA comes into contact with the stud attachment apparatus 840 may be provided with a coating of PEEK or some other robust material. Similarly, points at which the patterning device MA comes into contact with the housing 879 may be provided with a coating of PEEK or some other robust material.

Figure 19:
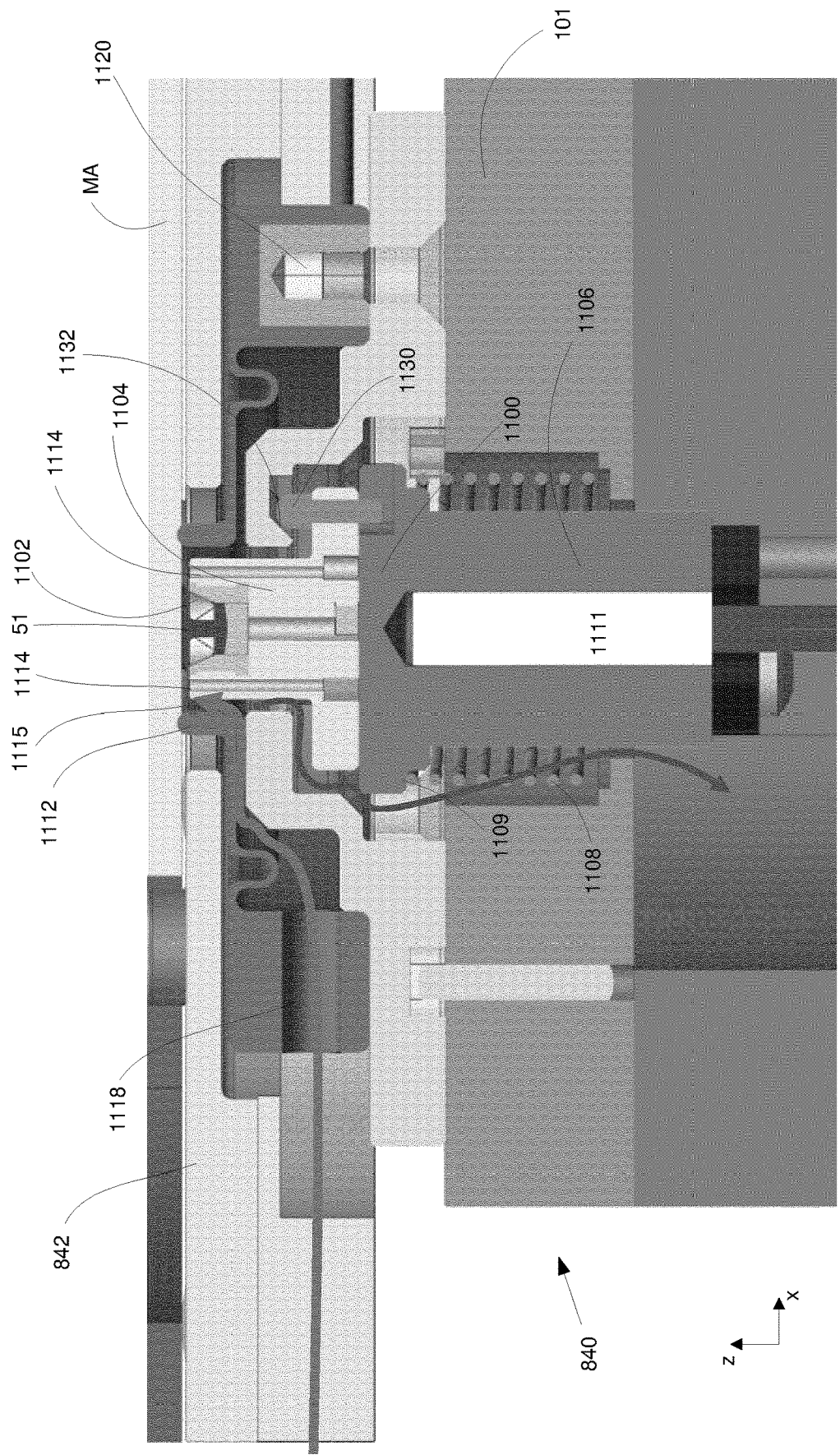
FIG. 19 depicts in cross-section part of the stud attachment apparatus.

Part of the stud attachment apparatus 840 is depicted in more detail in FIG. 19. A stud manipulator 1100 is depicted together with a stud 51 and a patterning device MA (e.g., a mask). Also depicted is a partition 842 which separates an environment in which the patterning device is provided from an environment in which the stud manipulator 1100 is provided. The stud manipulator 1100 comprises a cup 1102 which is dimensioned to receive a stud 51 (which may also be referred to as a protrusion), such that a bottom face (i.e., a base) of the stud 51 is facing outwards from the cup 1102. The stud 51 may be held in place in the cup 1102 by gravity. Alternatively, the stud 51 may be held in place in the cup 1102 using a vacuum mechanism (not shown in FIG. 21). Said vacuum mechanism may provide a secure, temporary holding of the stud 51 in the cup 1102. The cup 1102 may, for example, be formed from PEEK or some other robust material. The cup 1102 is held in a manipulator head 1104 which in turn is supported on a manipulator body 1106. A spring 1108 is received against a flange 1109 provided on the manipulator body and biases the manipulator head 1104 and the stud 51 upwards. Alignment of the stud 51 relative to the mask is achieved using the imaging sensors 105, 106 and actuators 111 depicted in FIG. 18. When the actuators have aligned the studs 51 to the patterning device MA, the stud manipulator 1100 is moved upwards to press the studs 51 against the patterning device MA. The stud manipulator 1100 is moved upwards by an actuator (not depicted) which moves all four stud manipulators 1100 upwards at the same time. The spring 1108 is compressed when the stud manipulator 1100 presses the stud 51 against the patterning device MA. The spring 1108 partially determines the force with which the stud 51 is pressed against the patterning device MA. A weaker spring will reduce the force with which the stud is pressed against the patterning device, whereas a stronger spring will increase the force which the stud is pressed against the patterning device. Thus, the force with which the stud 51 is pressed against the patterning device MA is selectable (at least in part) via selection of a spring 1108 with a desired strength. The spring 1108 may for example be pre-loaded with a force which pushes the stud manipulator 1100 and stud 51 upwards. The force of the pre-load may for example be less than 5N.

The stud manipulator 1100 pushes the stud 51 against the patterning device MA and thereby allows the stud 51 to be secured to the mask. As noted above, the stud 51 may be provided with glue or adhesive on its base, and the stud manipulator 1100 may press the stud 51 against the patterning device MA until the glue or adhesive has hardened. Once this has taken place, the stud manipulator 1100 may be moved away from the patterning device MA (and/or the patterning device MA may be moved away from the stud manipulator 1100).

In an embodiment, the stud manipulator 1100 may include a heater 1111 which is configured to heat the stud 51. The heater 1111 may be in the form of an electrical heater (e.g. a resistive electrical heater). When the stud 51 is being held against the patterning device MA the heater 1111 is used to heat the stud 51. The localized heating of the stud 51 provided by the heater 1111 is advantageous because it accelerates curing of the glue or adhesive. This increases the throughput of the stud attachment apparatus 840. The curing provided by heating the stud 51 may be pre-curing or may be full curing. Where pre-curing is used the patterning device MA and studs 51 may be transferred to an oven for curing. Where heating the stud 51 provides full curing there is no need to transfer the patterning device MA and studs 51 to an oven. This is advantageous because the oven may be a source of contamination particles.

In an embodiment, the stud manipulator 1100 may include an actuator (not depicted) which is operative to press the stud 51 against the patterning device MA (in addition to, or instead of, the spring 1108). The actuator may in addition move the cup 1102 away from the stud 51 once the stud has been fixed to the patterning device MA.

A seal 1112 extends around an outer perimeter of the manipulator head 1104. The seal 1112 is annular in shape.

However, the seal may have any suitable shape. The seal 1112 is formed from resilient material (e.g. PEEK) and projects above the partition 842 and above the stud 51. Thus, when the stud 51 is pressed against the patterning device MA the seal 1112 is pushed downwards. The resilient nature of the seal 1112 means that the seal presses against the patterning device MA and thereby forms a seal against the patterning device MA. This seals the portion of the patterning device MA within the perimeter of the seal 1112 and isolates it from the portion of the patterning device MA which is outside of the perimeter of the seal 1112.

Gas extraction channels 1114 are provided in the manipulator head 1104, the gas extraction channels 1114 extending away from outer face of the manipulator head 1104. An additional gas extraction route is provided by an annular space 1115 around the manipulator head 1104. A gas delivery channel 1118 is provided on one side of the seal 1112 and allows gas to be delivered to the area of the patterning device MA which is located within the seal 1112. This is schematically depicted by arrows in FIG. 19. The gas is extracted via the gas extraction channels 1114 in the manipulator head 1104 and the annular space 1115 around the manipulator head 1104. The gas extraction channels 1114 are distributed around the manipulator head 1104. A flow of gas is provided which will transport contaminants out of the gas extraction channels 1114 and the annular space 1115 and thereby prevent those contaminants adhering to the surface of the patterning device MA. The contamination may for example be particulates derived from the glue provided on the stud 51 or chemical vapour from the glue. Chemical vapour may in particular be generated when the glue is heated for curing. Removing contamination using the gas glow is advantageous because, as is explained elsewhere, particulates or other contamination on the surface of the patterning device MA may cause errors in a pattern projected onto a substrate by a lithographic apparatus. The gas may, for example, be air.

FIG. 20 shows an alternative embodiment of a stud attachment apparatus 843. The stud attachment apparatus 843 shown in FIG. 20 shares many features with the stud attachment apparatus 840 shown in FIG. 19. Shared features have common reference numerals. Only a subset of the components of the stud attachment apparatus 843 is shown in FIG. 20, for clarity. It will be appreciated that the stud attachment apparatus 843 may include any of the above-mentioned features of the stud attachment apparatus 840 shown in FIG. 19 as appropriate. The stud attachment apparatus 843 comprises an alternative spring mechanism to the spring 1108 in FIG. 19. The stud attachment apparatus 843 comprises two leaf springs 1110. The two leaf springs 1110 connect the manipulator body 1106 to the support structure 101.

In use, the two leaf springs 1110 provide a defined, generally fixed position of the stud manipulator head 1100 (and subsequently of the stud 51) in the xy plane. The two leaf springs 1110 allow some relative movement (in the z-direction) between the stud manipulator body 1100 and the support structure 101 (for example when the base of the stud 51 contacts the patterning device MA). Therefore, when the stud attachment apparatus 843 is pressed down in z a connection between manipulator head 1104 (via the kinematic mount 1130) and part 1116 (see FIG. 19) is lost.

Advantageously, each leaf spring 1110 is dimensioned such that movement of the stud manipulator 1100 (relative to the support structure 101) in the z-direction is permissible, whilst movement in other directions is negligible. Further, by using a plurality of leaf springs 1110 (for example, two) rather than a single leaf spring, rotation of the stud manipulator 1100 (and consequently the stud 51) in the xz plane, Rxz, is negligible. The arrangement of leaf springs 1110 in the stud attachment apparatus 843 shown in FIG. 20 ensures that rotation of the stud manipulator 1100 (and consequently the stud 51) in all three axes, and translation in the x-y plane, is negligible. The plurality of leaf springs 1110 of the stud attachment apparatus 843 therefore provides advantages over the spring 1108 of stud attachment apparatus 840 in accurately positioning the stud 51 relative to the patterning device MA.

References to a mask in this document may be interpreted as references to a patterning device (a mask is an example of a patterning device) and the terms may be used interchangeably.

References to glue in this document may be interpreted as references to adhesive and the terms may be used interchangeably.

References to glue have been made above in the context of a pellicle attachment apparatus (such as the pellicle attachment apparatus 855). In particular, glue may be used to affix a frame 17 to a pellicle 19, and, additionally or alternatively, glue may be used to affix the engagement mechanisms 50A-D (in particular the ramp portions 49A-D) to the frame 17. References to glue have also been made above in the context of a stud attachment apparatus (such as the stud attachment apparatus 840, 843). In particular, glue may be used to affix a stud 51 to a patterning device MA.

Many known types of glue may be prone to outgassing in an environment within an EUV lithographic apparatus (which may be under vacuum conditions and in which EUV radiation and/or hydrogen plasma may be present). Hence, in the construction of a pellicle assembly and/or mask assembly, it may be desirable to select a glue which does not outgas (or which does not outgas significantly under such conditions). In practice, this may limit a list of glues which are suitable for affixing a frame 17 to a pellicle 19 or a stud 51 to a patterning device MA. It is known to use an epoxy glue in a pellicle attachment apparatus (for affixing a frame 17 to a pellicle 19) and in a stud attachment apparatus (for affixing a stud 51 to a patterning device MA). However, there are disadvantages with using epoxy glues for the purposes described above.

According to an embodiment of the present invention it is proposed to use a poly(methyl methacrylate) based glue, also known as a PMMA glue. In particular, it is proposed to use a PMMA glue in a pellicle attachment apparatus (for affixing a frame 17 to a pellicle 19 and/or for affixing engagement mechanisms 50A-D to a frame 17) and in a stud attachment apparatus (for affixing a stud 51 to a patterning device MA or for affixing a frame 17 of a pellicle assembly 16 directly to a patterning device MA).

Figure 21B:
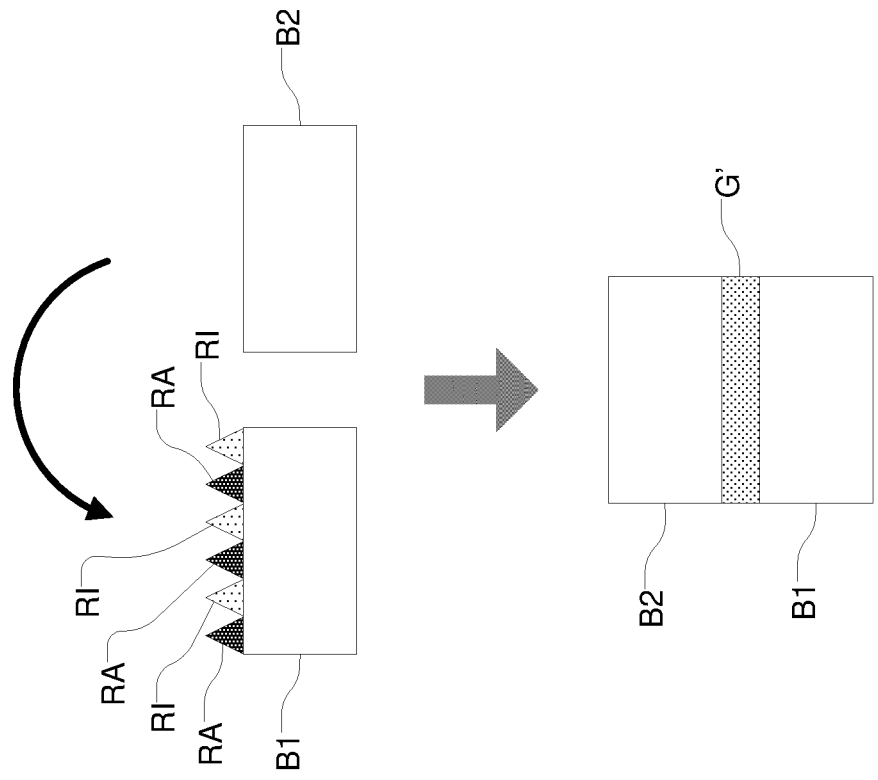
FIG. 21 depicts methods of affixing two bodies to each other using a poly(methyl methacrylate) based adhesive.
Figure 21A:
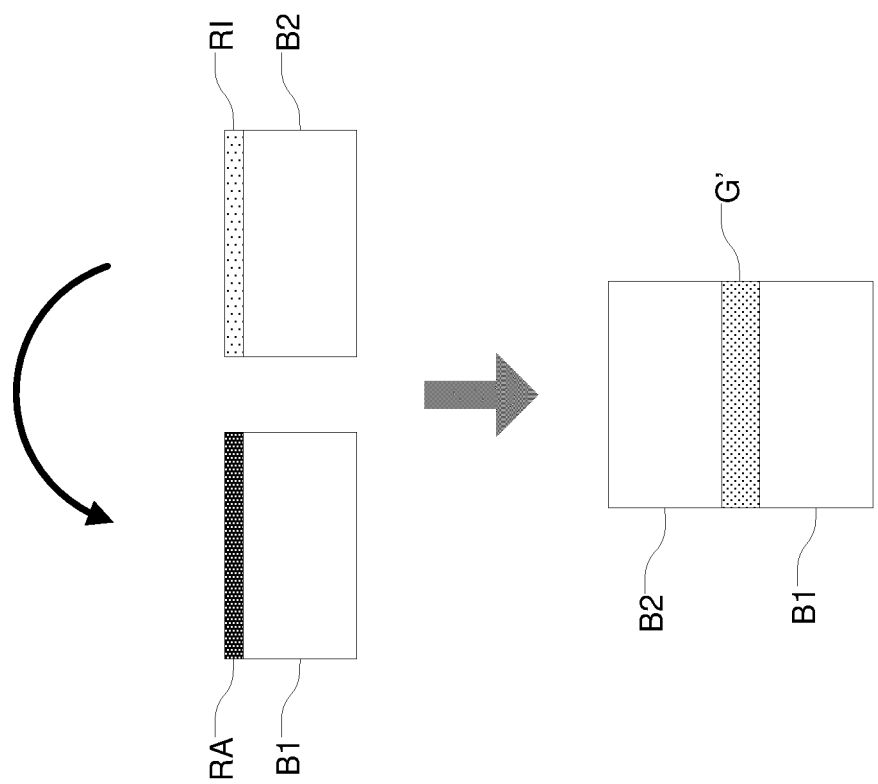

Such a PMMA glue generally comprises two components which, when brought into contact with each other, initiate a curing process of the PMMA glue. These two components may be described as an accelerator and an initiator. Each of the accelerator and the initiator may be provided in a resin. Alternatively, the accelerator and/or the initiator may be provided in a substance which is not a resin. The viscosity of a substance comprising the accelerator may be higher or lower than a substance comprising the initiator. It will be appreciated that "resin", as used herein, may refer to any substance in which a component of a PMMA glue is provided. FIGS. 21A and 21B schematically depict examples of two processes for affixing two surfaces to each other using a PMMA glue.

In FIG. 21A, a surface on a first body B1 is provided with resin containing the accelerator RA and a surface on a second body B2 is provided with resin containing the initiator RI. This is shown in the top half of FIG. 21A. The surface on the second body B2 is then moved relative to the surface on the first body B1 (as indicated by an arrow) such that the resin containing the initiator RI is brought into contact with the resin containing the accelerator RA. The resultant arrangement is shown in the bottom half of FIG. 21A. Contact of the initiator with the accelerator initiates a curing process of the PMMA glue, thereby affixing the surface on the first body B1 to the surface on the second body B2 by means of the cured PMMA glue G'.

In FIG. 21B, a surface on a first body B1 is provided with: a plurality of rows of resin containing the accelerator RI; and a plurality of rows of resin containing the initiator RI. The rows are arranged such that accelerator rows RA and initiator rows RI are alternating. This is shown in the top half of FIG. 21A. The surface on the second body B2 is then moved relative to the surface on the first body B1 (as indicated by an arrow) such that the rows of resin on the surface on the first body B1 are compressed by the surface on the second body B2. The resultant arrangement is shown in the bottom half of FIG. 21B. This compression of the rows of resin RA, RI brings the initiator into contact with the accelerator, thereby causing the initiator and the accelerator to mix and consequently initiating a curing process of the PMMA glue and affixing the surface on the first body B1 to the surface on the second body B2 by means of the cured PMMA glue G'.

It will be appreciated that, when bringing the surface on the first body B1 and the surface on the second body B2 into contact with each other as described above, the surface on the first body B1 may be moved and the surface on the second body B2 may remain stationary, the surface on the first body B1 may remain stationary and the surface on the second body B2 may be moved, or both surfaces may be moved.

The surface on the first body B1 may correspond to a surface of a pellicle frame 17 and the surface on the second body B2 may correspond to a surface of a pellicle 19. Alternatively, the surface on the first body B1 may correspond to a surface of a pellicle frame 17 and the surface on the second body B2 may correspond to a surface of an engagement mechanism 50A-D. Alternatively, the surface on the first body B1 may correspond to a surface of a stud 51 (e.g., a base surface of a stud 51) and the surface on the second body B2 may correspond to a surface of a patterning device MA. Affixing any first surface to any second surface may be performed using PMMA glue in the manner shown in FIG. 21A, FIG. 21B, or any variant thereof.

The curing process of the PMMA glue takes several minutes to complete. This is a substantially shorter curing process than the curing process of the known epoxy adhesive used in a known pellicle attachment apparatus and in a known stud attachment apparatus, which generally takes several hours. Therefore, advantageously, affixing a pellicle frame 17 to a pellicle 19 using the PMMA glue according to an aspect of the present invention results in a significantly shorter time required to create a pellicle assembly 16 (compared with using the known epoxy glue). Likewise, affixing engagement mechanisms 50A-D to a frame 17 using the PMMA glue results in a significantly shorter time required to create a pellicle assembly 16 (compared with using the known epoxy glue). Further, advantageously, affixing a stud 51 to a patterning device MA using the PMMA glue requires significantly less time (compared with using the known epoxy glue). This results in associated advantages for high volume manufacturing.

As the PMMA glue is generally provided as a resin containing the initiator (RI) and a resin containing the accelerator (RA), the PMMA glue may be described as being provided as more than one component.

It will be appreciated that all references to glue in this document, in particular references to glue as used in a pellicle attachment apparatus (such as the pellicle attachment apparatus 855) and in a stud attachment apparatus (such as the stud attachment apparatus 840, 843), may be taken to refer to PMMA glue. It will be further appreciated that all references in this document to surfaces being affixed or adhered to each other, or the like, using glue, may be taken to refer to surfaces being affixed or adhered to each other using the method depicted in FIGS. 21A and 21B (though this is not limiting and other methods may be used).

It may be desirable to remove glue from a surface. For example, it may be desirable to remove studs 51 and glue from a patterning device MA. PMMA glue is generally more elastic than epoxy glue. PMMA glue may be removed more easily from a surface (e.g., from a surface of a patterning device MA) than epoxy glue. Therefore, advantageously, affixing studs 51 to a patterning device MA using PMMA glue (compared with using the known epoxy glue) results in an easier stud removal procedure and patterning device cleaning procedure once the studs 51 have been removed.

A pellicle attachment apparatus (such as the pellicle attachment apparatus 855) and/or a stud attachment apparatus (such as the stud attachment apparatus 840, 843) may comprise a heater. A heater may be used to heat the known epoxy glue in order to promote curing of the known epoxy glue. Components which are provided with the known epoxy glue may be placed in an oven which heats the known epoxy glue in order to promote curing of the known epoxy glue. Advantageously, heating is not required to promote curing of PMMA glue. This results in a simpler manufacturing procedure which may also reduce defects and risk of damage to manufactured products (such as a pellicle assembly 16 or a patterning device MA provided with studs 51).

Use of PMMA glue allows an alternative design of mask assembly 15' to be formed. This alternative design of mask assembly 15' offers several advantages over the mask assembly 15. This alternative design of mask assembly is described below with reference to FIG. 22B, and is compared with the mask assembly 15 depicted in FIG. 22A.

FIG. 22A shows a portion of the mask assembly 15 as assembled using the apparatus and method described above with reference to FIG. 2. Studs 51 are affixed to the patterning device MA using a known epoxy glue G (only one stud 51 is shown in FIG. 22A). It may be necessary to apply the known epoxy glue G in a layer having a height (in the z-direction) of approximately 50 um. The pellicle assembly 16 comprises the pellicle 19 which is affixed to the pellicle frame 17. Engagement mechanisms 50 protrude from the pellicle frame 17 (only one engagement mechanism 50 is shown in FIG. 22A). Each engagement mechanism 50 engages with a corresponding stud 51, thereby forming the mask assembly 15.

FIG. 22B shows a portion of the alternative design of mask assembly 15'. A pellicle assembly 16' comprises the pellicle 19 which is affixed to the pellicle frame 17. The pellicle frame 17 is affixed directly to the patterning device MA using PMMA glue G'. The PMMA glue G' may be provided around the entire perimeter of the pellicle frame 17. The pellicle assembly 16' is thereby affixed to the patterning device MA, consequently forming the mask assembly 15'.

Any glue may spatially deform when said glue is curing. The PMMA glue G' is relatively elastic (compared with the epoxy glue G). Further, the PMMA glue G' may be applied in a layer which is thinner (smaller in the x-direction) and taller (larger in the z-direction) than a layer in which the epoxy glue G is applied. The elasticity of the PMMA glue G' and the dimensions in which the PMMA glue G' may be applied result in low deformation of the patterning device MA due to curing of the PMMA glue G'. In contrast, if the pellicle frame 17 were directly affixed to the patterning device MA (as shown in FIG. 22B) using the known epoxy glue, deformation of the patterning device MA due to curing of the epoxy glue would be larger, resulting in errors in a patterns projected onto a substrate by a lithographic apparatus. Therefore, use of the PMMA glue G' allows the production of the mask assembly 15' which overcomes issues associated with use of the known epoxy glue.

The mask assembly 15', enabled by the use of the PMMA glue G', is advantageous for several reasons, as described below.

The mask assembly 15' may provide a hermetically sealed space (see FIG. 22B) between the pellicle assembly 16' and the patterning device MA. This mask assembly 15' may hence be described as a 'closed frame' system. Advantageously, this may prevent contaminant particles from: adhering to the side of the patterning device MA which faces the pellicle 19; adhering to the side of the pellicle 19 which faces the patterning device MA; and/or being disposed in the space between the pellicle 19 and the patterning device MA. This may prevent such particles from causing errors in a pattern applied to a substrate by a lithographic apparatus.

The mask assembly 15' (FIG. 22B) comprises fewer components than the mask assembly 15 (FIG. 22A). In particular, the mask assembly 15 comprises engagement mechanisms 50 which protrude from the pellicle frame 17 and studs 51. Such engagement mechanisms 50 and studs 51 are not necessary in the mask assembly 15'. Advantageously, this may result in a simpler manufacturing procedure for the mask assembly 15' (compared with the mask assembly 15). Further, the lower number of components required and the simpler manufacturing procedure may result in a lower cost of manufacture for the mask assembly 15' (compared with the mask assembly 15).

Referring to FIG. 22A, the epoxy glue G is provided on the patterning device MA underneath each stud 51. Referring to FIG. 22B, the PMMA glue G' is provided on the patterning device MA such that the PMMA glue G' is disposed between, and is in contact with, the pellicle frame 17 around the entire perimeter of the pellicle frame 17. There is therefore generally a much larger area of the patterning device MA which is affixed to the pellicle frame 17 in the mask assembly 15' (FIG. 22B) than the total area of the patterning device MA which is affixed to all of the studs 51 in the mask assembly 15 (FIG. 22A). That is, the bonded area of the patterning device MA is larger in the mask assembly 15' (FIG. 22B) than the bonded area of the patterning device MA in the mask assembly 15 (FIG. 22A). The surface of the patterning device MA may be selectively etched such that the parts of said surface on which the epoxy glue G is provided (FIG. 22A) are etched so as to increase adhesion between the epoxy glue G and the patterning device MA. However, as the bonded area of the patterning device MA is much larger in the mask assembly 15' (FIG. 22B) than in the mask assembly 15 (FIG. 22A), such an etched surface is not necessary in the mask assembly 15'. Advantageously, this may reduce manufacture time and manufacture cost of the mask assembly 15' (compared with the mask assembly 15).

A pellicle may have a shorter lifetime than a patterning device. It may be desirable to replace a pellicle assembly which forms part of a mask assembly. As described above, PMMA glue is more easily removable, and relatively more elastic, than the known epoxy glue. Advantageously, this may enable a pellicle assembly (such as the pellicle assembly 16'), forming part of the mask assembly 15', to be more easily replaced.

Embodiments are provided according to the following clauses:

1. An object handling apparatus for handling a generally planar object, the object handling apparatus comprising:
   two support arms, at least one of the two support arms movable relative to other support arm generally in a plane such that the two support arms are operable to grip and hold an object disposed in said plane,
   wherein each of the support arms includes at least one support pad and at least one aligner, the support pads being configured to locally contact a surface of the object and apply a force thereto generally perpendicular to the plane so as to support the object and the aligners being configured to locally contact a surface of the object and apply a force thereto generally in the plane so as to align the object.

2. An object handling apparatus for handling a generally planar object, the object handling apparatus comprising:
   two support arms, at least one of the two support arms movable relative to the other support arm generally in a plane such that the two support arms are operable to grip and hold an object disposed in said plane;
   a support structure; and
   a damper assembly,
   wherein the two support arms are connected to the support structure via the damper assembly, the damper assembly being configured to dampen movement of an object in a direction perpendicular to a plane of the object when it is gripped by the support arms.

3. A pellicle frame attachment apparatus comprising:
   a pellicle assembly handling apparatus configured to handle a pellicle assembly;
   a patterning device handling apparatus configured to handle a patterning device; and
   a rail,
   wherein the pellicle assembly handling apparatus comprises support arms configured to grip and hold the pellicle assembly and the patterning device handling apparatus comprises support arms configured to grip and hold the patterning device, and wherein the pellicle assembly handling apparatus is supported by and is movable relative to one of the rail, and wherein the patterning device handling apparatus is supported by and is movable relative to one of the rail.

4. The pellicle frame attachment apparatus of clause 3, wherein the pellicle assembly handling apparatus comprises an object handling apparatus according to clause 1.

5. The pellicle frame attachment apparatus of clause 3 or clause 4, wherein the patterning device handling apparatus comprises an object handling apparatus according to clause 1.

6. The pellicle frame attachment apparatus of any of clauses 3 to 5, wherein the pellicle assembly handling apparatus comprises an object handling apparatus according to clause 2.
7. The pellicle frame attachment apparatus of any of clauses 3 to 6, wherein the patterning device assembly handling apparatus comprises an object handling apparatus according to clause 2.
8. A measurement system for measuring an object comprising:
a radiation source for producing an unpolarised radiation beam;
a beam splitter;
a quarter-wave plate; and
an imaging sensor,
wherein the radiation source is arranged such that a portion of the unpolarised radiation propagates through the beam splitter and the quarter-wave plate, and
wherein the imaging sensor is arranged such that a reflected part of said portion of the unpolarised radiation through the quarter-wave plate and the beam splitter before being incident on the imaging sensor.
9. A measurement system for measuring a position of an object relative to a reference object, the object being provided with an object marker and the reference object being provided with a window with a reference marker, the measurement system comprising:
a radiation source for producing a radiation beam; and
an imaging sensor,
wherein the radiation source is arranged such that the radiation beam is incident on the reference marker and the object marker at such an angle that a reflected diffraction order of the radiation is normally incident on the imaging sensor.
10. A pellicle frame attachment apparatus comprising the measurement system of clause 8 or clause 9.
11. A pellicle frame attachment apparatus comprising:
a support structure configured to support a pellicle assembly; and
a linearly moveable manipulator pin configured to move relative to the support structure so as to contact a distal end of an engagement arm of an engagement mechanism affixed to a frame of the pellicle assembly when supported by the support structure, so as to resiliently bend the engagement arm,
wherein the manipulator pin extends in, and is movable in, a direction generally perpendicular to the engagement arm; and wherein a surface of the manipulator pin is a convex curved surface such that a contact surface area between said surface and the engagement arm is minimised.
12. The pellicle frame attachment apparatus of clause 11, further comprising:
an actuator operable to move the position of the support structure; and
a plurality of hooked pins disposed on and protruding from the support table,
wherein the plurality of hooked pins is configured to releasably clamp the engagement mechanism to the support structure in place during engagement or disengagement of the pellicle assembly and the patterning device, and wherein either or both of the actuator or a plurality of detachable inserts on which hooked pins are provided are capable of detaching from the support table if movement of the support table is obstructed.
13. A stud attachment apparatus comprising:
a support structure configured to hold a patterning device; and
a stud manipulator configured to bring a stud into contact with the patterning device,
wherein the stud manipulator is affixed to an outer frame using a plurality of leaf springs.
14. The stud attachment apparatus of clause 13, wherein the stud manipulator comprises a stud holder which is arranged to hold the stud under a force of gravity or using a vacuum mechanism.
15. The stud attachment apparatus of clause 13 or clause 14, further comprising a glue dispenser, wherein the glue dispenser is configured to provide one or more components of a poly(methyl methacrylate) based adhesive to:
a surface of the stud;
a surface of the patterning device; or
a surface of the stud and a surface of the patterning device,
such that the stud is affixed to the patterning device by the poly(methyl methacrylate) based adhesive when the stud is brought into contact with the patterning device by the stud manipulator.
16. A pellicle attachment apparatus for making at least part of a pellicle assembly from a first item and a second item, the pellicle attachment apparatus comprising:
a pellicle manipulator configured to bring the first item into contact with the second item; and
a glue dispenser configured to provide one or more components of a poly(methyl methacrylate) based adhesive to:
a surface of the first item;
a surface of the second item; or
a surface of the first item and a surface of the second item,
such that the first item is affixed to the second item by the poly(methyl methacrylate) based adhesive when the first item is brought into contact with the second item.
17. The pellicle attachment apparatus of clause 16, wherein the first item is a frame and the second item is a pellicle.
18. The pellicle attachment apparatus of clause 16 or clause 17, wherein the first item is a frame and the second item is an engagement mechanism.
19. The pellicle attachment apparatus of clause 16 or clause 17, wherein the first item is a frame constructed such as to provide a hermetically sealed space when the pellicle assembly is bonded to a patterning device.
20. A pellicle assembly, comprising:
a pellicle; and
a frame,
wherein a poly(methyl methacrylate) based adhesive is disposed between, and is in contact with, the pellicle and the frame so as to affix the pellicle to the frame.
21. A patterning device, comprising a plurality of studs, wherein a poly(methyl methacrylate) based adhesive is disposed between, and is in contact with, the patterning device and each stud of the plurality of studs so as to affix the patterning device to each stud of the plurality of studs.
22. A mask assembly, comprising:
a pellicle assembly according to clause 19; and
a patterning device according to clause 20.
23. A mask assembly, comprising:
a pellicle assembly; and
a patterning device, wherein the pellicle assembly comprises:
a pellicle; and
a frame,
wherein an adhesive is disposed between, and is in contact with, the frame and the patterning device so as to affix the frame to the patterning device.
24. The mask assembly of clause 23, wherein the adhesive is provided in a shape which generally matches a shape of the frame.
25. The mask assembly of clause 23 or clause 24, wherein the adhesive is provided in a single continuous shape or in shape of discrete beads.
26. The mask assembly of any of clauses 23 to 25, wherein a hermetically sealed space is formed between the pellicle assembly and the patterning device.
27. The mask assembly of any of clauses 23 to 26, wherein the adhesive is a poly(methyl methacrylate) based adhesive.
28. Use of a poly(methyl methacrylate) glue to adhere a surface of a first lithographic component to a surface of a second lithographic component.
29. Use of a PMMA glue according to clause 28, wherein at least one of the first and the second lithographic components is a component of an EUV lithographic apparatus.
30. Use of a PMMA glue according to clause 28 or 29, wherein: a) the first lithographic component is a pellicle and the second lithographic component is a pellicle frame, or b) the first lithographic component is a pellicle frame and the second lithographic component is a patterning device, or c) the first lithographic component is a first pellicle frame component and the second lithographic component is a second pellicle frame component.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:
1. A pellicle frame attachment apparatus comprising:
a pellicle assembly handling apparatus configured to handle a pellicle assembly and comprising support arms configured to grip and hold the pellicle assembly;
a patterning device handling apparatus configured to handle a patterning device and comprising support arms configured to grip and hold the patterning device; and
a rail,
wherein the pellicle assembly handling apparatus is supported by and is movable in a direction relative to the rail, wherein the patterning device handling apparatus is supported by and is movable in the same direction relative to the rail, and wherein the relative movement between the pellicle assembly handling apparatus and the patterning device handling apparatus changes a proportion of overlap between the patterning device and the pellicle assembly.
2. The pellicle frame attachment apparatus of claim 1, wherein the pellicle assembly handling apparatus comprises an object handling apparatus comprising two support arms, at least one of the two support arms movable relative to the other support arm generally in a plane such that the two support arms are operable to grip and hold an object disposed in the plane, wherein each of the support arms includes at least one support pad and at least one aligner, the support pads being configured to locally contact a surface of the object and apply a force thereto generally perpendicular to the plane so as to support the object and the aligners being configured to locally contact a surface of the object and apply a force thereto generally in the plane so as to align the object.
3. The pellicle frame attachment apparatus of claim 1, wherein the patterning device handling apparatus comprises an object handling apparatus comprising two support arms, at least one of the two support arms movable relative to the other support arm generally in a plane such that the two support arms are operable to grip and hold an object disposed in the plane, wherein each of the support arms includes at least one support pad and at least one aligner, the support pads being configured to locally contact a surface of the object and apply a force thereto generally perpendicular to the plane so as to support the object and the aligners being configured to locally contact a surface of the object and apply a force thereto generally in the plane so as to align the object.
4. The pellicle frame attachment apparatus of claim 1, wherein the pellicle assembly handling apparatus comprises an object handling apparatus comprising:
two support arms, at least one of the two support arms movable relative to the other support arm generally in a plane such that the two support arms are operable to grip and hold an object disposed in the plane;
a support structure; and
a damper assembly,
wherein the two support arms are connected to the support structure via the damper assembly, the damper assembly configured to dampen movement of an object in a direction perpendicular to a plane of the object when it is gripped by the support arms.
5. The pellicle frame attachment apparatus of claim 1, wherein the patterning device handling apparatus comprises an object handling apparatus comprising:
two support arms, at least one of the two support arms movable relative to the other support arm generally in a plane such that the two support arms are operable to grip and hold an object disposed in the plane;

a support structure; and a damper assembly, wherein the two support arms are connected to the support structure via the damper assembly, the damper assembly configured to dampen movement of an object in a direction perpendicular to a plane of the object when it is gripped by the support arms.

6. The pellicle frame attachment apparatus according to claim 1, further comprising:

a beam splitter configured to receive an unpolarised radiation beam;

a quarter-wave plate; and an imaging sensor, wherein the beam splitter and the quarter-wave plate are arranged such that a portion of the unpolarised radiation propagates through the beam splitter and the quarter-wave plate, and wherein the imaging sensor is arranged such that a reflected part of the portion of the unpolarised radiation passes through the quarter-wave plate and the beam splitter before being incident on the imaging sensor.

7. The pellicle frame attachment apparatus according to claim 1, further comprising a measurement system for measuring a position of an object relative to a reference object, the object being provided with an object marker and the reference object being provided with a window with a reference marker, the measurement system comprising:

a radiation source configured to produce a radiation beam; and an imaging sensor, wherein the radiation source is arranged such that the radiation beam is incident on the reference marker and the object marker at such an angle that a reflected diffraction order of the radiation is normally incident on the imaging sensor.

8. The pellicle frame attachment apparatus according to claim 1, further comprising:

a support structure configured to support a pellicle assembly; and a linearly moveable manipulator pin configured to move relative to the support structure so as to contact a distal end of an engagement arm of an engagement mechanism affixed to a frame of the pellicle assembly when supported by the support structure, so as to resiliently bend the engagement arm, wherein the manipulator pin extends in, and is movable in, a direction generally perpendicular to the engagement arm, and wherein a surface of the manipulator pin is a convex curved surface such that a contact surface area between the surface and the engagement arm is minimised.

9. The pellicle frame attachment apparatus of claim 8, further comprising:

an actuator operable to move the support structure; and a plurality of hooked pins disposed on and protruding from the support structure, wherein the plurality of hooked pins is configured to releasably clamp the engagement mechanism to the support structure in place during engagement or disengagement of the pellicle assembly and the patterning device, and wherein either or both of the actuator or a plurality of detachable inserts on which hooked pins are provided, is capable of detaching from the support structure if movement of the support structure is obstructed.

10. A pellicle frame attachment apparatus comprising:

a pellicle assembly handling apparatus configured to handle a pellicle assembly;

a patterning device handling apparatus configured to handle a patterning device;

a first track; and a second track of which at least part is substantially parallel to the first track, wherein the pellicle assembly handling apparatus is supported by and is movable relative to the first track, wherein the patterning device handling apparatus is supported by and is movable relative to the second track, and wherein relative movement between the pellicle assembly handling apparatus and the patterning device handling apparatus changes a proportion of overlap between the patterning device and the pellicle assembly.

11. The pellicle frame attachment apparatus of claim 10, wherein the pellicle assembly handling apparatus comprises two support arms, at least one of the two support arms movable relative to the other support arm generally in a plane such that the two support arms are operable to grip and hold an object disposed in the plane, wherein each of the support arms includes at least one support pad and at least one aligner, the support pads being configured to locally contact a surface of the object and apply a force thereto generally perpendicular to the plane so as to support the object and the aligners being configured to locally contact a surface of the object and apply a force thereto generally in the plane so as to align the object.

12. The pellicle frame attachment apparatus of claim 10, wherein the patterning device handling apparatus comprises two support arms, at least one of the two support arms movable relative to the other support arm generally in a plane such that the two support arms are operable to grip and hold an object disposed in the plane, wherein each of the support arms includes at least one support pad and at least one aligner, the support pads being configured to locally contact a surface of the object and apply a force thereto generally perpendicular to the plane so as to support the object and the aligners being configured to locally contact a surface of the object and apply a force thereto generally in the plane so as to align the object.

13. The pellicle frame attachment apparatus of claim 10, wherein the pellicle assembly handling apparatus comprises:

at least one support arm operable to hold an object;

a support structure; and a damper assembly, wherein the at least one support arm is connected to the support structure via the damper assembly, the damper assembly configured to dampen movement of an object in a direction perpendicular to a plane of the object when it is held by the at least one support arm.

14. The pellicle frame attachment apparatus of claim 10, wherein the patterning device handling apparatus comprises:

at least one support arm operable to hold an object;

a support structure; and a damper assembly, wherein the at least one support arm is connected to the support structure via the damper assembly, the damper assembly configured to dampen movement of an object in a direction perpendicular to a plane of the object when it is held by the at least one support arm.

15. The pellicle frame attachment apparatus of claim 10, further comprising:
- a support structure configured to support a pellicle assembly; and
- a linearly moveable manipulator pin configured to move relative to the support structure so as to contact a distal end of an engagement arm of an engagement mechanism affixed to a frame of the pellicle assembly when supported by the support structure, so as to resiliently bend the engagement arm,
- wherein the manipulator pin extends in, and is movable in, a direction generally perpendicular to the engagement arm.

16. A pellicle frame attachment apparatus comprising:
- a pellicle assembly handling apparatus configured to handle a pellicle assembly;
- a patterning device handling apparatus configured to handle a patterning device; and
- a support configured to support both the pellicle assembly handling apparatus and patterning device handling apparatus,
- wherein the pellicle assembly handling apparatus is movable relative to the support in a direction, wherein the patterning device handling apparatus is movable relative to the support in the same direction, and wherein the relative movement between the pellicle assembly handling apparatus and the patterning device handling apparatus changes a proportion of overlap between the patterning device and the pellicle assembly.

17. The pellicle frame attachment apparatus of claim 16, wherein the pellicle assembly handling apparatus comprises two support arms, at least one of the two support arms movable relative to the other support arm generally in a plane such that the two support arms are operable to grip and hold an object disposed in the plane, wherein each of the support arms includes at least one support pad and at least one aligner, the support pads being configured to locally contact a surface of the object and apply a force thereto generally perpendicular to the plane so as to support the object and the aligners being configured to locally contact a surface of the object and apply a force thereto generally in the plane so as to align the object.

18. The pellicle frame attachment apparatus of claim 16, wherein the patterning device handling apparatus comprises two support arms, at least one of the two support arms movable relative to the other support arm generally in a plane such that the two support arms are operable to grip and hold an object disposed in the plane, wherein each of the support arms includes at least one support pad and at least one aligner, the support pads being configured to locally contact a surface of the object and apply a force thereto generally perpendicular to the plane so as to support the object and the aligners being configured to locally contact a surface of the object and apply a force thereto generally in the plane so as to align the object.

19. The pellicle frame attachment apparatus of claim 16, wherein the pellicle assembly handling apparatus comprises:
- at least one support arm operable to hold an object; and
- a damper assembly,
- wherein the damper assembly is configured to dampen movement of an object in a direction perpendicular to a plane of the object when it is held by the at least one support arm.

20. The pellicle frame attachment apparatus of claim 16, wherein the patterning device handling apparatus comprises:
- at least one support arm operable to hold an object; and
- a damper assembly,
- wherein the damper assembly is configured to dampen movement of an object in a direction perpendicular to a plane of the object when it is held by the at least one support arm.

* * * * *